US012550663B2

(12) United States Patent
Tien et al.

(10) Patent No.: US 12,550,663 B2
(45) Date of Patent: Feb. 10, 2026

(54) METHOD AND EQUIPMENT FOR MANUFACTURING A PACKAGE STRUCTURE

(71) Applicant: Advanced Semiconductor Engineering, Inc., Kaohsiung (TW)

(72) Inventors: Hsing Kuo Tien, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 82 days.

(21) Appl. No.: 18/237,377

(22) Filed: Aug. 23, 2023

(65) Prior Publication Data

US 2025/0069916 A1 Feb. 27, 2025

(51) Int. Cl.
*H01L 21/67* (2006.01)
*B32B 43/00* (2006.01)

(52) U.S. Cl.
CPC ...... *H01L 21/67132* (2013.01); *B32B 43/006* (2013.01)

(58) Field of Classification Search
CPC ............. H01L 21/67132; H01L 21/568; H01L 21/6836; H01L 2221/68359; H01L 2221/68381; B32B 43/006; Y10T 156/11
See application file for complete search history.

(56) References Cited

U.S. PATENT DOCUMENTS

2020/0388521 A1* 12/2020 Matsuno ............. H01L 21/6831

FOREIGN PATENT DOCUMENTS

| | | | | |
|---|---|---|---|---|
| CN | 214000569 U | | 8/2021 | |
| CN | 113725139 A | | 11/2021 | |
| KR | 20190009510 A | * | 1/2019 | ....... H01L 21/67132 |

* cited by examiner

*Primary Examiner* — Alex B Efta
*Assistant Examiner* — Alexander S Wright
(74) *Attorney, Agent, or Firm* — FOLEY & LARDNER LLP

(57) ABSTRACT

A method and equipment for manufacturing a package structure are disclosed. The equipment includes a first space, a de-bonding apparatus, a second space and a fluid supply device. The de-bonding apparatus is disposed in the first space, and configured to perform a de-bonding process. The second space is disposed around the first space. The fluid supply device is configured to make a first humidity of an atmosphere in the first space greater than a second humidity of an atmosphere in the second space.

8 Claims, 49 Drawing Sheets

METHOD AND EQUIPMENT FOR MANUFACTURING A PACKAGE STRUCTURE

BACKGROUND

1. Field of the Disclosure

The present disclosure relates to an equipment and a manufacturing method, and to a method and equipment for manufacturing a package structure.

2. Description of the Related Art

A semiconductor processing technology may include at least one bonding process and at least one de-bonding process. However, when a substrate is de-bonded or separated from a tape layer, a static electricity may be generated during the de-bonding process. If a plurality of semiconductor device or semiconductor dice are disposed on the substrate, such static electricity may damage the semiconductor device or the semiconductor dice. Thus, a yield of the semiconductor substrate may decrease.

SUMMARY

In some embodiments, a method for manufacturing a package structure includes: providing an assembly structure including a substrate structure and a tape, wherein the substrate structure has a first surface and a second surface opposite to the first surface and bonded to the tape; de-bonding the second surface of the substrate structure from the tape; and neutralizing a plurality of electricity charges adjacent to the first surface of the substrate structure earlier than de-bonding the second surface of the substrate structure from the tape.

In some embodiments, a method for manufacturing a package structure includes: providing an assembly structure including a substrate structure bonded to a tape and a die disposed on the substrate structure; providing a plurality of ion carriers onto the substrate structure; and de-bonding the substrate structure from the tape later than providing the plurality of ion carriers onto the substrate structure.

In some embodiments, an equipment for manufacturing a package structure includes a first space, a de-bonding apparatus, a second space and a fluid supply device. The de-bonding apparatus is disposed in the first space, and configured to perform a de-bonding process. The second space is disposed around the first space. The fluid supply device is configured to make a first humidity of an atmosphere in the first space greater than a second humidity of an atmosphere in the second space.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
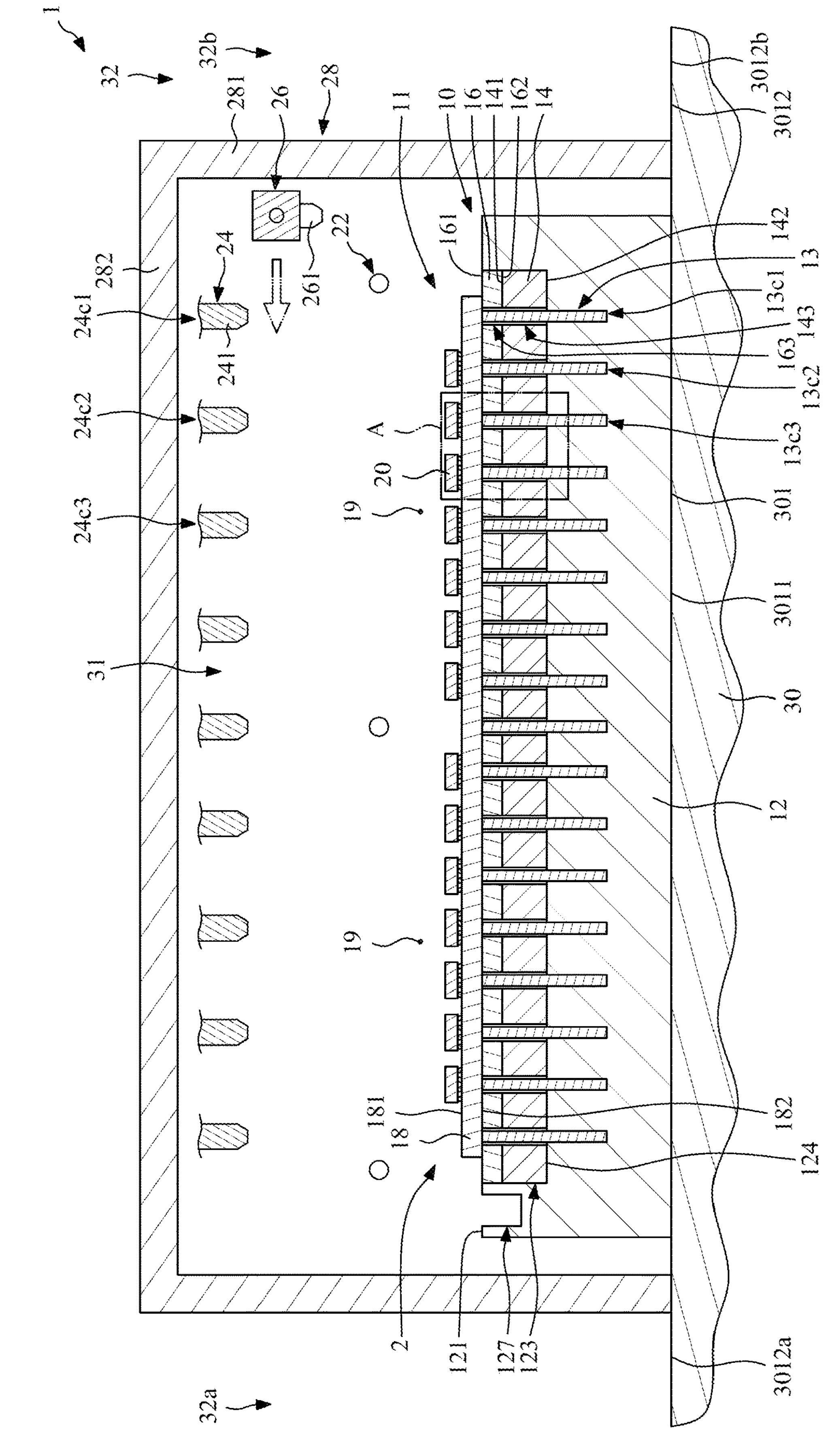
FIG. 1 illustrates a cross-sectional view of an equipment according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
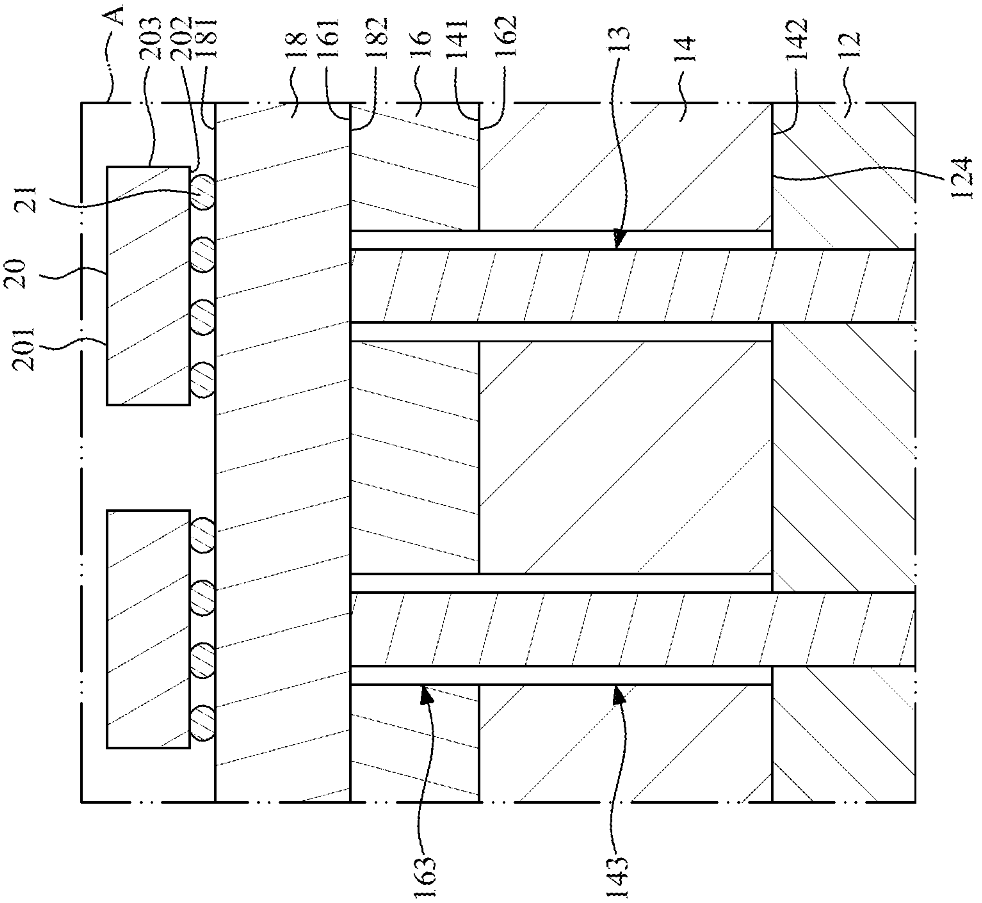
FIG. 2 illustrates a partially enlarged view of a region "A" in FIG. 1.
Figure 3:
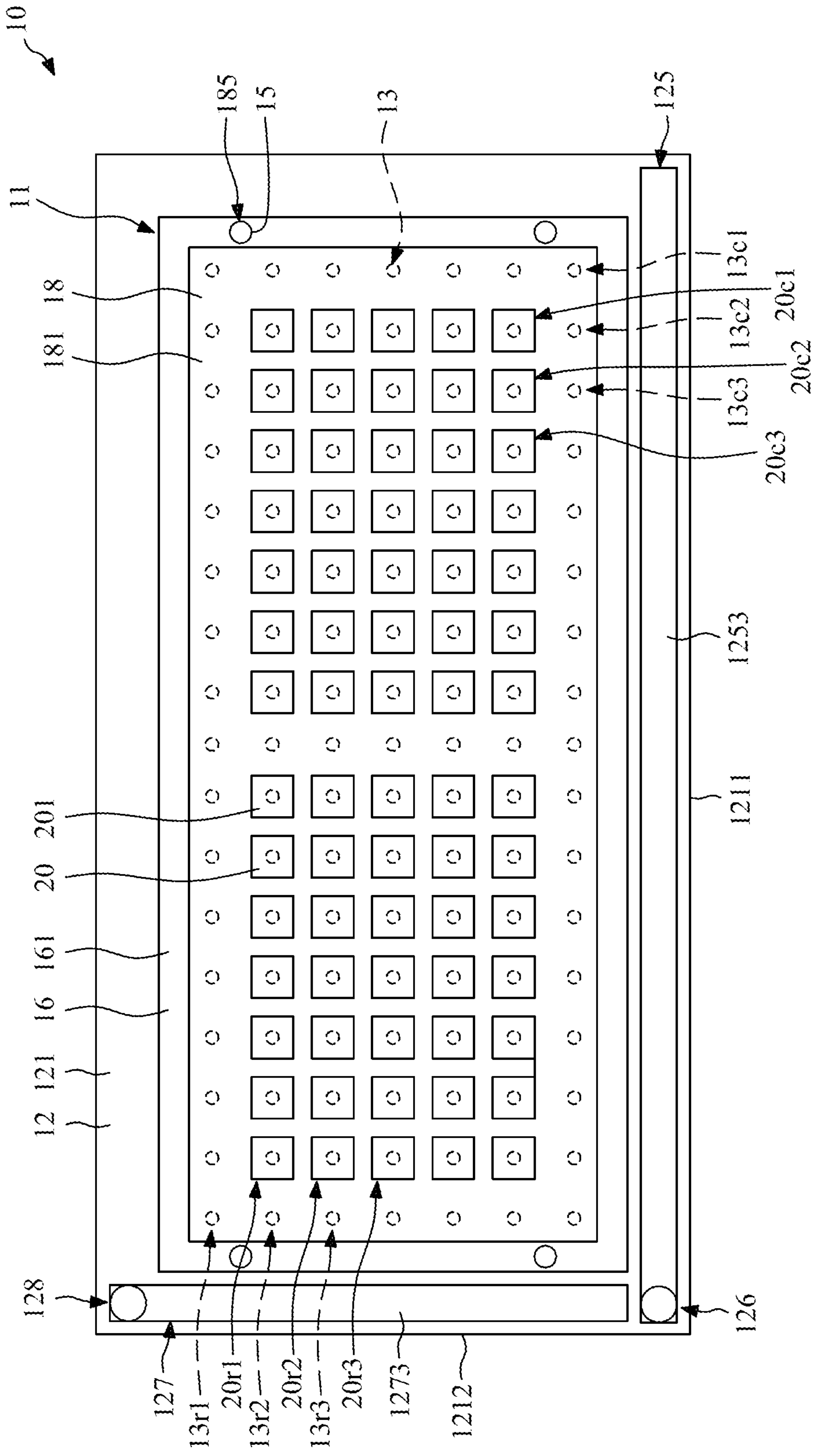
FIG. 3 illustrates a top view of the de-bonding apparatus of FIG. 1.
Figure 4:
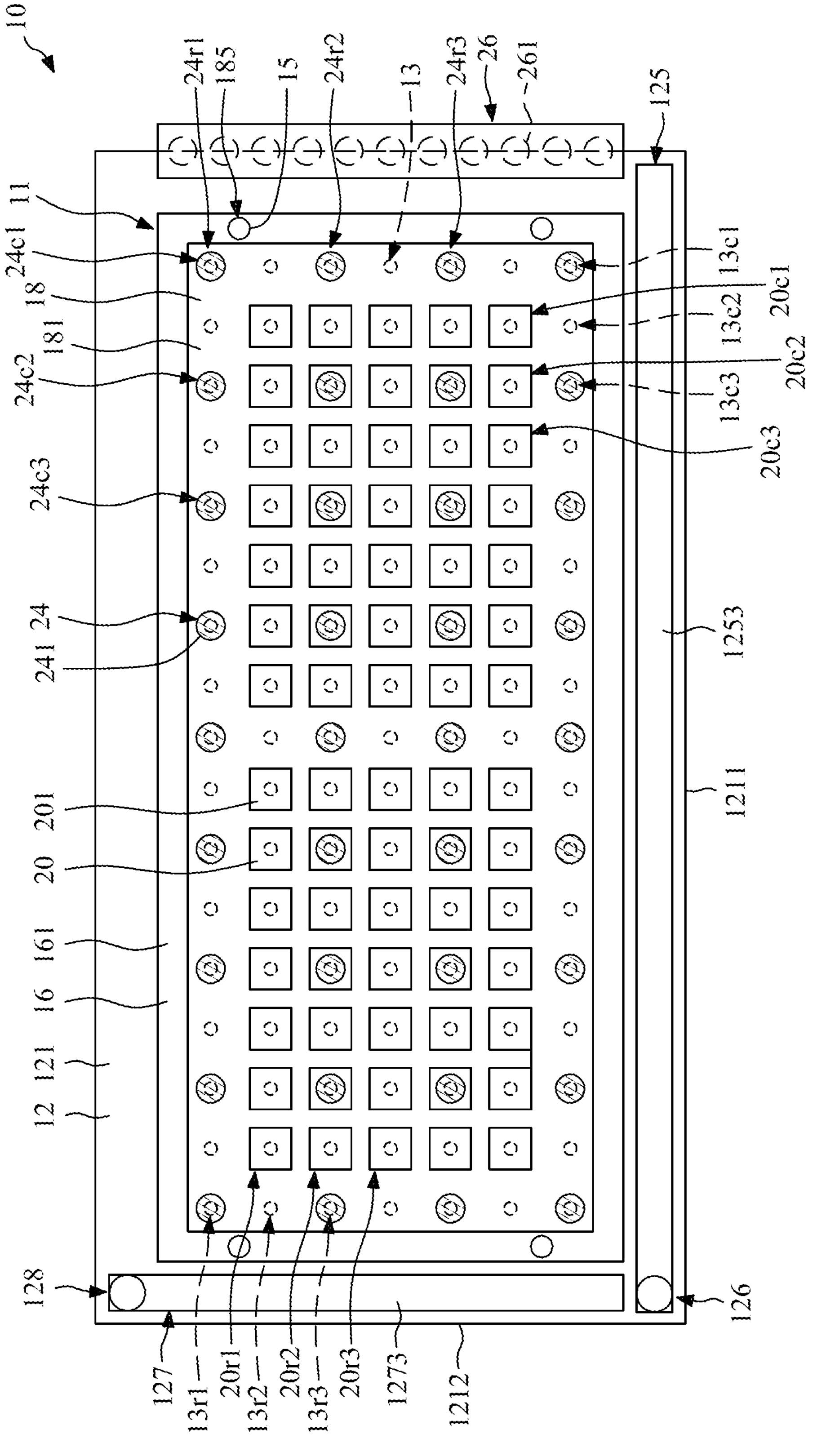
FIG. 4 illustrates a top view of the de-bonding apparatus, the fluid supply device and the air supply device of FIG. 1.
Figure 5:
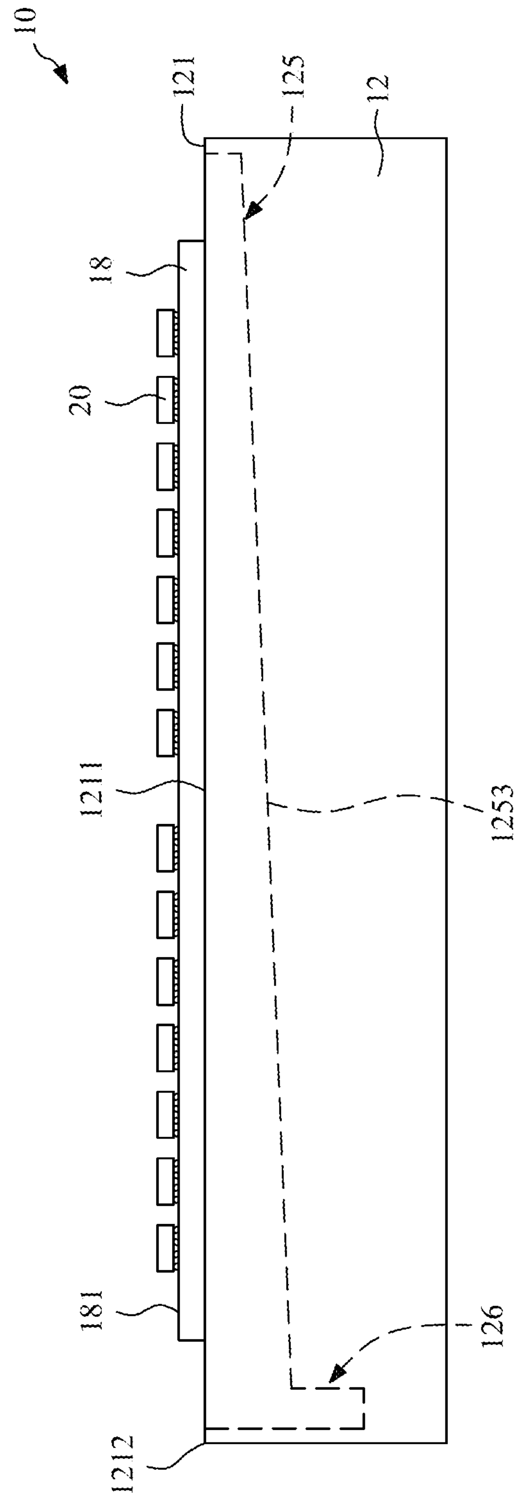
FIG. 5 illustrates a front view of the de-bonding apparatus of FIG. 3.
Figure 39:
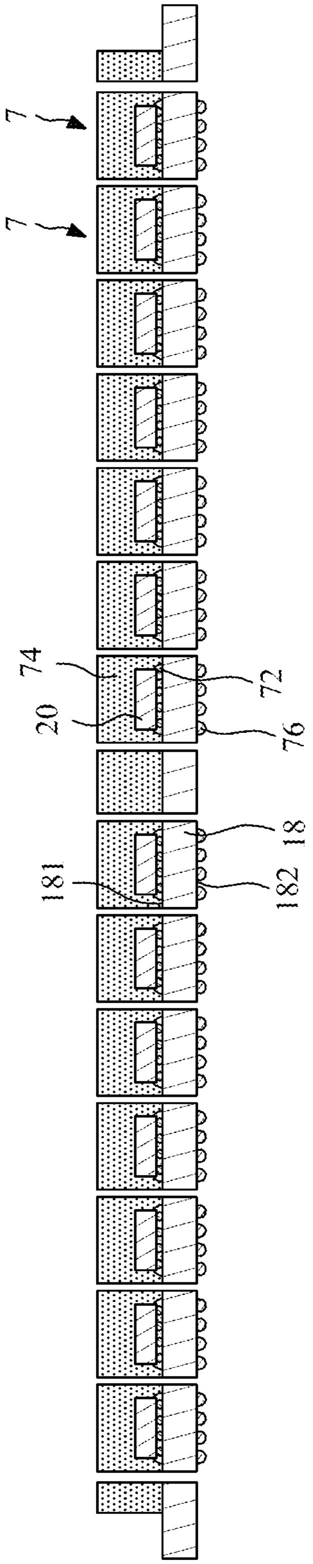
FIG. 39 illustrates one or more stages of an example of a method for manufacturing a package structure according to some embodiments of the present disclosure.

FIG. 1 illustrates a cross-sectional view of an equipment 1 according to some embodiments of the present disclosure. FIG. 2 illustrates a partially enlarged view of a region "A" in FIG. 1. FIG. 3 illustrates a top view of the de-bonding apparatus 10 of FIG. 1. FIG. 4 illustrates a top view of the de-bonding apparatus 10, the fluid supply device 24 and the air supply device 26 of FIG. 1. FIG. 5 illustrates a front view of the de-bonding apparatus 10 of FIG. 3. The equipment 1 may be an equipment that may perform or accomplish a de-bonding process of a semiconductor manufacturing process. In some embodiments, the equipment 1 may be an equipment 1 for manufacturing a package structure 7 (FIG. 39).

The equipment 1 may include a machine table 30, a first space 31, a de-bonding apparatus 10, a second space 32, a fluid supply device 24, at least one static electricity sensor 19, an air supply device 26 and a housing 28. The machine table 30 may be a supporting table, and may have a first surface (e.g., a top surface) 301. The first surface (e.g., the top surface) 301 may include a first portion 3011 and a second portion 3012 around the first portion 3011. The second portion 3012 of the first surface (e.g., the top surface) 301 may include a first area 3012*a* and a second area 3012*b*. The first portion 3011 of the first surface (e.g., the top surface) 301 may be disposed between the first area 3012*a* and the second area 3012*b*.

The first space 31 may be disposed over or adjacent to the first portion 3011 of the first surface (e.g., the top surface) 301 of the machine table 30. That is, the first space 31 may correspond to the first portion 3011 of the first surface (e.g., the top surface) 301 of the machine table 30. Further, the de-bonding apparatus 10 may be disposed in the first space 31, and configured to perform a de-bonding process. That is, the location of the de-bonding apparatus 10 may correspond to the first space 31. Thus, the de-bonding apparatus 10 may be disposed over or adjacent to the first portion 3011 of the first surface (e.g., the top surface) 301 of the machine table 30. The de-bonding apparatus 10 may be configured to perform or accomplish a de-bonding process. In addition, the second space 32 may be disposed around the first space 31. The second space 32 may be disposed over or adjacent to the second portion 3012 of the first surface (e.g., the top surface) 301 of the machine table 30. That is, the second space 32 may correspond to the second portion 3012 of the first surface (e.g., the top surface) 301 of the machine table 30.

In some embodiments, the second space 32 may be a portion of an indoor environment such as a clean room. Thus, the equipment 1 may be placed in the clean room. The second space 32 may include a load area 32*a* and an unload area 32*b*. The first space 31 may be disposed between the load area 32*a* and the unload area 32*b*. The load area 32*a* may be disposed over or adjacent to the first area 3012*a* of the second portion 3012 of the first surface (e.g., the top surface) 301 of the machine table 30. That is, the load area 32*a* may correspond to the first area 3012*a* of the second portion 3012 of the first surface (e.g., the top surface) 301 of the machine table 30. The unload area 32*b* may be disposed over or adjacent to the second area 3012*b* of the second portion 3012 of the first surface (e.g., the top surface) 301 of the machine table 30. That is, the unload area 32*b* may correspond to the second area 3012*b* of the second portion 3012 of the first surface (e.g., the top surface) 301 of the machine table 30. In some embodiments, a first humidity is defined as a humidity of an atmosphere in the first space 31, and a second humidity is defined as a humidity of an atmosphere in the second space 32 (including the load area 32*a* and the unload area 32*b*). The first humidity may be greater than the second humidity during the de-bonding process.

The de-bonding apparatus 10 may include a chuck 12 and a plurality of ejection pins 13 disposed in the chuck 12. In some embodiments, the chuck 12 may include metal material. In some embodiments, the chuck 12 may have a first surface (e.g., a top surface) 121, and may define an accommodating cavity 123 recessed from the first surface (e.g., the top surface) 121. The accommodating cavity 123 may have a bottom surface 124. The accommodating cavity 123 of the chuck 12 may be configured to receive and accommodate a workpiece 11.

As shown in FIG. 3 to FIG. 5, the chuck 12 may define at least one groove (e.g., a first groove 125 and a second groove 127) and at least one drain hole (e.g., a first drain hole 126 and a second drain hole 128). The at least one groove (e.g., the first groove 125 and the second groove 127) may be recessed from the first surface (e.g., the top surface) 121 of the chuck 12. The at least one drain hole (e.g., the first drain hole 126 and the second drain hole 128) may be communicated with a bottommost portion of the groove (e.g., the first groove 125 and the second groove 127). For example, the first groove 125 may be disposed adjacent to a long edge 1211 of the chuck 12. The first groove 125 may be recessed from the first surface (e.g., the top surface) 121 of the chuck 12, and the first drain hole 126 may be in fluid communication with a bottommost portion of the first groove 125. Thus, the first drain hole 126 may be spaced apart from the first surface (e.g., the top surface) 121 of the chuck 12. The first groove 125 may be disposed between the first drain hole 126 and the first surface (e.g., the top surface) 121 of the chuck 12. The first groove 125 may have a slanted bottom surface 1253 connecting to the first drain hole 126. The slanted bottom surface 1253 may be non-parallel with the first surface (e.g., the top surface) 121 of the chuck 12 so as to guide the liquid in the first groove 125 to flow to the first drain hole 126. Similarly, the second groove 127 may be disposed adjacent to a short edge 1212 of the chuck 12. The second groove 127 may be recessed from the first surface (e.g., the top surface) 121 of the chuck 12, and the second drain hole 128 may be in fluid communication with a bottommost portion of the second groove 127. Thus, the second drain hole 128 may be spaced apart from the first surface (e.g., the top surface) 121 of the chuck 12. The second groove 127 may be disposed between the second drain hole 128 and the first surface (e.g., the top surface) 121 of the chuck 12. The second groove 127 may have a slanted bottom surface 1273 connecting to the second drain hole 128. The slanted bottom surface 1273 may be non-parallel with the first surface (e.g., the top surface) 121 of the chuck 12 so as to guide the liquid in the second groove 127 to flow to the second drain hole 128.

As shown in FIG. 1, the workpiece 11 may be an assembly structure 11 including a substrate structure 18, at least one die 20 (e.g., semiconductor die 20 or electronic die 20 or MEMS die 20), a tape 16 and a carrier board 14. The tape 16 may be also referred to as "a second element". The die 20 may be disposed on the substrate structure 18, or may be disposed adjacent to a first surface 181 of the substrate structure 18. The combination of the die 20 and the substrate structure 18 may be a combination structure 2 (or a strip structure 2). The combination structure 2 may include a substrate structure 18 and a plurality of semiconductor dice 20. The substrate structure 18 may be also referred to as "a first element" or "a wiring structure". The carrier board 14 may include metal material such as stainless steel or aluminum alloy. The carrier board 14 may have a first surface (e.g., a top surface) 141 and a second surface (e.g., a bottom surface) 142 opposite to the first surface 141. The carrier board 14 may define a plurality of through holes 143 extending through the carrier board 14. The carrier board 14 may be used to provide rigidity to the overall workpiece 11 or the assembly structure 11. In some embodiments, the second surface 142 of the carrier board 14 may be sucked by a plurality of sucking holes or vacuum holes recessed from the bottom surface 124 of the accommodating cavity 123 of the chuck 12. A thickness of the carrier board 14 may be greater than a thickness of the tape 16 and a thickness of the substrate structure 18. Thus, the carrier board 14 may inhibit a warpage of the substrate structure 18 since the carrier board 14 may provide enough rigidity to resist the warpage of the substrate structure 18 caused by temperature variation.

The tape 16 (e.g., the second element) may be a layer, and may include an adhesive material such as silicon rubber. The tape 16 may be used to temporarily adhere and bond the substrate structure 18 to the carrier board 14 so as to reduce the warpage or deformation of the substrate structure 18 and to facilitate the handling of the substrate structure 18 during the manufacturing process. The tape 16 may have a first surface (e.g., a top surface) 161 and a second surface (e.g., a bottom surface) 162 opposite to the first surface 161. The second surface 162 of the tape 16 may contact the first surface 141 of the carrier board 14. The tape 16 may define a plurality of through holes 163 extending through the tape 16. The through holes 163 of the tape 16 may be in communication with the through holes 143 of the carrier board 14. In some embodiments, the through holes 163 of the tape 16 may be aligned with the through holes 143 of the carrier board 14. In some embodiments, the through holes 163 of the tape 16 may be misaligned with the through holes 143 of the carrier board 14. In some embodiments, the first surface (e.g., the top surface) 161 of the tape 16 may be substantially aligned with the first surface (e.g., the top surface) 121 of the chuck 12. In some embodiments, the first surface (e.g., the top surface) 161 of the tape 16 may be higher than or lower than the first surface (e.g., the top surface) 121 of the chuck 12. In some embodiments, a width of the tape 16 and a width of the carrier board 14 may be substantially equal to a width of the accommodating cavity 123 of the chuck 12.

In some embodiments, the tape 16 and the carrier board 14 may further define a plurality of position holes 185 (FIG. 3) extending through the tape 16 and the carrier board 14. The chuck 12 may include a plurality of position pins 15 (FIG. 3). When the workpiece 11 (or the assembly structure 11) is placed in the accommodating cavity 123 of the chuck 12, the position pins 15 may be inserted into the position holes 185 so as to fix the position of the workpiece 11 (or the assembly structure 11).

The substrate structure 18 (e.g., the first element) may have a first surface (e.g., a top surface) 181 and a second surface (e.g., a bottom surface) 182 opposite to the first surface 181. The second surface (e.g., the bottom surface) 182 of the substrate structure 18 may be bonded to the first surface (e.g., the top surface) 161 of the tape 16. A width of the substrate structure 18 may be less than the width of the tape 16. Thus, the difference between the width of the substrate structure 18 and the width of the tape 16 may permit a tolerance when the substrate structure 18 is attached to the tape 16. The substrate structure 18 may include at least one circuit layer (not shown) therein. For example, the substrate structure 18 may include a ground circuit layer that is electrically connected to the ejection pins 13 for grounding. The semiconductor dice 20 may be physically connected and electrically connected to the first surface (e.g., the top surface) 181 of the substrate structure 18.

As shown in FIG. 2, each of the dice 20 (e.g., semiconductor dice 20 or electronic dice 20 or MEMS dice 20) may have a first surface (e.g., a top surface or a backside surface) 201, a second surface (e.g., a bottom surface or an active surface) 202 and a lateral surface 203. The second surface (e.g., bottom surface) 202 may be opposite to the first surface 201, and may face the first surface (e.g., the top surface) 181 of the substrate structure 18. The lateral surface 203 may extend between the first surface 201 and the second surface 202. Each of the semiconductor dice 20 may include at least one bump 21 disposed on the second surface 202 and connected to the substrate structure 18. The semiconductor dice 20 may be attached to the substrate structure 18 through flip-chip bonding. The second surface 202 of the semiconductor die 20 may be physically connected and electrically connected to the first surface 181 of the substrate structure 18 through the bumps 21. The thickness of the substrate structure 18 may be greater than or less than the thickness of the tape 16.

As shown in FIG. 1, the housing 28 may cover the de-bonding apparatus 10, and physically separate the first space 31 and the second space 32. Thus, the first space 31 may be separated or isolated from the second space 32 through the housing 28. In some embodiments, the housing 28 may be a cap structure, and may include at least one first portion 281 and a second portion 282. The first portion 281 may be a sidewall that connects to and stands on the first surface (e.g., the top surface) 301 of the machine table 30. The second portion 282 may be a roof that covers the first portion 281. In some embodiments, the first space 31 may be defined by the housing 28, and may be an enclosed space. That is, the housing 28 may cover the first portion 3011 of the first surface (e.g., the top surface) 301 of the machine table 30. In some embodiments, the housing 28 may define an air hole 22 configured to vent out a humid air of the first space 31 to an outer space (e.g., the second space 32) or introduce a dry air of an outer space (e.g., the second space 32) into the first space 31. In some embodiments, the housing 28 may define a first air hole 22 and a second air hole 22. The first air hole 22 may be configured to vent out a humid air of the first space 31 to an outer space (e.g., the second space 32). The second air hole 22 may be configured to introduce a dry air of an outer space (e.g., the second space 32) into the first space 31. Therefore, the first space 31 may be communicated with the outer space (e.g., the second space 32) through the air hole 22. The air hole 22 may be a venting channel and/or an inlet channel so as to control the first humidity of the first space 31.

The fluid supply device 24 may be disposed in or outside the first space 31, and may be configured to humidify the first space 31. The fluid supply device 24 may be configured to make a first humidity of an atmosphere in the first space 31 greater than a second humidity of an atmosphere in the second space 32. In some embodiments, the fluid supply device 24 may include one or more dispensing device 241 (e.g., nozzles 241) configured to dispense a liquid to the de-bonding apparatus 10. In some embodiments, the nozzles 241 may be arranged in an array or in at least one row. The fluid supply device 24 may be fixed at a position, or may be moveable along a path. The nozzles 241 may be opened in sequence or simultaneously. In some embodiments, the nozzles 241 may spray while moving. In some embodiments, the fluid supply device 24 (including the nozzles 241) may be rotatable. For example, the fluid supply device 24 may be configured to apply a fluid on the workpiece 11 in the de-bonding apparatus 10. The fluid may include a plurality of ion carriers or may include a polar material. In some embodiments, the fluid may include an ion flow that contains the ion carriers. In some embodiments, the fluid may include a liquid (e.g., water or alcohol) that is a polar material and may contain the ion carriers. In some embodiments, the fluid may include a moisture that is a polar material and may contain the ion carriers. Thus, the polar material of the present disclosure may include the water containing the ion carriers and the moisture containing the ion carriers. In some embodiments, the fluid may be a mixture of water vapor and carbon dioxide ($CO_2$) gas.

For example, the fluid supply device 24 may be configured to spray or dispense a water on a receiving surface (e.g., the first surface (e.g., the top surface) 181 of the substrate structure 18 and the first surfaces (e.g., the top surface) 201 of the semiconductor dice 20) of the workpiece 11 in the de-bonding apparatus 10. For example, the fluid supply device 24 may be configured to supply the ion flow including a plurality of ion carriers on the receiving surface (e.g., the first surface 181 of the substrate structure 18 and the first surfaces 201 of the semiconductor dice 20) of the workpiece 11 in the de-bonding apparatus 10. The receiving surface (e.g., the first surface (e.g., the top surface) 181 of the substrate structure 18 and the first surfaces (e.g., the top surface) 201 of the semiconductor dice 20) of the workpiece 11 is opposite to a separation surface (e.g., the second surface (e.g., the bottom surface) 182 of the substrate structure 18 or the first surface (e.g., the top surface) 161 of the tape 16) of the workpiece 11. The separation surface (e.g., the second surface (e.g., the bottom surface) 182 of the substrate structure 18 or the first surface (e.g., the top surface) 161 of the tape 16) may be defined as a surface or an interface where the substrate structure 18 may be separated from the tape 16 during the de-bonding process.

In an embodiment that the polar material (e.g., water) is sprayed or dispensed, a plurality of droplets or particles may be formed on the receiving surface (e.g., the first surface 181 of the substrate structure 18 and the first surfaces 201 of the semiconductor dice 20) of the workpiece 11. For example, the polar material (e.g., water) may include a plurality of water droplets spaced apart from each other or may include a plurality of ion-containing particles spaced apart from each other. Thus, the ion carriers may be divided into a plurality of groups on the receiving surface. Each of the groups contains a portion of the ion carriers, and the groups of the ion carriers are spaced apart from each other. Each of the water droplets or each of the ion-containing particles may include each of the groups. In some embodiments, the water droplets (or the ion-containing particles) may have different sizes.

The air supply device 26 may be disposed in the first space 31, and may be configured to provide air to remove the liquid from the de-bonding apparatus 10. The air supply device 26 may be configured to move relatively to the de-bonding apparatus 10. The air supply device 26 may be configured to blow away the liquid (e.g., including a plurality of water droplets) on the receiving surface (e.g., the first surface (e.g., the top surface) 181 of the substrate structure 18 and the first surfaces (e.g., the top surface) 201 of the semiconductor dice 20) of the workpiece 11. In some embodiments, the air supply device 26 may include a plurality of nozzles 261. In some embodiments, the nozzles 261 may be arranged in at least one row to form at least one air knife. In some embodiments, the air supply device 26 (including the nozzles 261) may move along the receiving surface (e.g., the first surface (e.g., the top surface) 181 of the substrate structure 18 and the first surfaces (e.g., the top surface) 201 of the semiconductor dice 20) of the workpiece 11. In some embodiments, the air supply device 26 (including the nozzles 261) may be rotatable. In some embodiments, the air supply device 26 may be configured to blow the liquid (e.g., including the water droplets) on the receiving surface (e.g., the first surface (e.g., the top surface) 181 of the substrate structure 18 and the first surfaces (e.g., the top surface) 201 of the semiconductor dice 20) of the workpiece 11 to the first groove 125 and/or the second groove 127.

The ejection pins 13 may protrude from the bottom surface 124 of the accommodating cavity 123 of the chuck 12, and may extend through or pass through the through holes 143 of the carrier board 14 and the through holes 163 of the tape 16. The ejection pins 13 may contact the second surface (e.g., the bottom surface) 182 of the substrate structure 18. In some embodiments, the ejection pins 13 may move upward to push the substrate structure 18 to move upward to perform or accomplish a de-bonding process. Thus, the second surface (e.g., the bottom surface) 182 of the substrate structure 18 may leave the first surface (e.g., the top surface) 161 of the tape 16. The second surface (e.g., the bottom surface) 182 of the substrate structure 18 or the first surface (e.g., the top surface) 161 of the tape 16 may be defined as a separation surface. In some embodiments, each of the ejection pins 13 may push or eject a portion of the substrate structure 18 to move upward to separate, detach or de-bond from the tape 16. As shown in FIG. 3, the ejection pins 13 may be arranged in an array. The ejection pins 13 may push or eject the substrate structure 18 row by row or column by column. That is, the ejection pins 13 may push or eject the substrate structure 18 in sequence.

The static electricity sensor 19 may be disposed above the first surface 181 of the substrate structure 18 so as to detect and measure the static electricity of the substrate structure 18 by a non-contact means. For example, the static electricity sensor 19 may measure and record the variation of the static electricity of the substrate structure 18 during the de-bonding process. If the value measured by the static electricity sensor 19 exceeds a predetermined value, an alarm signal may be generated and the equipment 1 may be shut down temporarily.

As shown in FIG. 3 and FIG. 4, the semiconductor dice 20 may at least include a first column **20*c*1 of semiconductor dice 20, a second column 20*c*2 of semiconductor dice 20, a third column 20*c*3 of semiconductor dice 20, a first row 20*r*1 of semiconductor dice 20, a second row 20*r*2 of semiconductor dice 20 and a third row 20*r*3 of semiconductor dice 20. The ejection pins 13 may at least include a first column 13*c*1 of ejection pins 13, a second column 13*c*2 of ejection pins 13, a third column 13*c*3 of ejection pins 13, a first row 13*r*1 of ejection pins 13, a second row 13*r*2 of ejection pins 13 and a third row 13*r*3 of ejection pins 13. The columns 13*c*1, 13*c*2, 13*c*3 of ejection pins 13 may be arranged along the short edge of the substrate structure 18. The rows 13*r*1, 13*r*2, 13*r*3 of ejection pins 13 may be arranged along the long edge of the substrate structure 18. In some embodiments, the rows 13*r*1, 13*r*2, 13*r*3 of ejection pins 13 may move upward in sequence, i.e., row by row. Alternatively, the columns 13*c*1, 13*c*2, 13*c*3 of ejection pins 13 may move upward in sequence, i.e., column by column. The first column 13*c*1 of ejection pins 13 may correspond to no semiconductor die. There may be no semiconductor dice disposed over the first column 13*c*1 of ejection pins 13. The second column 13*c*2 of ejection pins 13 may correspond to the first column 20*c*1 of semiconductor dice 20. That is, the first column 20*c*1 of semiconductor dice 20 may be disposed over the second column 13*c*2 of ejection pins 13. The third column 13*c*3 of ejection pins 13 may correspond to the second column 20*c*2 of semiconductor dice 20. That is, the second column 20*c*2 of semiconductor dice 20 may be disposed over the third column 13*c*3 of ejection pins 13. In addition, the first row 13*r*1 of ejection pins 13 may correspond to no semiconductor die. There may be no semiconductor dice disposed over the first row 13*r*1 of ejection pins 13. The second row 13*r*2 of ejection pins 13 may correspond to the first row 20*r*1 of semiconductor dice 20. That is, the first row 20*r*1 of semiconductor dice 20 may be disposed over the second row 13*r*2 of ejection pins 13. The third row 13*r*3 of ejection pins 13 may correspond to the second row 20*r*2 of semiconductor dice 20. That is, the second row 20*r*2 of semiconductor dice 20 may be disposed over the third row 13*r*3 of ejection pins 13. A pitch between the ejection pins 13 may be substantially equal to a pitch between the semiconductor dice 20**.

The nozzles 241 of the fluid supply device 24 may at least include a first column **24*c*1 of nozzles 241, a second column 24*c*2 of nozzles 241, a third column 24*c*3 of nozzles 241, a first row 24*r*1 of nozzles 241, a second row 24*r*2 of nozzles 241 and a third row 24*r*3 of nozzles 241. The distribution of the nozzles 241 of the fluid supply device 24 may or may not correspond to the distribution of the ejection pins 13. The distribution of the nozzles 241 of the fluid supply device 24 may or may not correspond to the distribution of the semiconductor dice 20. The distribution of the semiconductor dice 20 may or may not correspond to the distribution of the ejection pins 13. The first column 24*c*1 of nozzles 241 may correspond to no semiconductor die. There may be no semiconductor dice disposed under the first column 24*c*1 of nozzles 241. The first column 24*c*1 of nozzles 241 may correspond to the first column 13*c*1 of ejection pins 13. The second column 24*c*2 of nozzles 241 may correspond to the second column 20*c*2 of semiconductor dice 20. That is, the second column 20*c*2 of semiconductor dice 20 may be disposed under the second column 24*c*2 of nozzles 241. The second column 24*c*2 of nozzles 241 may correspond to the third row 13*r*3 of ejection pins 13. The third column 24*c*3 of nozzles 241 may correspond to a fourth column of semiconductor dice 20. That is, the fourth column of semiconductor dice 20 may be disposed under the third column 24*c*3 of nozzles 241. The third column 24*c*3 of nozzles 241 may correspond to a fifth column of ejection pins 13. In addition, the first row 24*r*1 of nozzles 241 may correspond to no semiconductor die. There may be no semiconductor dice disposed under the first row 24r1 of nozzles 241. The first row 24r1 of nozzles 241 may correspond to the first row 13r1 of ejection pins 13. The second row 24r2 of nozzles 241 may correspond to the second row 20r2 of semiconductor dice 20. That is, the second row 20r2 of semiconductor dice 20 may be disposed under the second row 24r2 of nozzles 241. The second row 24r2 of nozzles 241 may correspond to the third row 13r3 of ejection pins 13. The third row 24r3 of nozzles 241 may correspond to a fourth row of semiconductor dice 20. That is, the fourth row of semiconductor dice 20 may be disposed under the third row 24r3 of nozzles 241. The third row 24r3 of nozzles 241 may correspond to a fifth row of ejection pins 13. A pitch between the nozzles 241 of the fluid supply device 24 may be greater than the pitch between the ejection pins 13 and the pitch between the semiconductor dice 20. The nozzles 261 of the air supply device 26 may at least include a column of nozzles 261**.

In the embodiment illustrated in FIG. 1 to FIG. 5, during the de-bonding process, a static electricity may be generated at the second surface (e.g., the bottom surface) 182 of the substrate structure 18 (e.g., the separation surface). The static electricity may damage the semiconductor dice 20. In the present disclosure, the liquid (e.g., water or alcohol) may be applied to one side (e.g., first side or top side) of the substrate structure 18 through the nozzles 241 of the fluid supply device 24 so as to neutralize a plurality of static electricity charges adjacent to the first surface 181 of the substrate structure 18. Thus, the static electricity generated at the second surface 182 of the substrate structure 18 may be reduced or eliminated. In addition, the liquid (e.g., water or alcohol) may be blown to the groove (e.g., the first groove 125 and the second groove 127), and then drained by the drain hole (e.g., the first drain hole 126 and the second drain hole 128).

Figure 6:
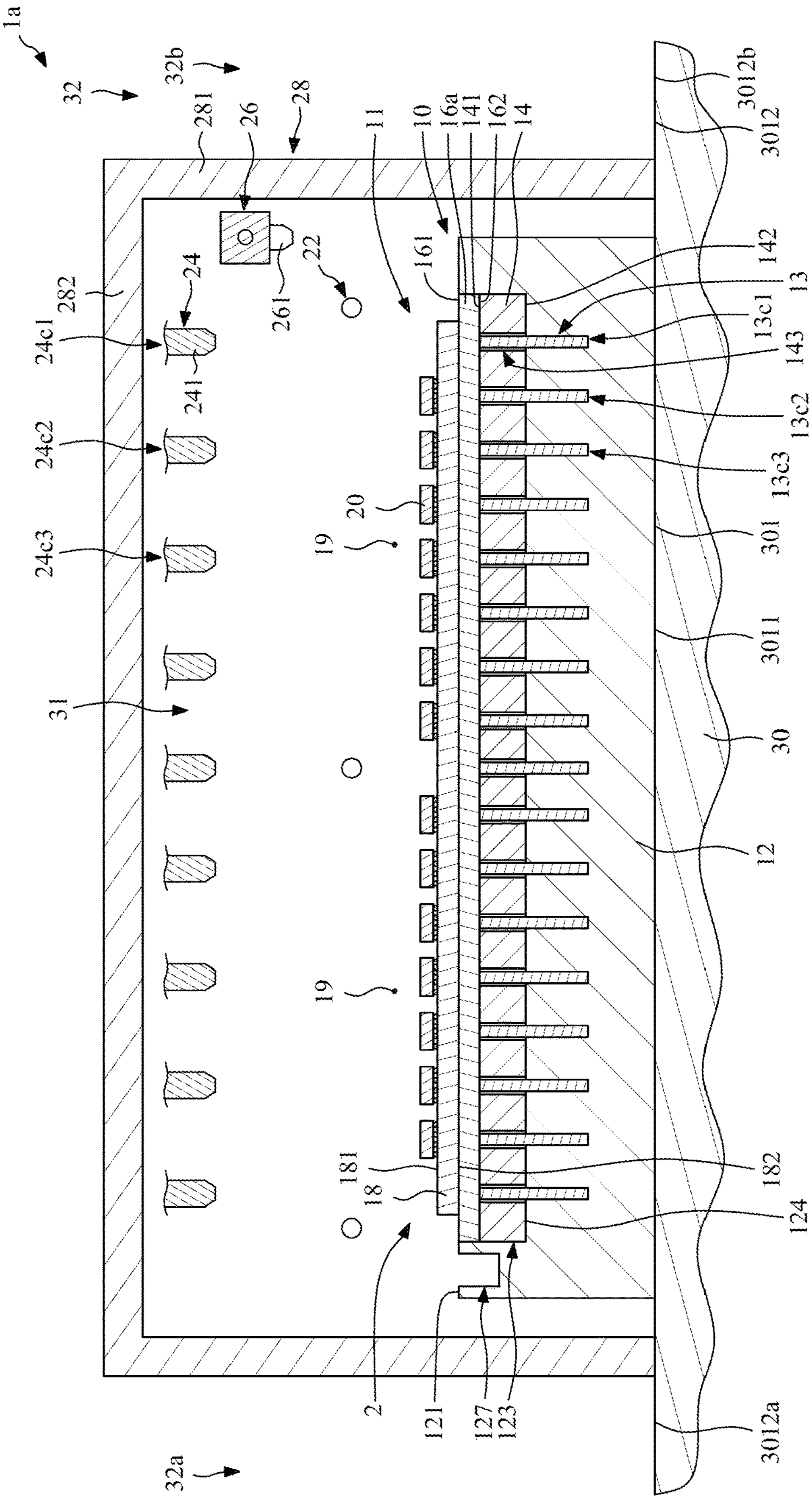
FIG. 6 illustrates a cross-sectional view of an equipment according to some embodiments of the present disclosure.

FIG. 6 illustrates a cross-sectional view of an equipment 1a according to some embodiments of the present disclosure. The equipment 1a of FIG. 6 may be similar to the equipment 1 of FIG. 1, except for a structure of the tape 16a. As shown in FIG. 6, the through holes 163 of the tape 16 of FIG. 1 are omitted. Thus, the tape 16a of FIG. 6 may not define through holes for the ejection pins 13 to extend through or pass through. Thus, the liquid may not flow into the through hole 143 of the carrier board 14. Further, voids and a popcorn effect may be avoided during a reflow process. The ejection pins 13 may contact and push the second surface (e.g., the bottom surface) 162 of the tape 16a. The ejection pins 13 may not contact the second surface (e.g., the bottom surface) 182 of the substrate structure 18. In addition, the tape 16 may include a plurality blocks separated from and spaced apart from each other. The gaps between the blocks of the tape 16 may allow the ejection pins 13 to extend through or pass through. Further, individual blocks may be replaced. Further, moist air in the first space 31 may enter the gaps between the blocks of the tape 16 to contact the second surface 182 of the substrate structure 18 to further reduce the static electricity. Thus, the static electricity of the substrate structure 18 may be reduced from the first surface 181 and the second surface 182 of the substrate structure 18.

Figure 7:
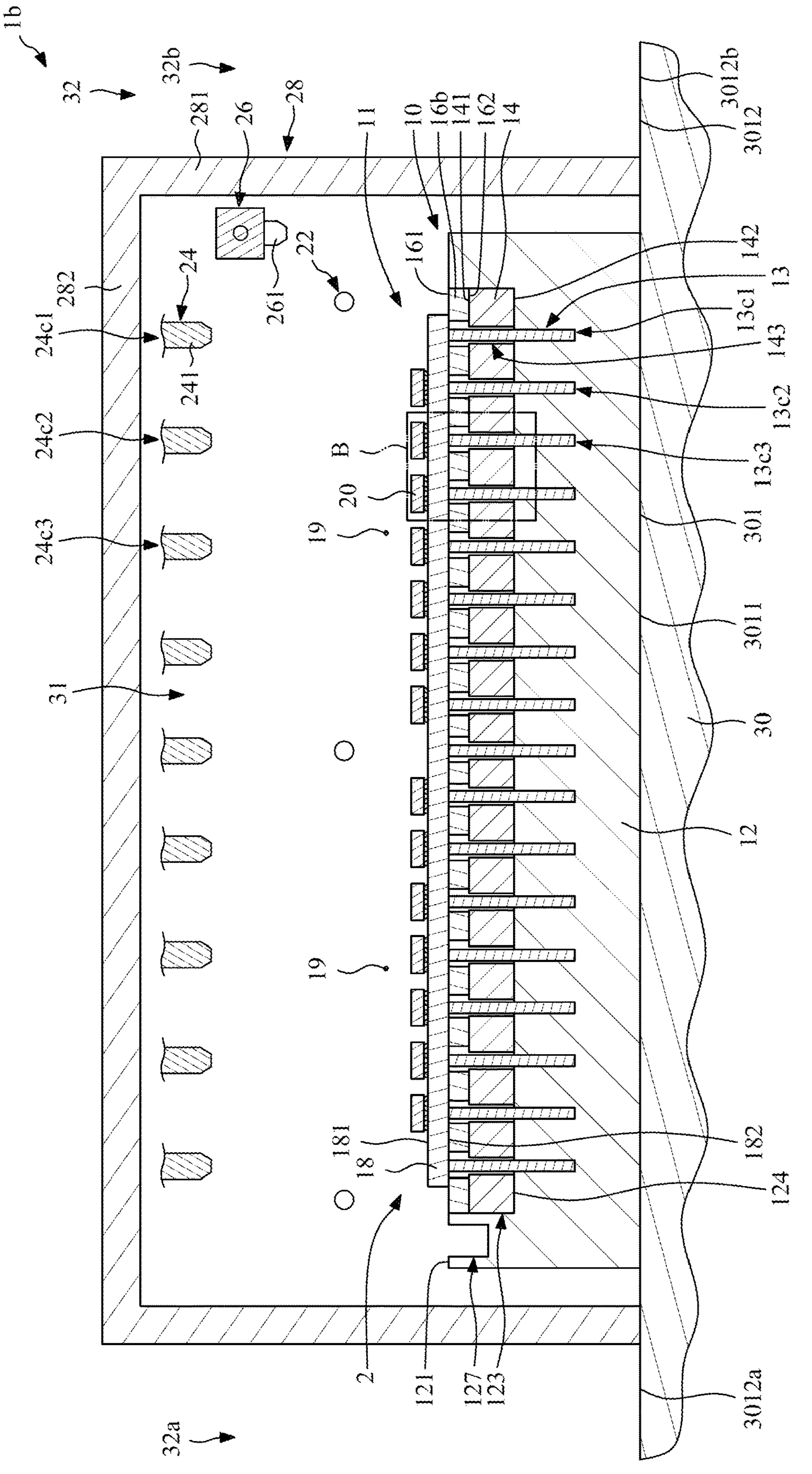
FIG. 7 illustrates a cross-sectional view of an equipment according to some embodiments of the present disclosure
Figure 8:
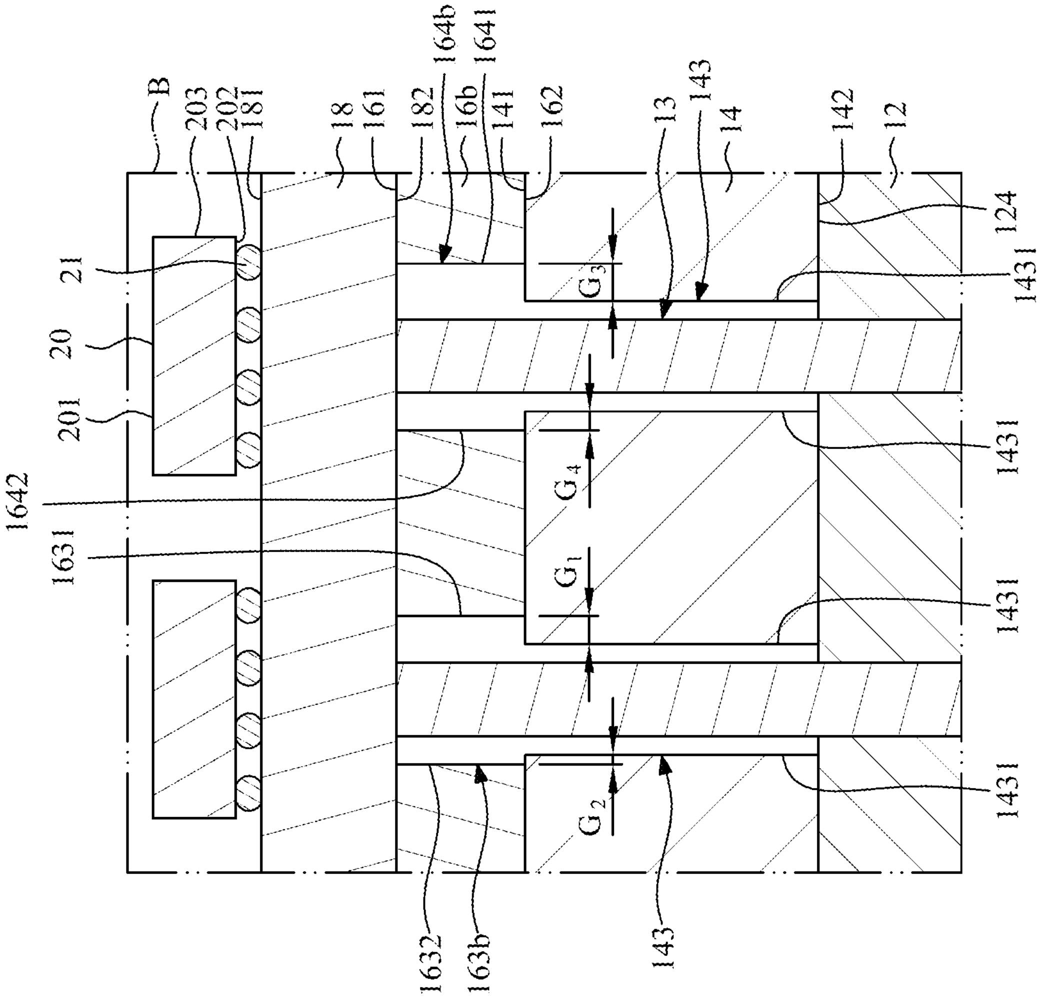
FIG. 8 illustrates a partially enlarged view of a region "B" in FIG. 7.

FIG. 7 illustrates a cross-sectional view of an equipment 1b according to some embodiments of the present disclosure. FIG. 8 illustrates a partially enlarged view of a region "B" in FIG. 7. The equipment 1b of FIG. 7 and FIG. 8 may be similar to the equipment 1 of FIG. 1 and FIG. 2, except for a structure of the tape 16b. As shown in FIG. 7 and FIG. 8, the tape 16b may define a first through hole 163b and a second through hole 164b. The first through hole 163b may include a first sidewall 1631 and a second sidewall 1632 opposite to the first sidewall 1631. The through hole 143 of the carrier board 14 may include a sidewall 1431. A width of the first through hole 163b of the tape 16b may be greater than a width of the through hole 143 of the carrier board 14. Thus, the first sidewall 1631 and the second sidewall 1632 of the first through hole 163b may be misaligned with the sidewall 1431 of the through hole 143. In addition, a central axis of the first through hole 163b may be misaligned with a central axis of the through hole 143. In some embodiments, a first gap $G_1$ between the first sidewall 1631 of the first through hole 163b and the sidewall 1431 of the through hole 143 may be different from a second gap $G_2$ between the second sidewall 1632 of the first through hole 163b and the sidewall 1431 of the through hole 143.

The second through hole 164b may include a first sidewall 1641 and a second sidewall 1642 opposite to the first sidewall 1641. The through hole 143 of the carrier board 14 may include a sidewall 1431. A width of the second through hole 164b of the tape 16b may be greater than the width of the through hole 143 of the carrier board 14 and the width of the first through hole 163b of the tape 16b. Thus, the first sidewall 1641 and the second sidewall 1642 of the second through hole 164b may be misaligned with the sidewall 1431 of the through hole 143. In addition, a central axis of the second through hole 164b may be misaligned with a central axis of the through hole 143. In some embodiments, a third gap $G_3$ between the first sidewall 1641 of the second through hole 164b and the sidewall 1431 of the through hole 143 may be different from a fourth gap $G_4$ between the second sidewall 1642 of the second through hole 164b and the sidewall 1431 of the through hole 143. In some embodiments, the third gap $G_3$ may be greater than the first gap $G_1$. The first gap $G_1$ may be greater than the fourth gap $G_4$. The fourth gap $G_4$ may be greater than the second gap $G_2$.

Figure 9:
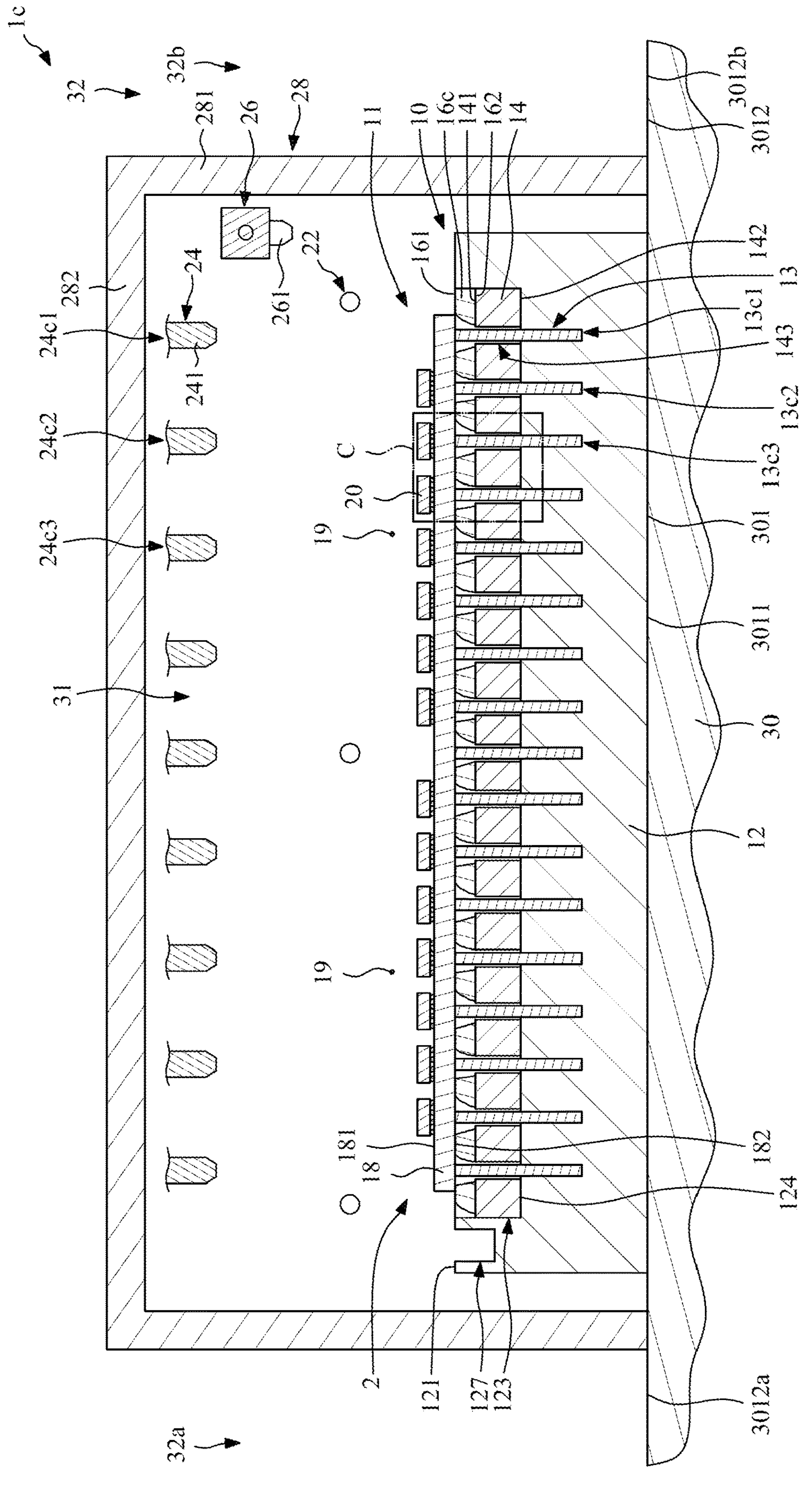
FIG. 9 illustrates a cross-sectional view of an equipment according to some embodiments of the present disclosure.
Figure 10:
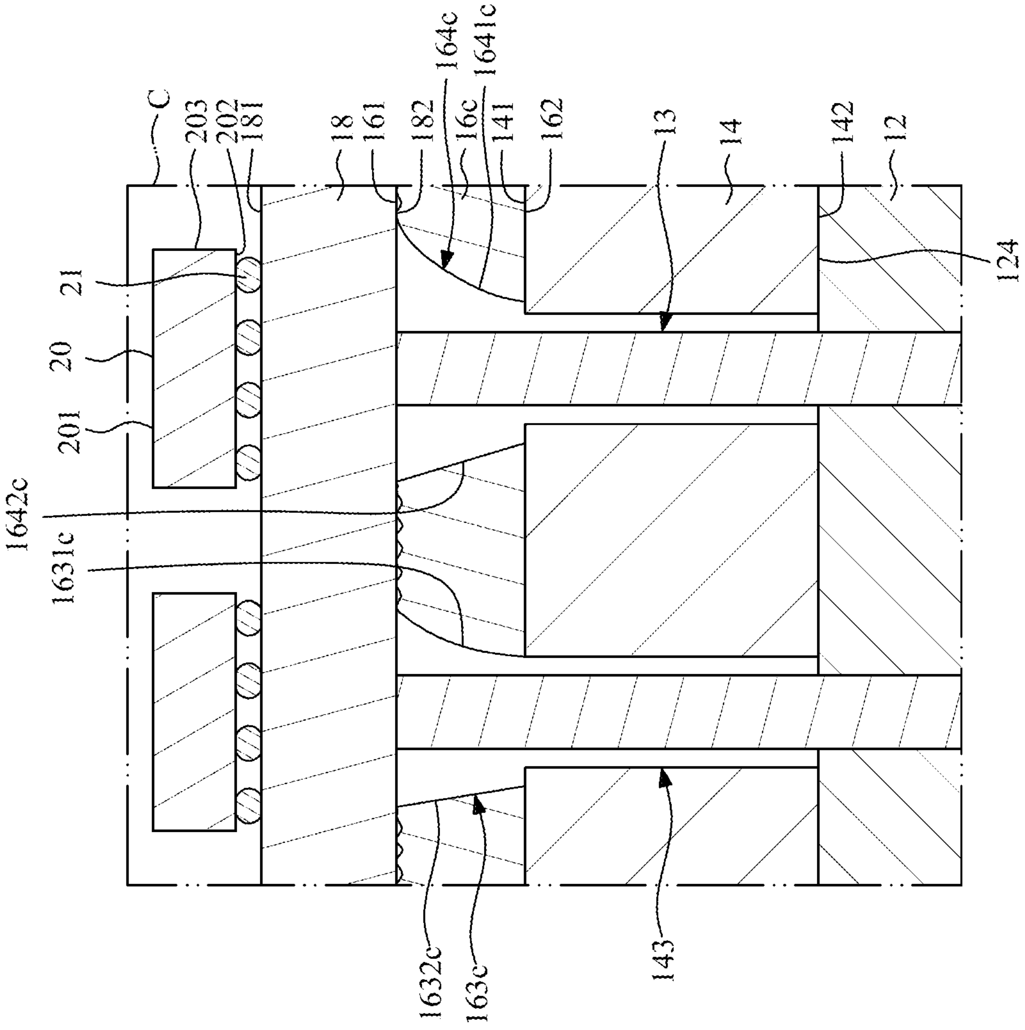
FIG. 10 illustrates a partially enlarged view of a region "C" in FIG. 9.

FIG. 9 illustrates a cross-sectional view of an equipment 1c according to some embodiments of the present disclosure. FIG. 10 illustrates a partially enlarged view of a region "C" in FIG. 9. The equipment 1c of FIG. 9 and FIG. 10 may be similar to the equipment 1b of FIG. 7 and FIG. 8, except for a structure of the tape 16c. As shown in FIG. 9 and FIG. 10, the first sidewall 1631c of the first through hole 163c and the first sidewall 1641c of the second through hole 164c may include a curved surface so as to avoid the concentration of the static electricity charges, which may reduce the amount of the static electricity charges on the second surface 182 of the substrate structure 18. In comparison with a right-angle profile, an obtuse-angle profile or a curved profile may avoid charge accumulation and may reduce the amount of charges induced on the second surface 182 of the substrate structure 18. A curvature of the first sidewall 1631c of the first through hole 163c may be less than a curvature of the first sidewall 1641c of the second through hole 164c. Further, the second sidewall 1632c of the first through hole 163c and second sidewall 1642c of the second through hole 164c may include a slanted flat surface. A slope of the second sidewall 1632c of the first through hole 163c may be greater than a slope of the second sidewall 1642c of the second through hole 164c. In addition, the first surface (e.g., the top surface) 161 of the tape 16c may be a rough surface.

Figure 11:
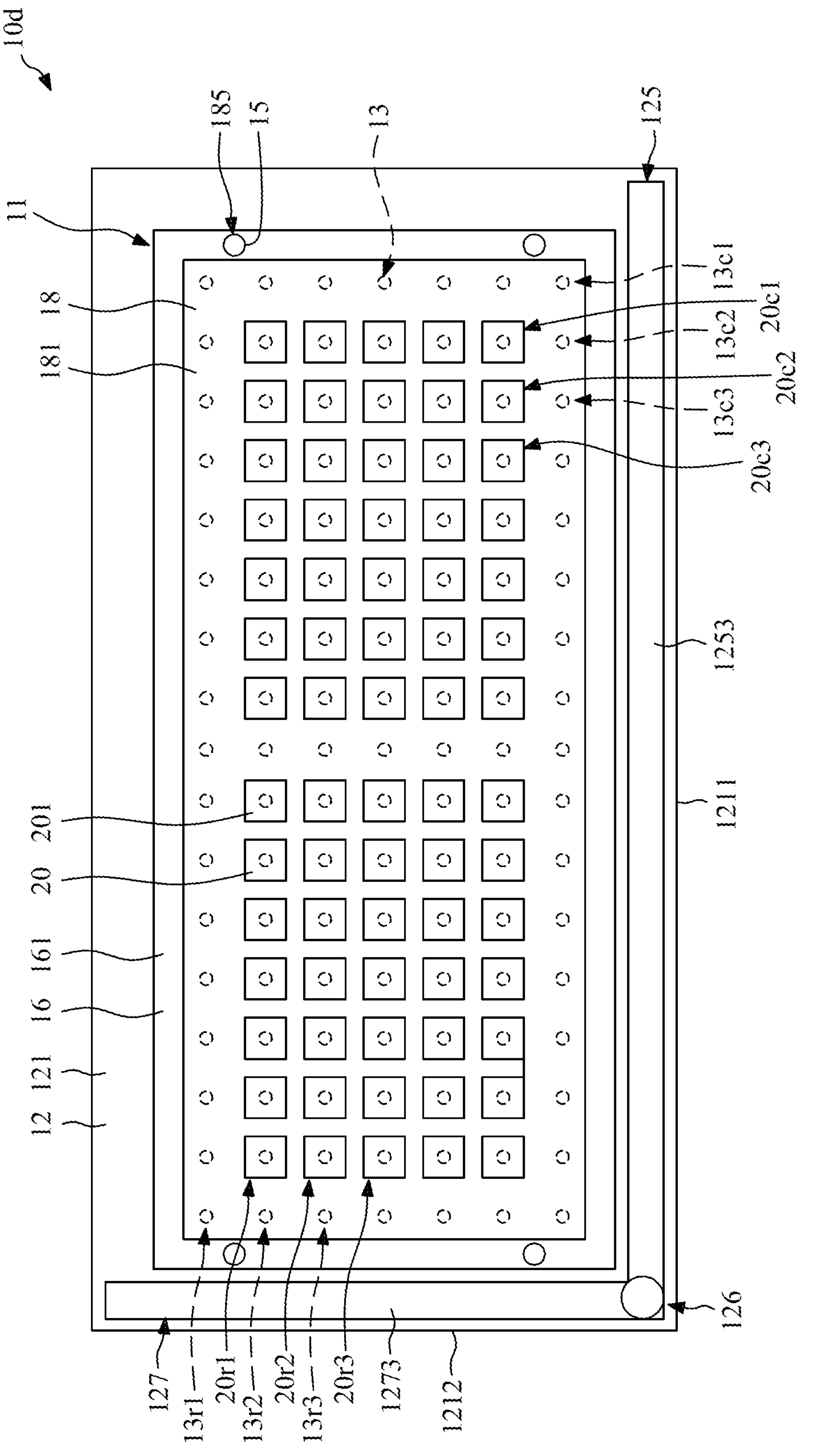
FIG. 11 illustrates a top view of a de-bonding apparatus according to some embodiments of the present disclosure.
Figure 12:
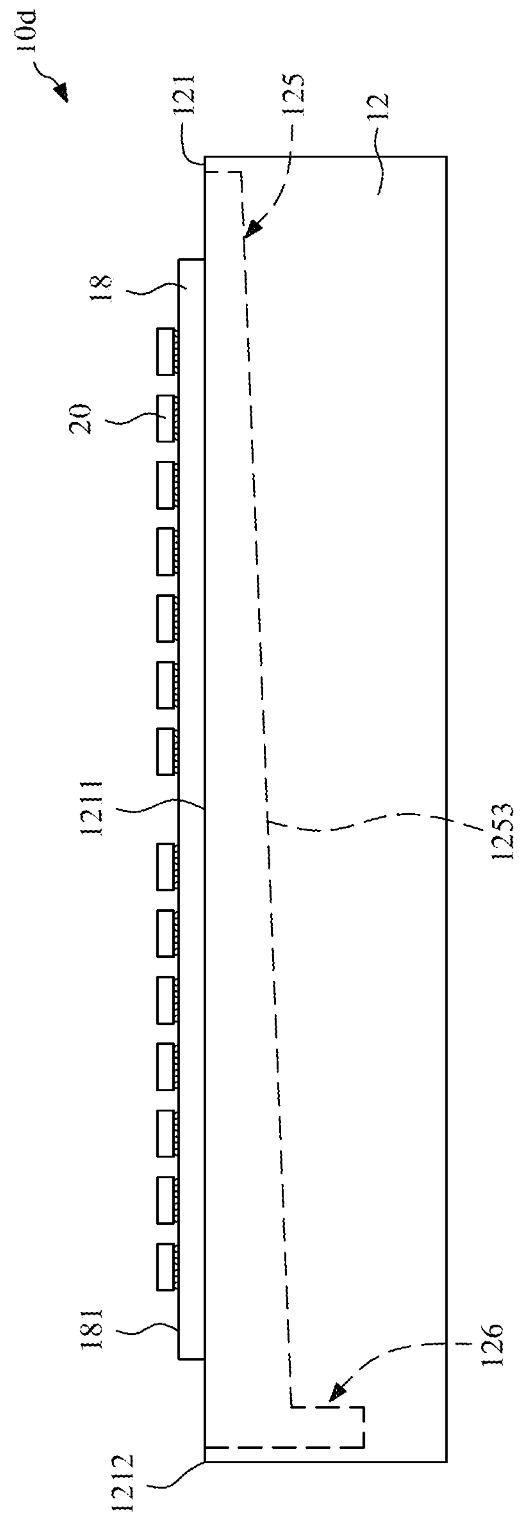
FIG. 12 illustrates a front view of the de-bonding apparatus of FIG. 11.
Figure 13:
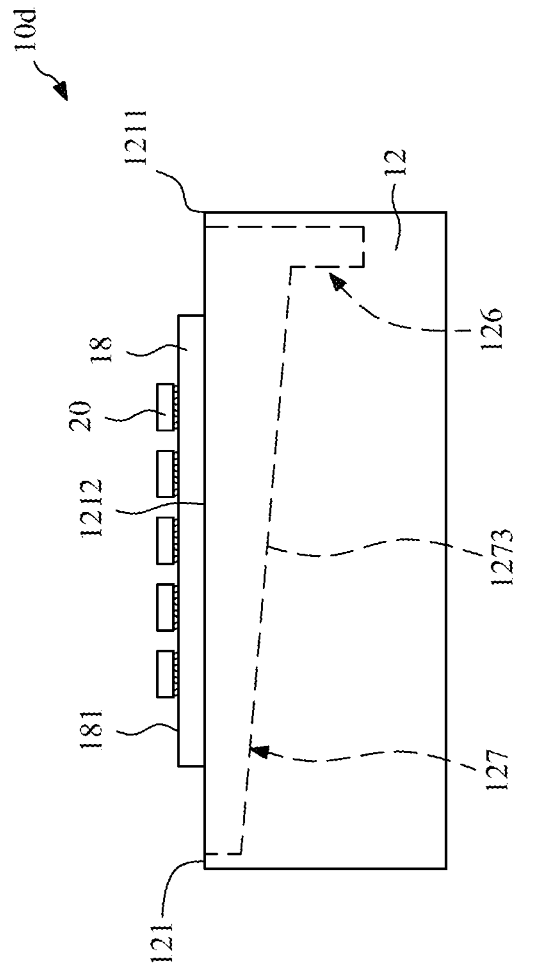
FIG. 13 illustrates a left view of the de-bonding apparatus of FIG. 11.

FIG. 11 illustrates a top view of a de-bonding apparatus 10d according to some embodiments of the present disclosure. FIG. 12 illustrates a front view of the de-bonding apparatus 10d of FIG. 11. FIG. 13 illustrates a left view of the de-bonding apparatus 10d of FIG. 11. The de-bonding apparatus 10d of FIG. 11 to FIG. 13 may be same as or similar to the de-bonding apparatus 10 of FIG. 3 and FIG. 4, and the differences are described as follows. The first groove 125 may be in fluid communication with the second groove 127 so as to intersect with each other to form a substantially L shape from the top view. The second drain hole 128 may be omitted. The first drain hole 126 may be in fluid communication with a bottommost portion of the first groove 125 and a bottommost portion of the second groove 127. Both of the slanted bottom surface 1253 of the first groove 125 and the slanted bottom surface 1273 of the second groove 127 may slant to and connect to the first drain hole 126. Thus, the liquid in the first groove 125 and the second groove 127 may be guided to flow to the first drain hole 126.

Figure 14:
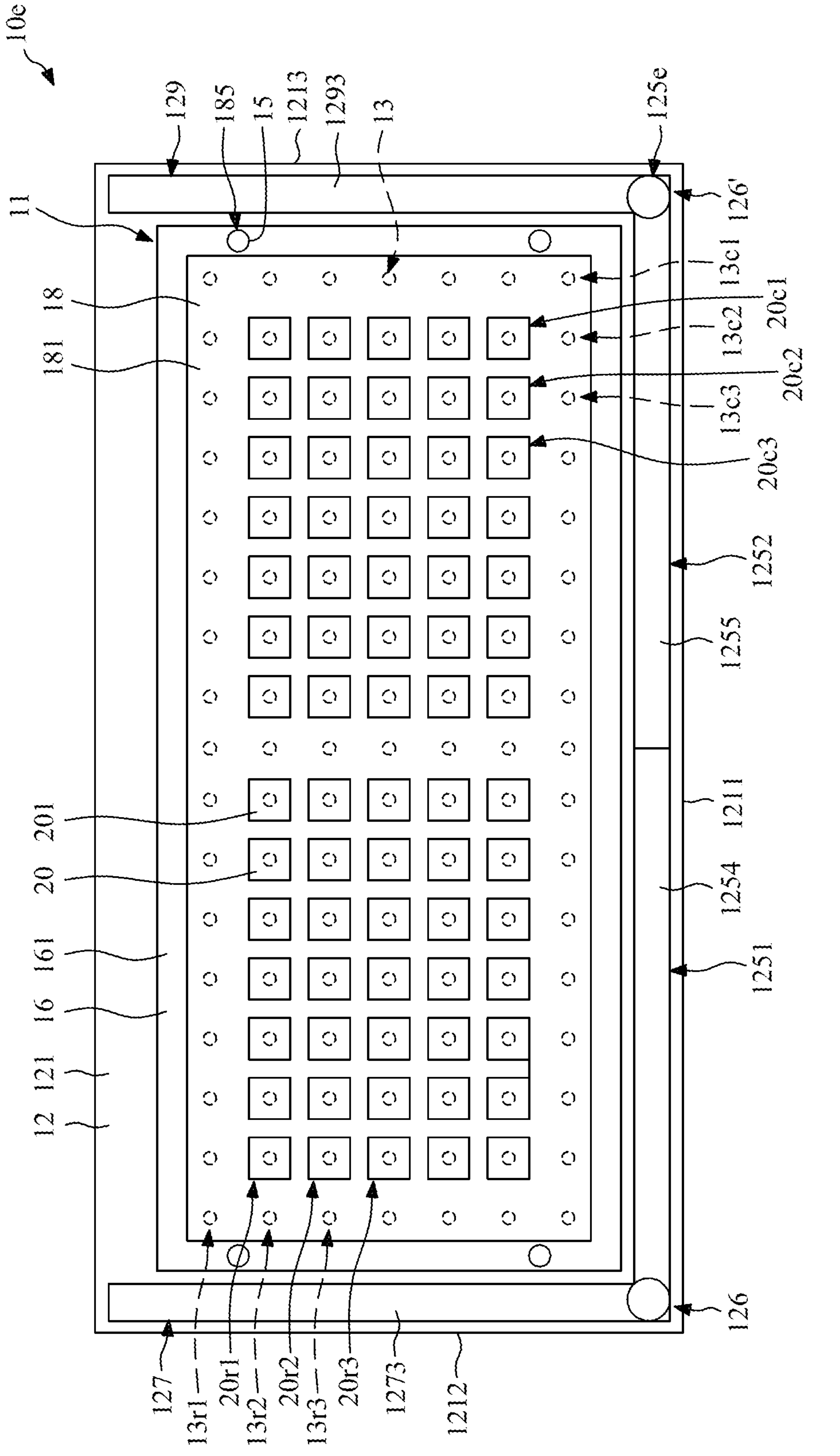
FIG. 14 illustrates a top view of a de-bonding apparatus according to some embodiments of the present disclosure.
Figure 15:
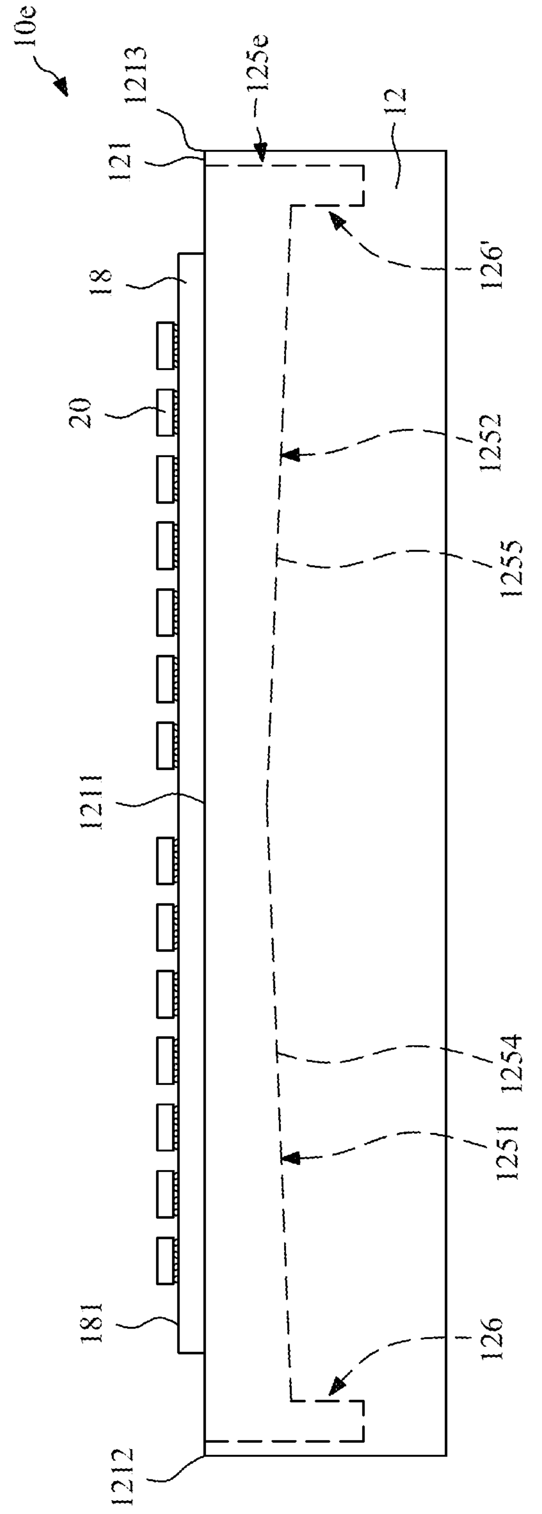
FIG. 15 illustrates a front view of the de-bonding apparatus of FIG. 14.
Figure 16:
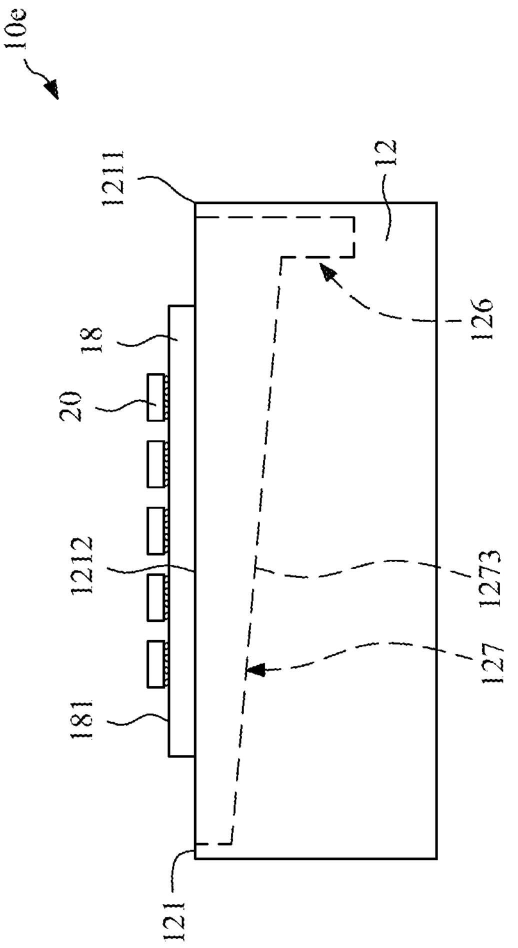
FIG. 16 illustrates a left view of the de-bonding apparatus of FIG. 14.
Figure 17:
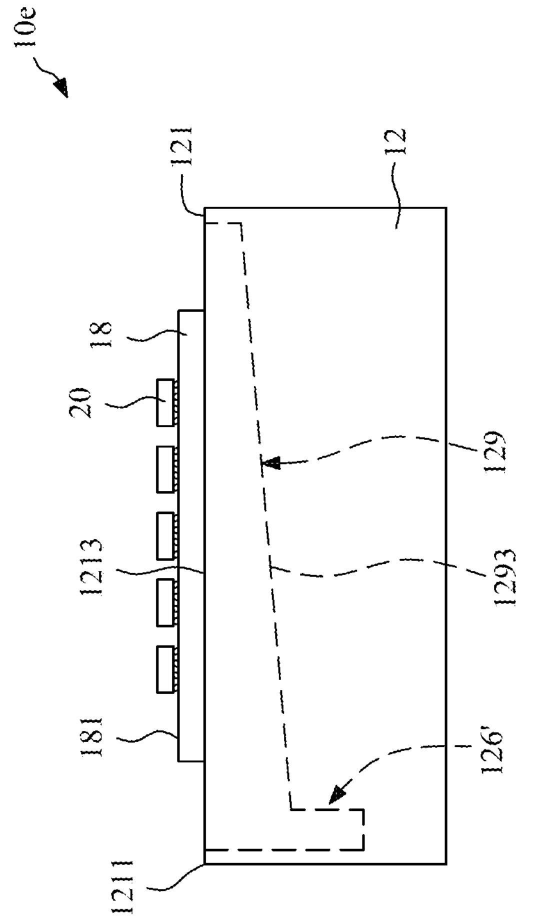
FIG. 17 illustrates a right view of the de-bonding apparatus of FIG. 14.

FIG. 14 illustrates a top view of a de-bonding apparatus 10*e* according to some embodiments of the present disclosure. FIG. 15 illustrates a front view of the de-bonding apparatus 10*e* of FIG. 14. FIG. 16 illustrates a left view of the de-bonding apparatus 10*e* of FIG. 14. FIG. 17 illustrates a right view of the de-bonding apparatus 10*e* of FIG. 14. The de-bonding apparatus 10*e* of FIG. 14 to FIG. 17 may be same as or similar to the de-bonding apparatus 10*d* of FIG. 11 to FIG. 13, and the differences are described as follows. The de-bonding apparatus 10*e* may further define a third groove 129 and a third drain hole 126'. The third groove 129 may be disposed adjacent to a short edge 1213 of the chuck 12, and may be opposite to the second groove 127. The third groove 129 may have a slanted bottom surface 1293. The third drain hole 126' may be in fluid communication with the third groove 129. In addition, the first groove 125*e* may include a first portion 1251 and a second portion 1252. The first portion 1251 of the first groove 125*e* may have a slanted bottom surface 1254, and the second portion 1252 of the first groove 125*e* may have a slanted bottom surface 1255.

The first groove 125*e* may be in fluid communication with the second groove 127 and the third groove 129 so as to form a substantially U shape from the top view. The first drain hole 126 may be in fluid communication with a bottommost portion of the first portion 1251 of the first groove 125*e* and a bottommost portion of the second groove 127. Both of the slanted bottom surface 1254 of the first portion 1251 of the first groove 125*e* and the slanted bottom surface 1273 of the second groove 127 may slant to and connect to the first drain hole 126. Thus, the liquid in the first portion 1251 of the first groove 125*e* and the second groove 127 may be guided to flow to the first drain hole 126. Similarly, the third drain hole 126' may be in fluid communication with a bottommost portion of the second portion 1252 of the first groove 125*e* and a bottommost portion of the third groove 129. Both of the slanted bottom surface 1255 of the second portion 1252 of the first groove 125*e* and the slanted bottom surface 1293 of the third groove 129 may slant to and connect to the third drain hole 126'. Thus, the liquid in the second portion 1252 of the first groove 125*e* and the third groove 129 may be guided to flow to the third drain hole 126'. As shown in FIG. 15, the intersection portion of the first portion 1251 and the second portion 1252 of the first groove 125*e* may be higher than the first drain hole 126 and the third drain hole 126'.

FIG. 18 through FIG. 39 illustrate a method for manufacturing a package structure according to some embodiments of the present disclosure. In some embodiments, the method is for manufacturing the package structure 7 shown in FIG. 39.

Figure 18:
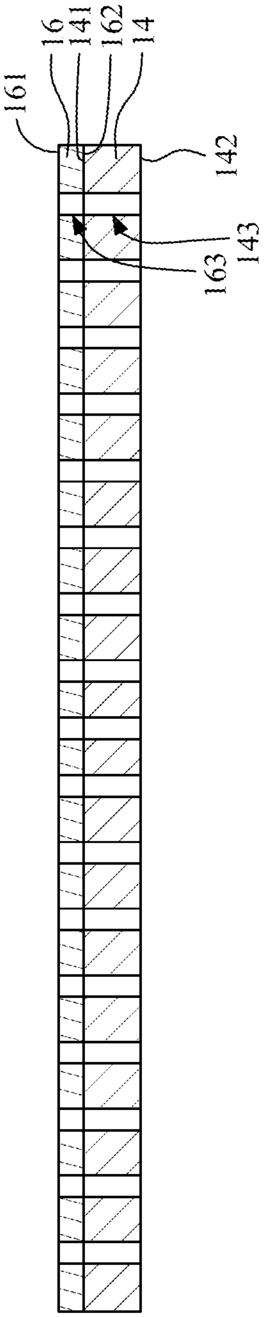
FIG. 18 illustrates one or more stages of an example of a method for manufacturing a package structure according to some embodiments of the present disclosure.
Figure 19:
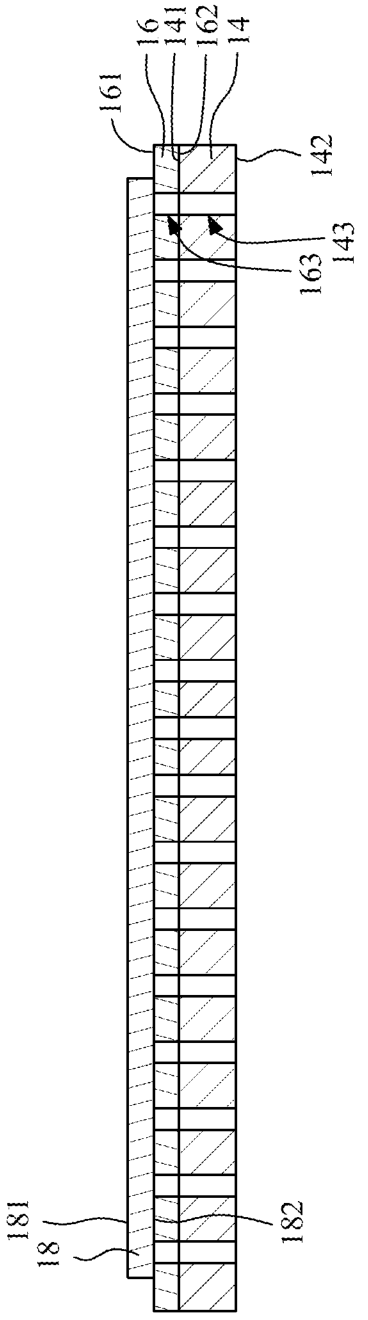
FIG. 19 illustrates one or more stages of an example of a method for manufacturing a package structure according to some embodiments of the present disclosure.
Figure 20:
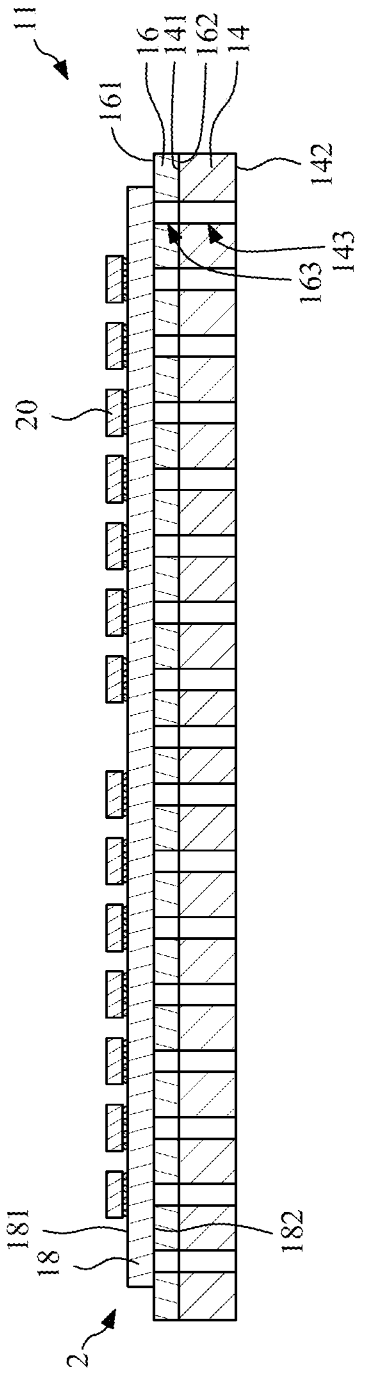
FIG. 20 illustrates one or more stages of an example of a method for manufacturing a package structure according to some embodiments of the present disclosure.

Referring to FIG. 18 through FIG. 20, an assembly structure 11 is provided. The assembly structure 11 may be manufactured as follows. Referring to FIG. 18, a tape 16 may be formed or disposed on a carrier board 14. The tape 16 and the carrier board 14 of FIG. 18 may be same as or similar to the tape 16 and the carrier board 14 of FIG. 1, respectively. The carrier board 14 may have a first surface (e.g., a top surface) 141 and a second surface (e.g., a bottom surface) 142 opposite to the first surface 141. The carrier board 14 may define a plurality of through holes 143 extending through the carrier board 14. A thickness of the carrier board 14 may be greater than a thickness of the tape 16. In addition, the tape 16 may include an adhesive material. Thus, the tape 16 may be adhered to or attached to the carrier board 14. The tape 16 may have a first surface (e.g., a top surface) 161 and a second surface (e.g., a bottom surface) 162 opposite to the first surface 161. The second surface 162 of the tape 16 may contact the first surface 141 of the carrier board 14. The tape 16 may define a plurality of through holes 163 extending through the tape 16. The through holes 163 of the tape 16 may be in communication with the through holes 143 of the carrier board 14. In some embodiments, the through holes 163 of the tape 16 may be aligned with the through holes 143 of the carrier board 14. In some embodiments, the through holes 163 of the tape 16 may be misaligned with the through holes 143 of the carrier board 14.

Referring to FIG. 19, a substrate structure 18 may be bonded to the first surface (e.g., a top surface) 161 of the tape 16. The substrate structure 18 of FIG. 19 may be same as or similar to the substrate structure 18 of FIG. 1. The substrate structure 18 may have a first surface (e.g., a top surface) 181 and a second surface (e.g., a bottom surface) 182 opposite to the first surface 181. The second surface (e.g., the bottom surface) 182 of the substrate structure 18 may contact and may be bonded to the first surface (e.g., the top surface) 161 of the tape 16. A width of the substrate structure 18 may be less than the width of the tape 16. The substrate structure 18 may include at least one circuit layer (not shown) therein.

Figure 22:
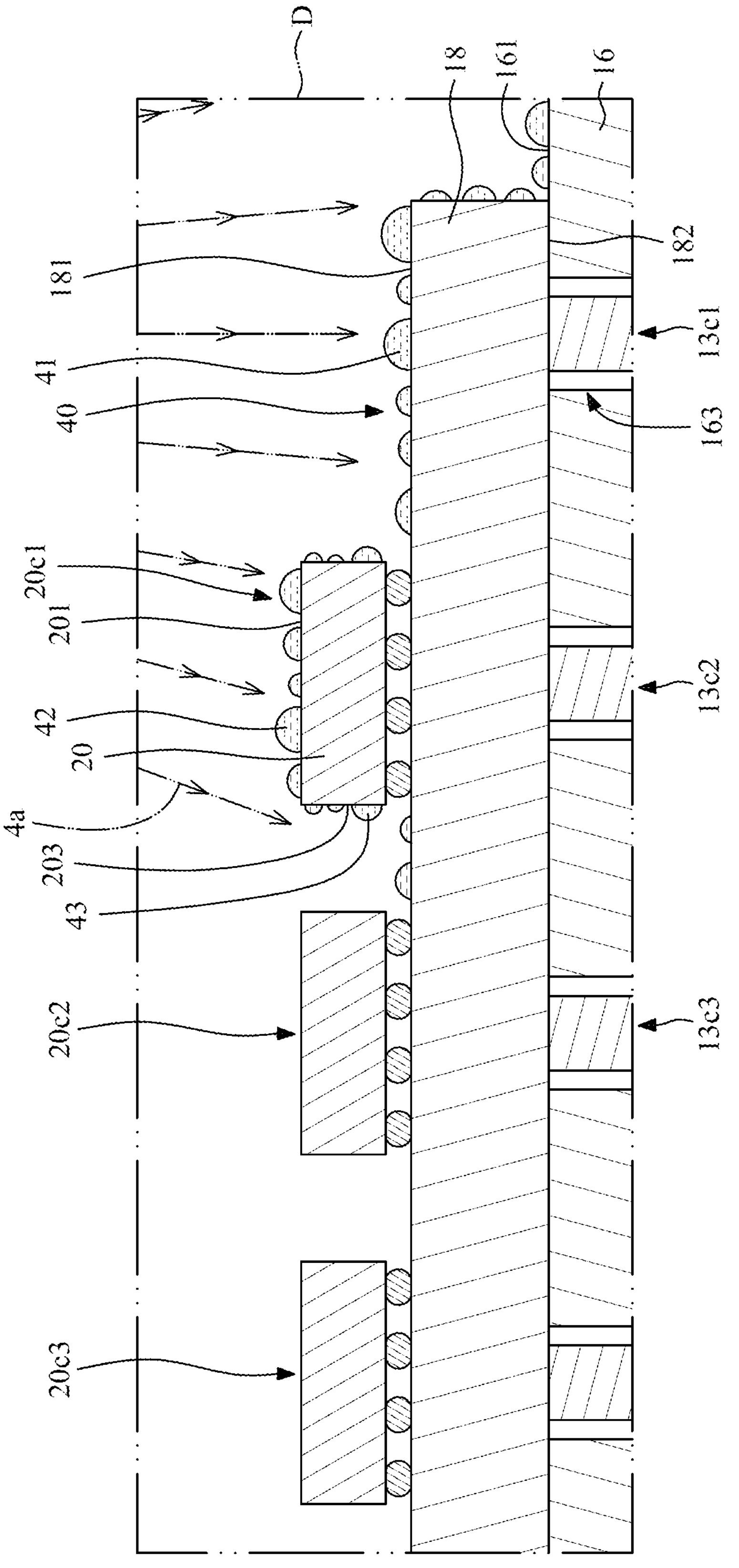
FIG. 22 illustrates one or more stages of an example of a method for manufacturing a package structure according to some embodiments of the present disclosure.

Referring to FIG. 20, a plurality of semiconductor dice 20 may be disposed or placed on the first surface (e.g., the top surface) 181 of the substrate structure 18. Each of the semiconductor dice 20 may have a first surface (e.g., a top surface or a backside surface) 201, a second surface (e.g., a bottom surface or an active surface) 202 and a lateral surface 203 (FIG. 22). The second surface 202 may be opposite to the first surface 201, and the lateral surface 203 may extend between the first surface 201 and the second surface 202. Each of the semiconductor dice 20 may include at least one bump 21 disposed on the second surface 202 and connected to the substrate structure 18. Then, a reflow process may be performed. Thus, the semiconductor dice 20 may be attached or mounted to the substrate structure 18 through flip-chip bonding. The second surface 202 of the semiconductor die 20 may be physically connected and electrically connected to the first surface 181 of the substrate structure 18 through the bumps 21. Meanwhile, the semiconductor dice 20 and the substrate structure 18 may form a combination structure 2. The combination structure 2 (including the semiconductor dice 20 and the substrate structure 18), the tape 16 and the carrier board 14 may form the assembly structure 11. Thus, the assembly structure 11 may include the combination structure 2 (including the dice 20 and the substrate structure 18), the tape 16 and the carrier board 14. The assembly structure 11 may be a workpiece.

Figure 21:
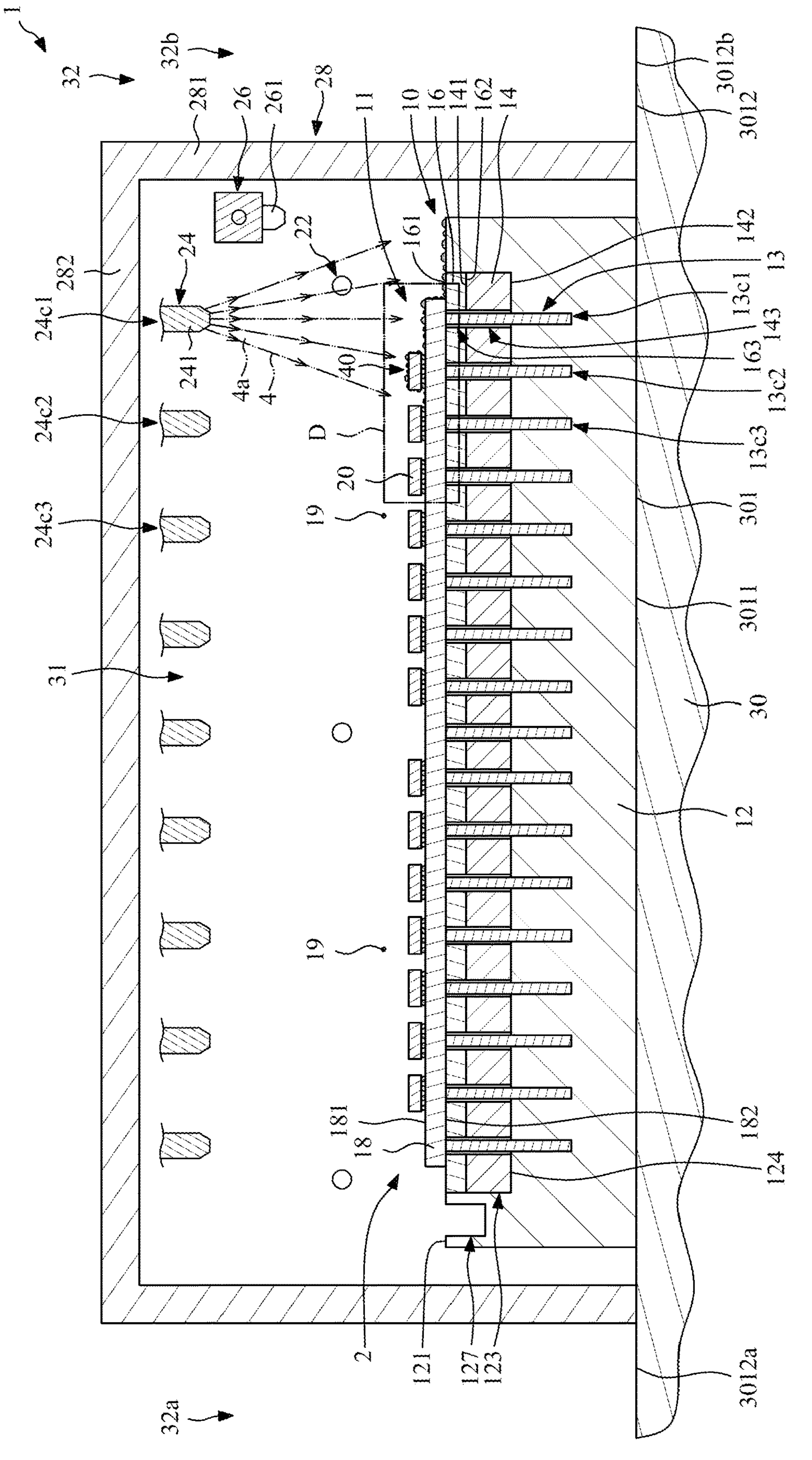
FIG. 21 illustrates one or more stages of an example of a method for manufacturing a package structure according to some embodiments of the present disclosure.

Referring to FIG. 21 and FIG. 22, wherein FIG. 22 illustrates a partially enlarged view of a region "D" in FIG. 21, an equipment 1 may be provided. The equipment 1 of FIG. 21 may be same as or similar to the equipment 1 of FIG. 1. Then, the assembly structure 11 may be placed or disposed in the accommodating cavity 123 of the chuck 12 of the de-bonding apparatus 10 in the first space 31 (e.g., an enclosed space) formed by the housing 28 in the second space 32 (e.g., an indoor environment of a clean room).

Then, a plurality of polar materials 4 may be dispensed or sprayed toward the first surface 181 of the substrate structure 18 to neutralize a plurality of electricity charges adjacent to the first surface 181 of the substrate structure 18. The plurality of polar materials 4 may be a plurality of ion carriers 4 and may be a fluid 4 (e.g., a first fluid 4*a*). The polar materials 4 (e.g., the ion carriers 4, the fluid 4 and the first fluid 4*a*) may be provided onto the substrate structure 18. A portion of the polar materials 4 (e.g., the ion carriers 4, the fluid 4 and the first fluid 4*a*) may be provided onto the die 20. The polar materials 4 (e.g., the ion carriers 4, the fluid 4 and the first fluid 4*a*) may be applied on a receiving side (e.g., a top side) of the combination structure 2 through the nozzles 241 of the fluid supply device 24. In some embodiments, the fluid 4 may include an ion flow that contains the ion carriers. In some embodiments, the fluid 4 may include a liquid (e.g., water or alcohol) that is a polar material and may contain the ion carriers. In some embodiments, the fluid 4 may include a moisture that is a polar material and may contain the ion carriers. As shown in FIG. 21 and FIG. 22, the fluid 4 may be a polar material such as water. In addition, the receiving side (e.g., the top side) of the combination structure 2 may be adjacent to the first surface 181 of the substrate structure 18. For example, the receiving side (e.g., the top side) of the combination structure 2 may include the receiving surface (e.g., the first surface 181 of the substrate structure 18 and the first surfaces 201 of the semiconductor dice 20) of the combination structure 2.

In some embodiments, the first fluid 4*a* may be applied on the receiving side (e.g., the top side) of the combination structure 2 through the first column 24*c*1 of nozzles 241, and the other nozzles 241 of the fluid supply device 24 may be still closed. Then, in the following step, a second fluid 4*b* (FIG. 25) may be applied on the receiving side (e.g., the top side) of the combination structure 2 through the second column 24*c*2 of nozzles 241. Thus, the fluid 4 may be gradually or sequentially applied on the receiving side (e.g., the top side) of the combination structure 2. However, in some embodiments, all of the nozzles 241 of the fluid supply device 24 may be opened simultaneously, thus, the fluid 4 may be applied on the receiving side (e.g., the top side) of the combination structure 2 concurrently.

Referring to FIG. 22, after the polar materials 4 (e.g., the ion carriers 4, the fluid 4 and the first fluid 4*a*) is sprayed or dispensed by the nozzles 241 of the fluid supply device 24, a plurality of droplets 40 (e.g., water droplets) or particles may be formed on the receiving surface (e.g., the first surface 181 of the substrate structure 18 and the first surfaces 201 of the semiconductor dice 20) of the combination structure 2. The droplets 40 (e.g., water droplets) may be spaced apart from each other, and each of the droplets 40 (e.g., water droplets) may include a group of ion carriers. Thus, the first surface 181 of the substrate structure 18 may be partially covered by the polar materials 4 (e.g., the ion carriers 4, the fluid 4 and the first fluid 4*a*). Thus, a plurality of groups of the ion carriers are applied on the receiving surface (e.g., the first surface 181 of the substrate structure 18 and the first surfaces 201 of the semiconductor dice 20) of the combination structure 2. Each of the groups contains a portion of the ion carriers, and the groups of the ion carriers are spaced apart from each other.

In some embodiments, the droplets 40 (e.g., water droplets) may include a plurality of first droplets 41 (e.g., first water droplets), a plurality of second droplets 42 (e.g., second water droplets) and a plurality of third droplets 43 (e.g., third water droplets). Some of the polar materials 4 (e.g., the ion carriers 4, the fluid 4 and the first fluid 4*a*) may be aggregated to form the first droplets 41 (e.g., first water droplets) on the first surface 181 of the substrate structure 18. The first droplets 41 may be formed in time sequence or in spatial sequence. Some of the polar materials 4 (e.g., the ion carriers 4, the fluid 4 and the first fluid 4*a*) may be aggregated to form the second droplets 42 (e.g., second water droplets) on the first surfaces 201 of the semiconductor dice 20. Some of the polar materials 4 (e.g., the ion carriers 4, the fluid 4 and the first fluid 4*a*) may be aggregated to form the third droplets 43 (e.g., third water droplets) on the lateral surfaces 203 of the semiconductor dice 20. Thus, the polar materials 4 (e.g., the ion carriers 4, the fluid 4 and the first fluid 4*a*) may partially cover the first surface 181 of the substrate structure 18, the top surface 201 of the die 20 and the lateral surface 203 of the die 20 after dispensing. The mean particle size (or average particle size) of the first droplets 41 (e.g., first water droplets), the second droplets 42 (e.g., second water droplets) and the third droplets 43 (e.g., third water droplets) may be equal to or different from each other. The distribution density of the first droplets 41 (e.g., first water droplets), the second droplets 42 (e.g., second water droplets) and the third droplets 43 (e.g., third water droplets) may be equal to or different from each other.

Figure 23:
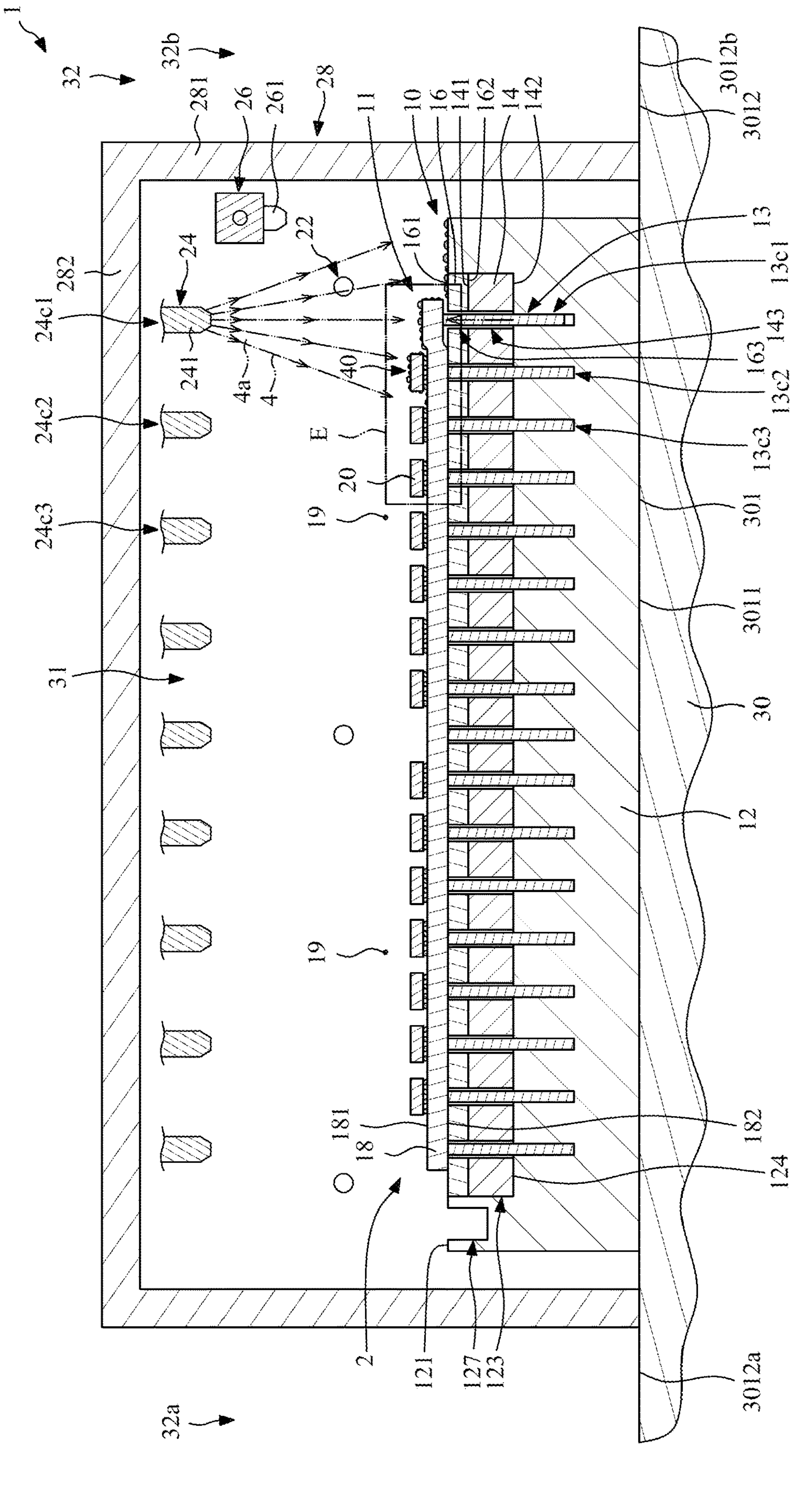
FIG. 23 illustrates one or more stages of an example of a method for manufacturing a package structure according to some embodiments of the present disclosure.
Figure 24:
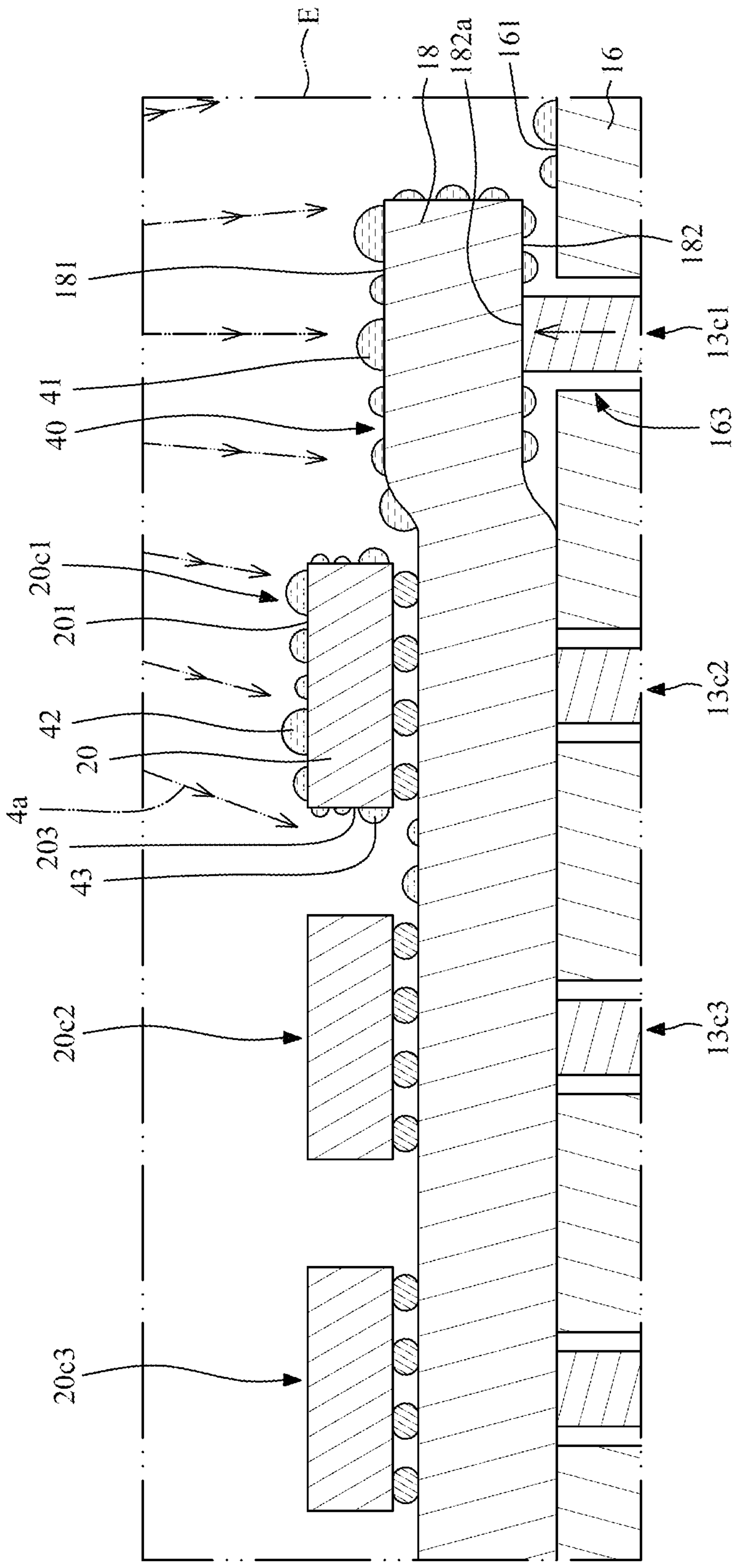
FIG. 24 illustrates one or more stages of an example of a method for manufacturing a package structure according to some embodiments of the present disclosure.

Referring to FIG. 23 and FIG. 24, wherein FIG. 24 illustrates a partially enlarged view of a region "E" in FIG. 23, at least a portion of the substrate structure 18 may be de-bonded from the tape 16. For example, the second surface 182 of the substrate structure 18 may be de-bonded from the tape 16. In some embodiments, the substrate structure 18 may be de-bonded from the tape 16 later than the ion carriers 4 are provided onto the substrate structure 18. For example, the first column 13*c*1 of ejection pins 13 may move upward. Thus, a first portion 182*a* of the second surface (e.g., the bottom surface) 182 of the substrate structure 18 may be pushed upward by the first column 13*c*1 of ejection pins 13 so as to be de-bonded or separated from the first surface (e.g., the top surface) 161 of the tape 16. Thus, the second surface (e.g., the bottom surface) 182 of the substrate structure 18 or the first surface (e.g., the top surface) 161 of the tape 16 may be defined as a separation surface. Meanwhile, during the de-bonding process, a plurality of undesired electricity charges (e.g., static electricity charges) may be generated at the second surface (e.g., the bottom surface) 182 of the substrate structure 18, and a plurality of induced electricity charges (e.g., static electricity charges) may be also generated adjacent to the first surface (e.g., the top surface) 181 of the substrate structure 18. In some embodiments, the polar materials 4 (e.g., the ion carriers 4 and the fluid 4) may be applied onto the second surface 182 of the substrate structure 18 that generates the induced electricity charges (e.g., static electricity charges) rather than onto the first surface 181 of the substrate structure 18 that directly generates the electricity charges (e.g., static electricity charges).

In some embodiments, the step of de-bonding the second surface 182 of the substrate structure 18 from the tape 16 may include de-bonding the first portion 182*a* later than dispensing the polar materials 4 (e.g., the ion carriers 4, the fluid 4 and the first fluid 4*a*) toward the first portion 182*a*.

In the present disclosure, the polar materials 4 (e.g., the ion carriers 4, the fluid 4 and the first fluid 4*a*) applied on the receiving side of the combination structure 2 (including the receiving surface (e.g., the first surface 181 of the substrate structure 18 and the first surfaces 201 of the semiconductor dice 20) of the combination structure 2 may neutralize the electricity charges (e.g., static electricity charges) so as to eliminate or reduce the static electricity generated during the de-bonding process. In some embodiments, a plurality of ions in the polar materials 4 (e.g., the ion carriers 4, the fluid 4 and the first fluid 4*a*) may be configured to reduce static electricity generated during the de-bonding process. In some embodiments, the electricity charges adjacent to the first surface 181 of the substrate structure 18 may be neutralized earlier than the second surface 182 of the substrate structure 18 is de-bonded from the tape 16. Thus, the semiconductor dice 20 may be protected from being damaged by the static electricity. In some embodiments, the fluid 4 may include an ion flow that contains the ion carriers. In some embodiments, the fluid 4 may include a liquid (e.g., water or alcohol) that is a polar material and may contain the ion carriers. In some embodiments, the fluid 4 may include a moisture that is a polar material and may contain the ion carriers. In some embodiments, during the de-bonding process, the fluid 4 (e.g., the first fluid 4*a*) may be continuously applied. In some embodiments, the polar materials 4 may be dispensed onto the second surface 182 of the substrate structure 18, as shown in FIG. 24.

Figure 25:
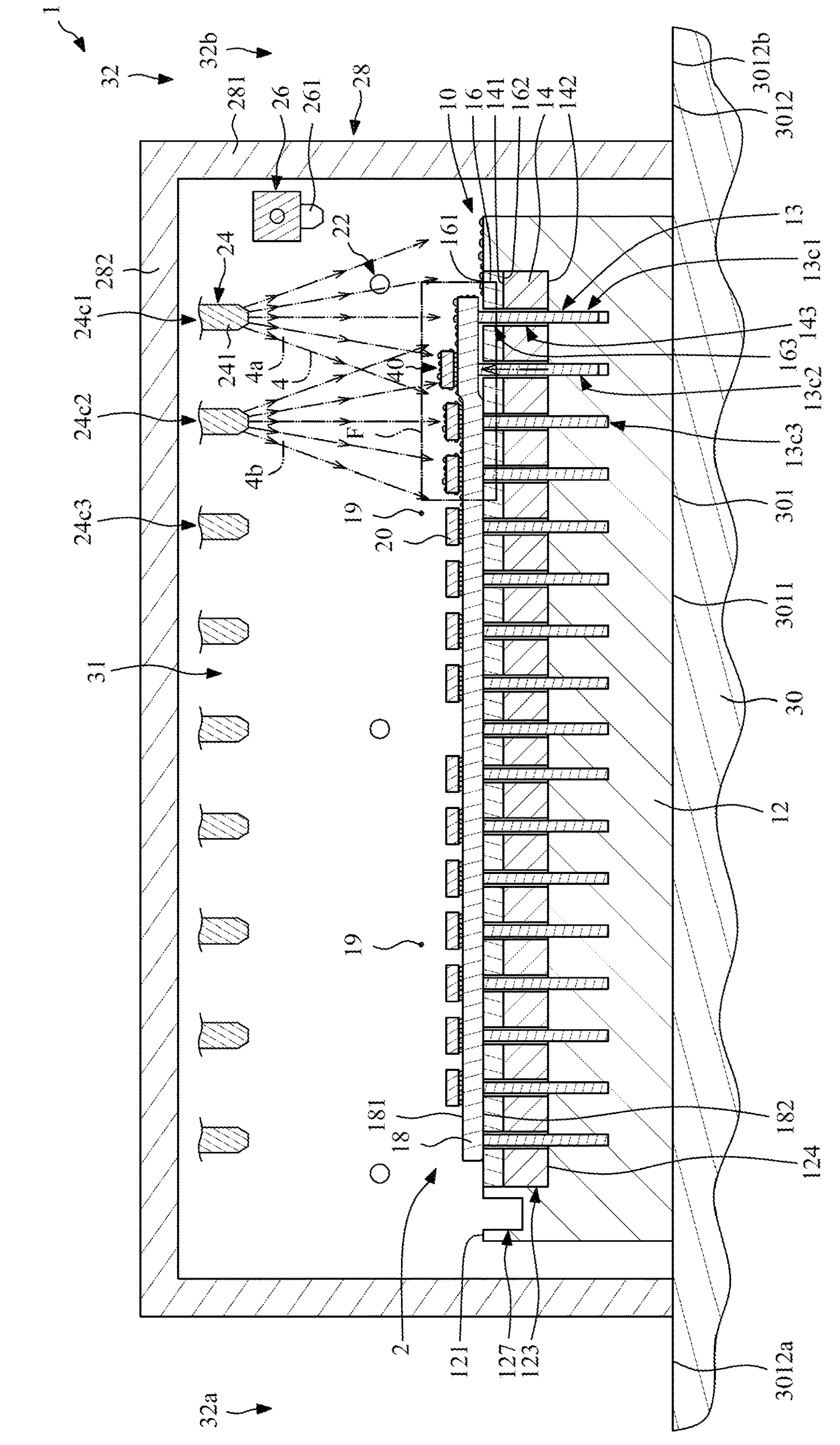
FIG. 25 illustrates one or more stages of an example of a method for manufacturing a package structure according to some embodiments of the present disclosure.
Figure 26:
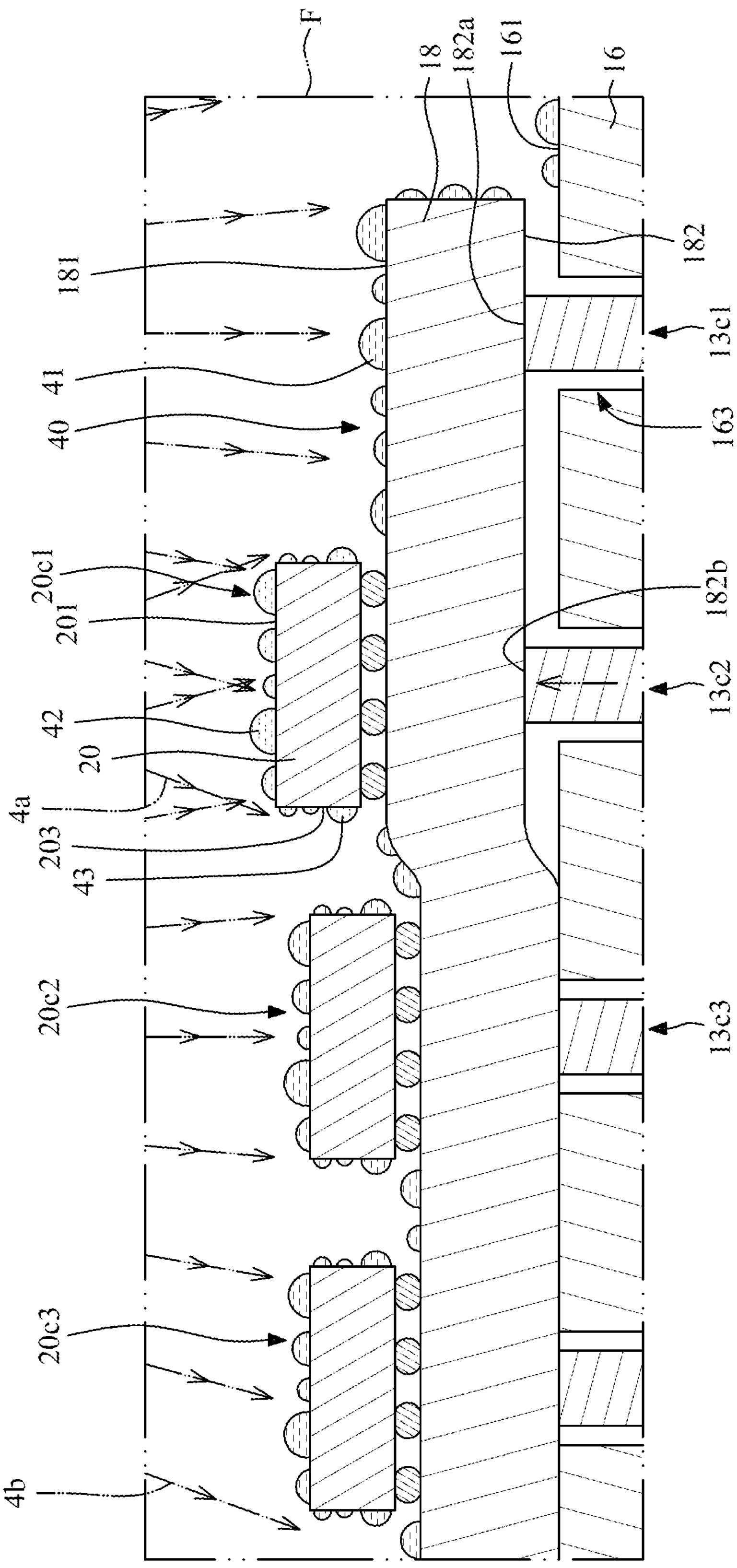
FIG. 26 illustrates one or more stages of an example of a method for manufacturing a package structure according to some embodiments of the present disclosure.

Referring to FIG. 25 and FIG. 26, wherein FIG. 26 illustrates a partially enlarged view of a region "F" in FIG. 25, a second fluid 4*b* may be applied on the receiving side (e.g., a top side) of the combination structure 2 through the second column 24*c*2 of nozzles 241. In some embodiments, the second fluid 4*b* may be same as the first fluid 4*a*. Then, the first column 13*c*1 of ejection pins 13 may stop moving, and the second column 13*c*2 of ejection pins 13 may move upward. Thus, a second portion 182*b* of the second surface (e.g., the bottom surface) 182 of the substrate structure 18 may be pushed upward by the second column 13*c*2 of ejection pins 13 so as to be de-bonded or separated from the first surface (e.g., the top surface) 161 of the tape 16. Meanwhile, during the de-bonding process, an undesired static electricity may be generated at the second surface (e.g., the bottom surface) 182 of the substrate structure 18, and a plurality of static electricity charges may be also generated adjacent to the first surface (e.g., the top surface) 181 of the substrate structure 18. Such static electricity charges adjacent to the first surface 181 of the substrate structure 18 may be neutralized by the fluid 4 including, for example, the first fluid 4*a* and the second fluid 4*b*. Therefore, the static electricity generated during the de-bonding process may be eliminated or reduced. In some embodiments, the polar materials 4 (e.g., the ion carriers 4, the fluid 4 and the first fluid 4*a*) may be dispensed toward the first portion 182*a* of the substrate structure 18 earlier than toward the second portion 182*b* of the substrate structure 18. The first portion 182*a* of the substrate structure 18 is closer to a periphery of the substrate structure 18, and the second portion 182*b* of the substrate structure 18 is closer to a center of the substrate structure 18.

As shown in FIG. 25 and FIG. 26, during the de-bonding process, the fluid 4 (e.g., the first fluid 4*a* and the second fluid 4*b*) may remain on the receiving side of the combination structure 2 (including the receiving surface (e.g., the first surface 181 of the substrate structure 18 and the first surfaces 201 of the semiconductor dice 20) of the combination structure 2). That is, the fluid 4 (e.g., the first fluid 4*a* and the second fluid 4*b*) may be removed after the de-bonding process is completed. In some embodiments, during the de-bonding process, the fluid 4 (e.g., the first fluid 4*a* and the second fluid 4*b*) may be continuously applied.

Figure 27:
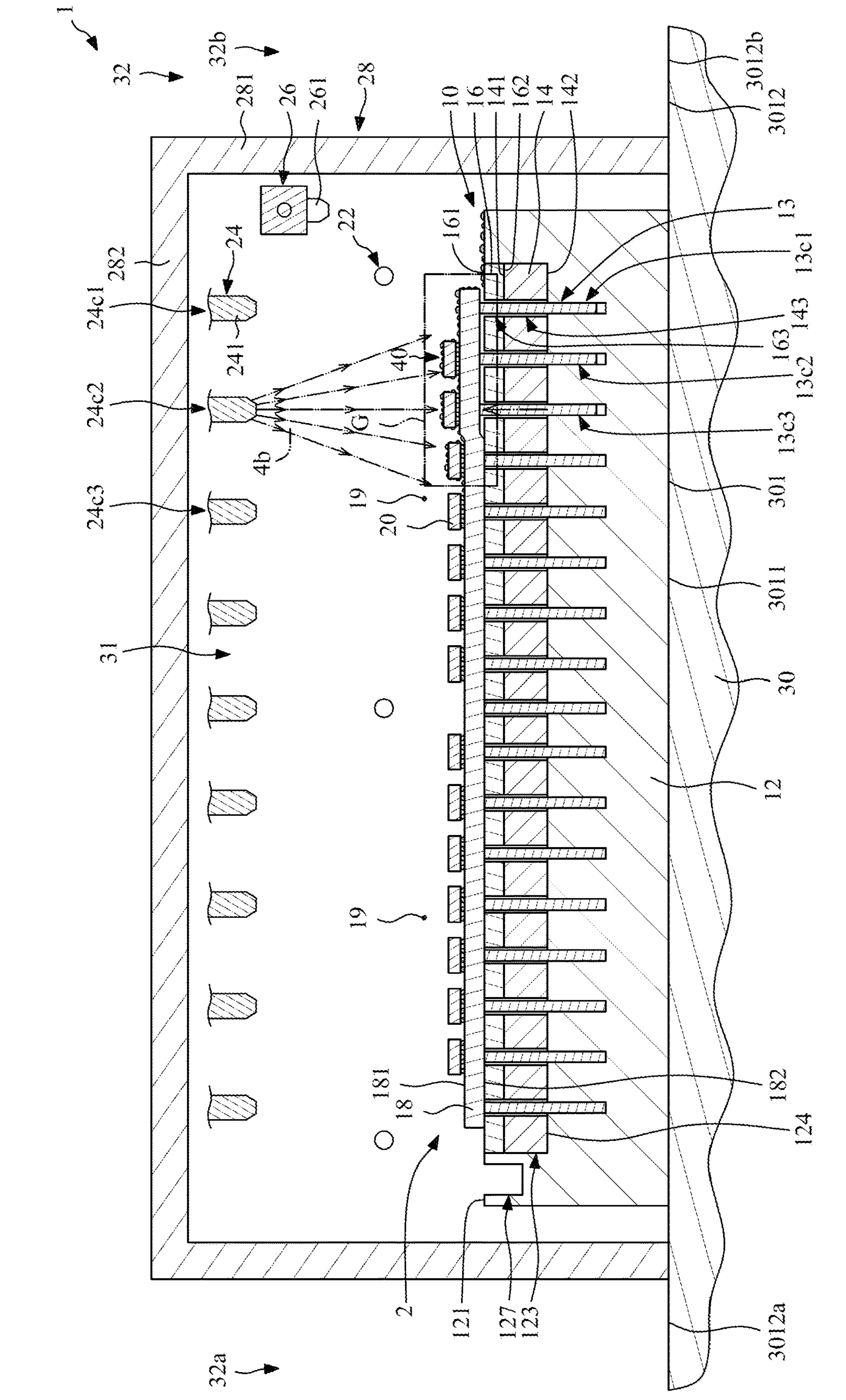
FIG. 27 illustrates one or more stages of an example of a method for manufacturing a package structure according to some embodiments of the present disclosure.
Figure 28:
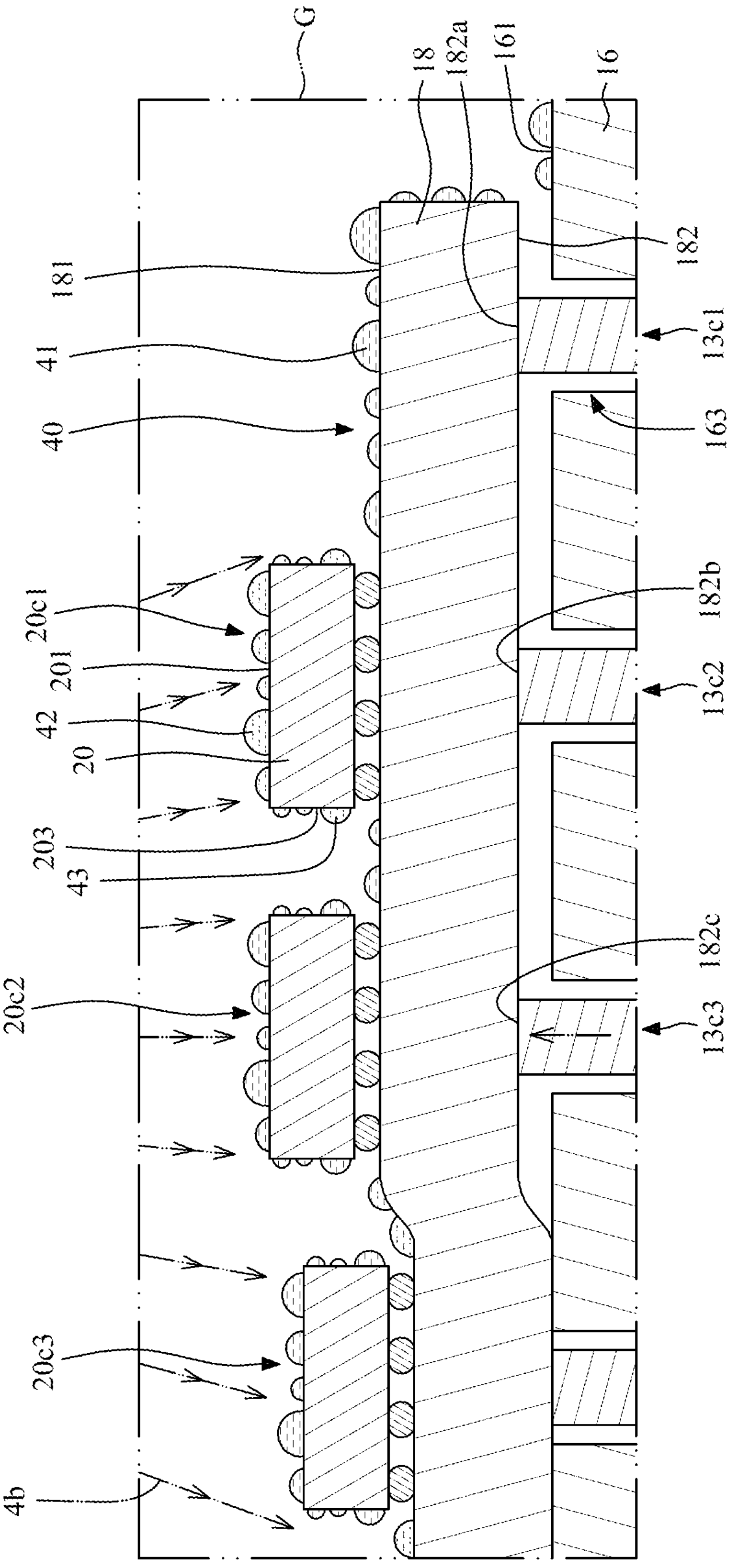
FIG. 28 illustrates one or more stages of an example of a method for manufacturing a package structure according to some embodiments of the present disclosure.

Referring to FIG. 27 and FIG. 28, wherein FIG. 28 illustrates a partially enlarged view of a region "G" in FIG. 27, the first column 24*c*1 of nozzles 241 may be closed to stop applying the first fluid 4*a*. The second column 13*c*2 of ejection pins 13 may stop moving, and the third column 13*c*3 of ejection pins 13 may move upward. Thus, a third portion 182*c* of the second surface (e.g., the bottom surface) 182 of the substrate structure 18 may be pushed upward by the third column 13*c*3 of ejection pins 13 so as to be de-bonded or separated from the first surface (e.g., the top surface) 161 of the tape 16. Meanwhile, during the de-bonding process, an undesired static electricity may be generated at the second surface (e.g., the bottom surface) 182 of the substrate structure 18, and a plurality of static electricity charges may be generated adjacent to the first surface (e.g., the top surface) 181 of the substrate structure 18. Such static electricity charges adjacent to the first surface 181 of the substrate structure 18 may be neutralized by the fluid 4 including, for example, the second fluid 4*b*. Therefore, the static electricity generated during the de-bonding process may be eliminated or reduced.

As shown in FIG. 27 and FIG. 28, during the de-bonding process, the fluid 4 (e.g., the second fluid 4*b*) may remain on the receiving side of the combination structure 2 (including the receiving surface (e.g., the first surface 181 of the substrate structure 18 and the first surfaces 201 of the semiconductor dice 20) of the combination structure 2). In some embodiments, during the de-bonding process, the fluid 4 (e.g., the second fluid 4*b*) may be continuously applied. In some embodiments, the fluid 4 may be applied on the first surface 181 of the substrate structure 18 according to portions of the substrate structure 18 that are de-bonded form the tape 16. For example, when the third portion 182*c* of the second surface (e.g., the bottom surface) 182 of the substrate structure 18 is de-bonded form the tape 16, the first column 24*c*1 of nozzles 241 may be closed to stop applying the first fluid 4*a*, and the second column 24*c*2 of nozzles 241 may be opened to apply the second fluid 4*b*.

Figure 29:
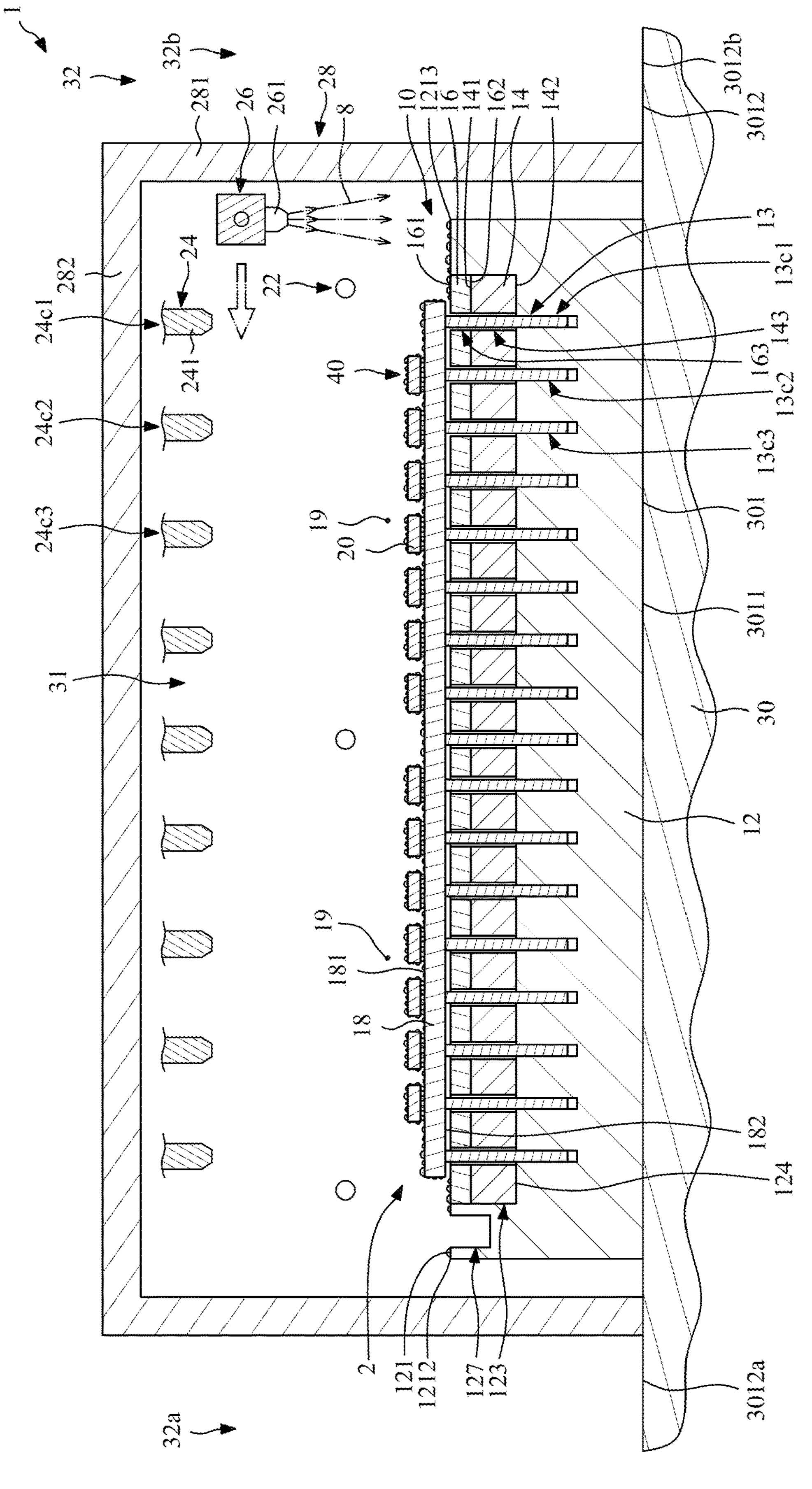
FIG. 29 illustrates one or more stages of an example of a method for manufacturing a package structure according to some embodiments of the present disclosure.

Referring to FIG. 29, the steps similar to the stages illustrated in FIG. 23 to FIG. 28 are repeated, so that the whole combination structure 2 (including the semiconductor dice 20 and the substrate structure 18) is completely de-bonded or separated from the tape 16. Thus, the whole substrate structure 18 may be gradually or sequentially de-bonded or separated from the tape 16. The fluid 4 may be gradually or sequentially applied on the receiving side of the combination structure 2 (including the receiving surface (e.g., the first surface 181 of the substrate structure 18 and the first surfaces 201 of the semiconductor dice 20) of the combination structure 2). Meanwhile, the combination structure 2 is supported by the ejection pins 13. In some embodiments, the combination structure 2 may be positioned by position pins.

Then, the nozzles 261 of the air supply device 26 may be opened so as to provide a downward air flow 8 such as an air knife. In some embodiments, air flow 8 may include ions to neutralize the electricity charges adjacent to the first surface 181 of the substrate 18. That is, the air supply device 26 may include an ionizer. In addition, the air supply device 26 may move from a position corresponding to the short edge 1213 of the chuck 12 to a position corresponding to the short edge 1212 of the chuck 12 so as to blow the fluid 4 (including, for example, the droplets 40) to a region (e.g., the second groove 127) outside the substrate structure 18. Thus, the polar materials 4 (e.g., the ion carriers 4, the fluid 4, the droplets 40) may be removed from the first surface (e.g., the top surface) 181 of the substrate structure 18. For example, the first droplets 41 (e.g., first water droplets) may be removed from the first surface 181 of the substrate structure 18.

Figure 30:
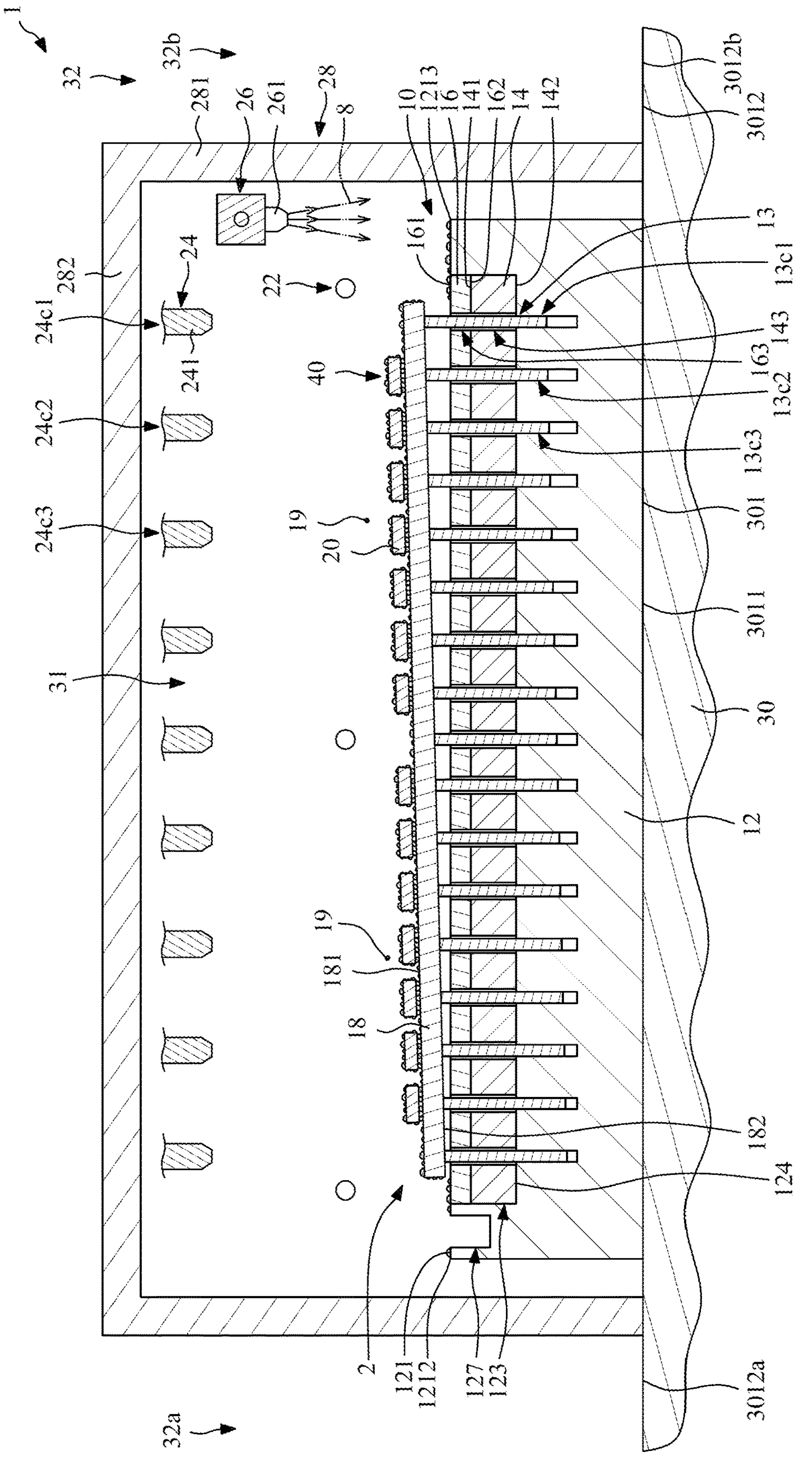
FIG. 30 illustrates one or more stages of an example of a method for manufacturing a package structure according to some embodiments of the present disclosure.

Referring to FIG. 30, in some embodiments, before the air supply device 26 moves, one end (e.g., the right end) of the combination structure 2 (including the semiconductor dice 20 and the substrate structure 18) may be lifted up by the ejection pins 13. Thus, the second surface (e.g., the bottom surface) 182 of the substrate structure 18 may be nonparallel with the first surface (e.g., the top surface) 161 of the tape 16. Alternatively, the substrate structure 18 may be nonparallel with the moving direction of the air supply device 26. An angle between the second surface (e.g., the bottom surface) 182 of the substrate structure 18 and the first surface (e.g., the top surface) 161 of the tape 16 may be greater than 0 degree and less than 45 degrees. Then, the nozzles 261 of the air supply device 26 may be opened so as to provide the downward air flow 8. Since the combination structure 2 (including the semiconductor dice 20 and the substrate structure 18) is inclined, the air pressure of the air flow 8 in FIG. 30 may be less than the air pressure of the air flow 8 in FIG. 29.

Figure 31:
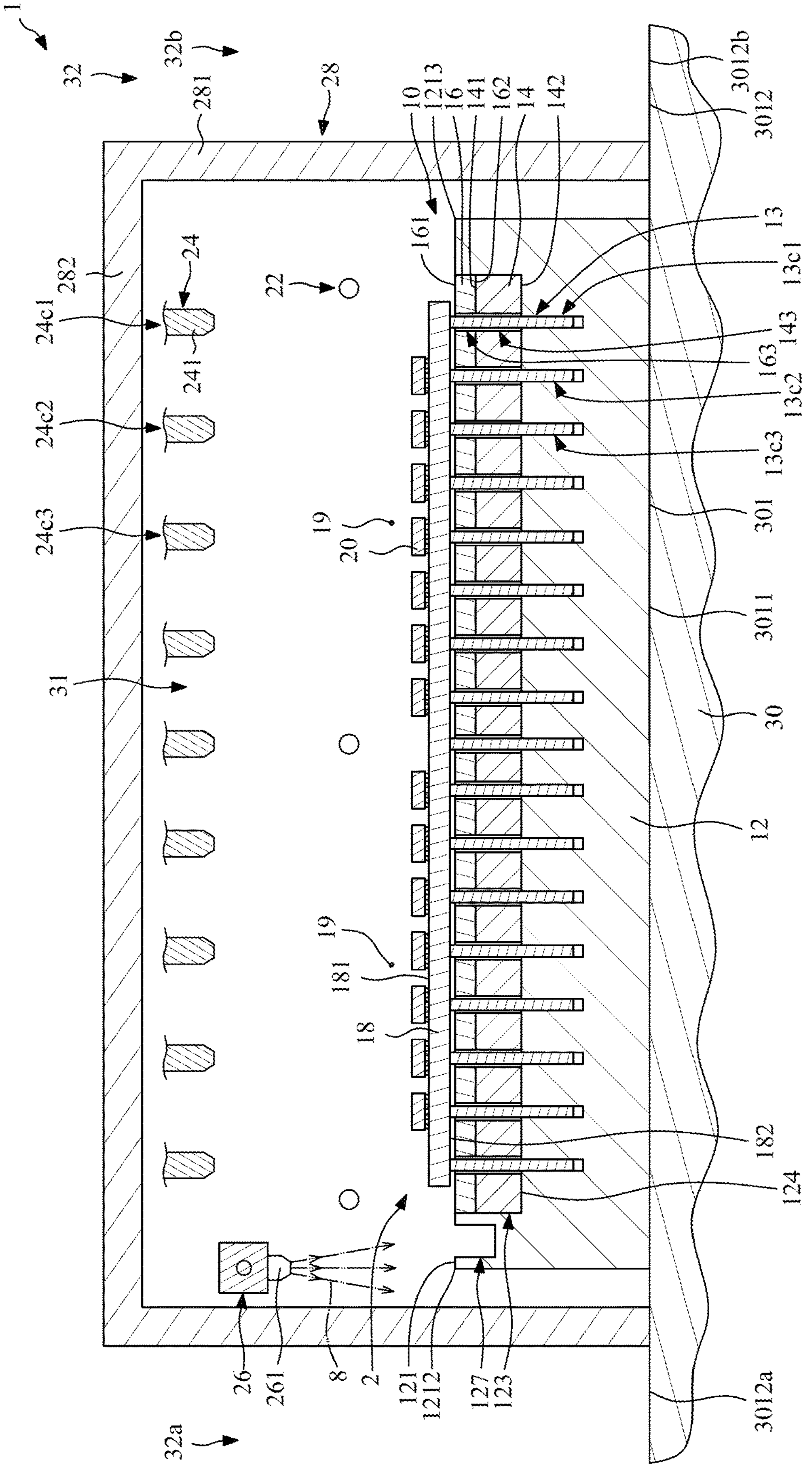
FIG. 31 illustrates one or more stages of an example of a method for manufacturing a package structure according to some embodiments of the present disclosure.

Referring to FIG. 31, when the air supply device 26 moves to the position corresponding to the short edge 1212 of the chuck 12, the fluid 4 (including, for example, the droplets 40) on the combination structure 2 (including the semiconductor dice 20 and the substrate structure 18) may be removed. Then, a humid air of the first space 31 may be vented out to the outer space (e.g., the second space 32) through the air hole 22. A dry air or hot air of the outer space (e.g., the second space 32) may be introduced into the first space 31 through the air hole 22 so as to dry the combination structure 2 (including the semiconductor dice 20 and the substrate structure 18).

Figure 32:
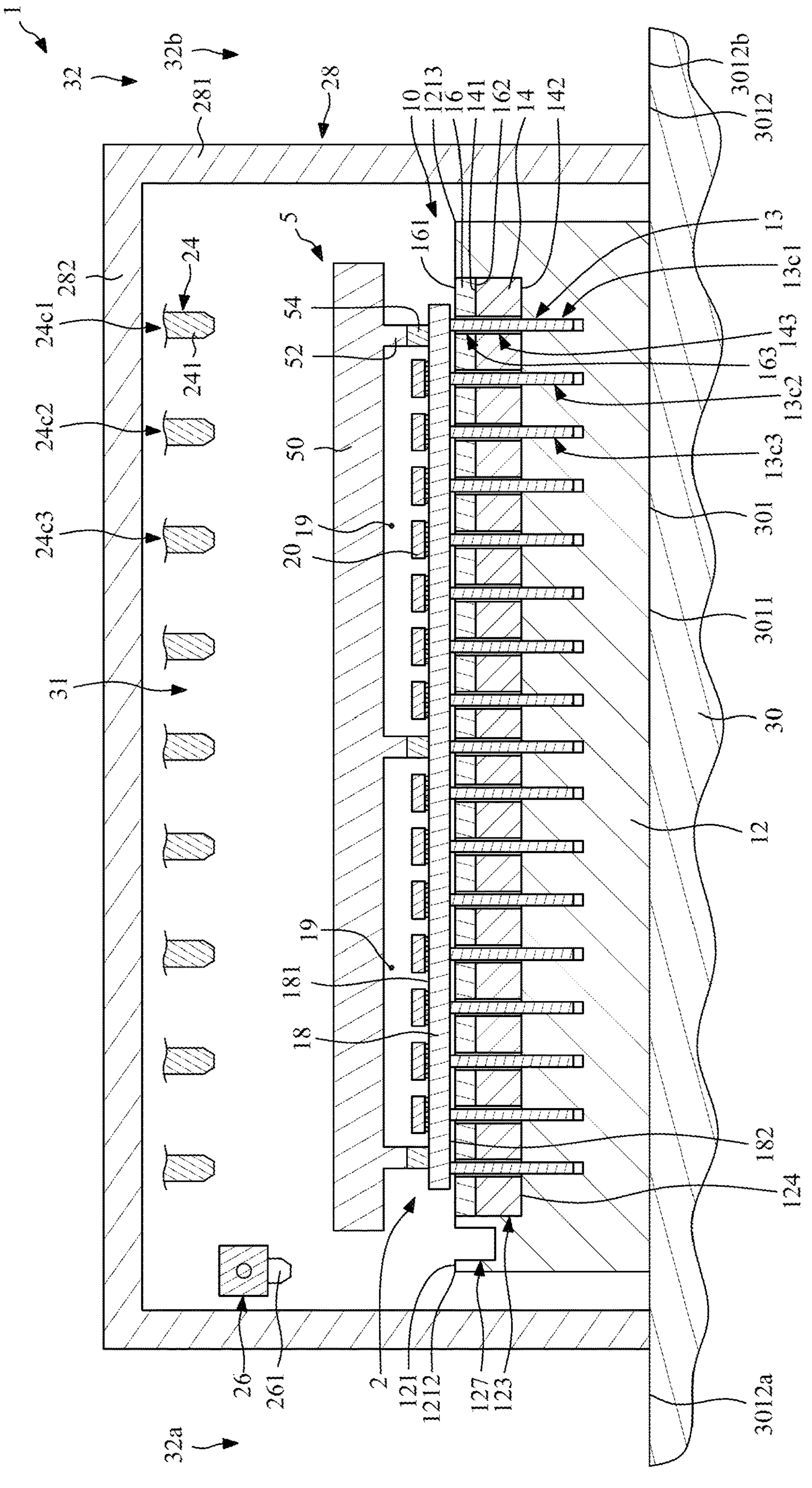
FIG. 32 illustrates one or more stages of an example of a method for manufacturing a package structure according to some embodiments of the present disclosure.

Referring to FIG. 32, a suction device 5 may be applied to take the combination structure 2 (including the semiconductor dice 20 and the substrate structure 18) away from the tape 16 in the de-bonding apparatus 10. The suction device 5 may be connected to a vacuum source, and may include a main body 50, at least one protrusion 52 and at least one suction head 54. The protrusion 52 may protrude from the main body 50. The suction head 54 may connect the protrusion 52. The contact end of the suction head 54 may contact and suck a portion of the first surface (e.g., the top surface) 181 of the substrate structure 18. Thus, the whole combination structure 2 (including the semiconductor dice 20 and the substrate structure 18) may be lifted up by the suction device 5. That is, the suction device 5 may suck the combination structure 2 (including the semiconductor dice 20 and the substrate structure 18), and may move up together with the combination structure 2 (including the semiconductor dice 20 and the substrate structure 18).

Figure 33:
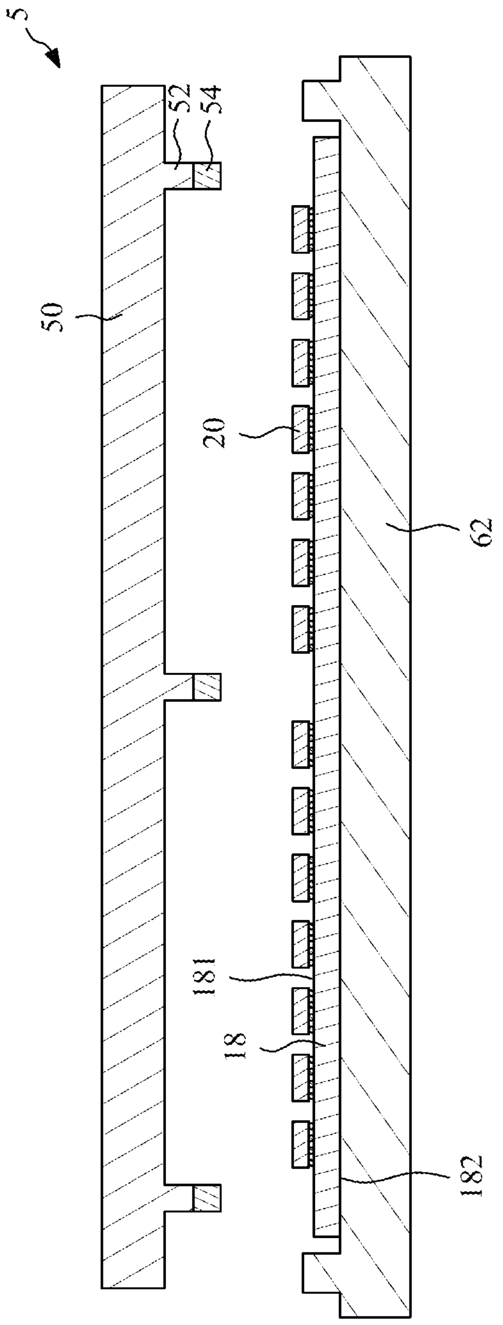
FIG. 33 illustrates one or more stages of an example of a method for manufacturing a package structure according to some embodiments of the present disclosure.

Referring to FIG. 33, the combination structure 2 (including the semiconductor dice 20 and the substrate structure 18) may be placed on a boat 62 through the suction device 5. Then, the vacuum of the suction head 54 may be released. Then, the suction device 5 may move up to leave the combination structure 2 (including the semiconductor dice 20 and the substrate structure 18).

Figure 34:
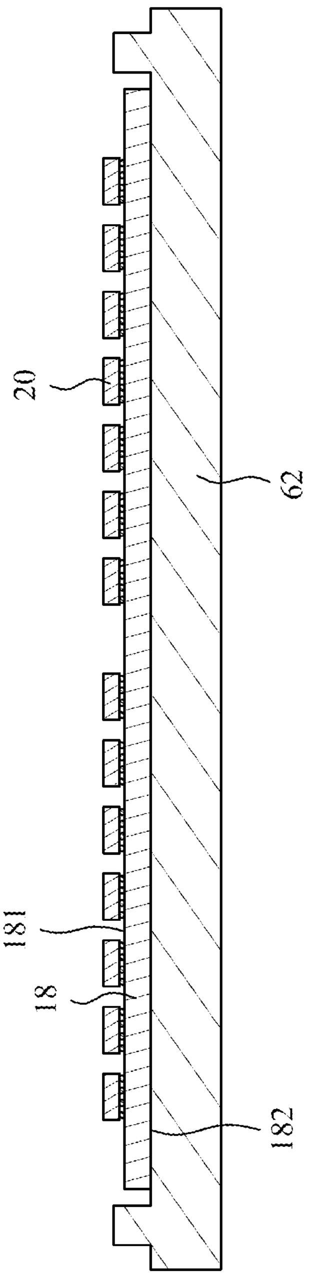
FIG. 34 illustrates one or more stages of an example of a method for manufacturing a package structure according to some embodiments of the present disclosure.

Referring to FIG. 34, the combination structure 2 (including the semiconductor dice 20 and the substrate structure 18) may be dried by a hot air provided by a dryer (not shown).

Figure 35:
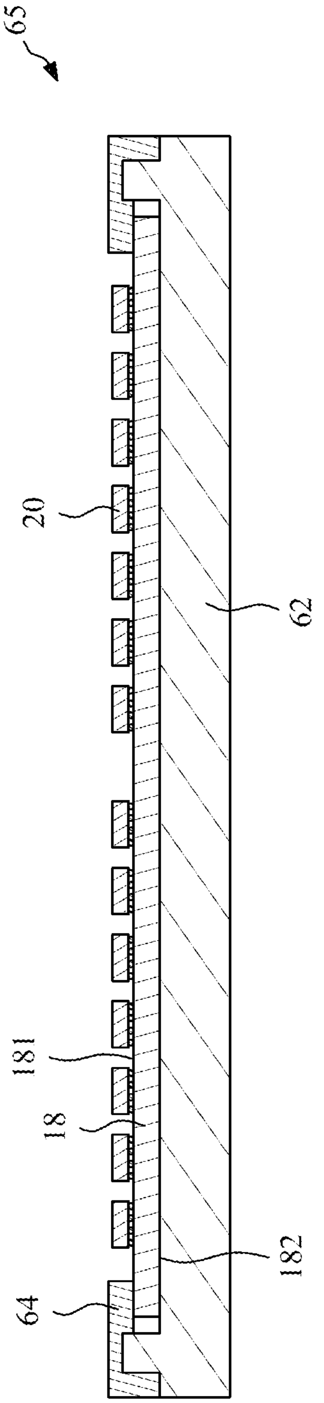
FIG. 35 illustrates one or more stages of an example of a method for manufacturing a package structure according to some embodiments of the present disclosure.

Referring to FIG. 35, a cover 64 may be formed or disposed on the periphery of the first surface (e.g., the top surface) 181 of the substrate structure 18 and the boat 62 so as to fix the combination structure 2 (including the semiconductor dice 20 and the substrate structure 18) on the boat 62 to form a unit 65.

Figure 36:
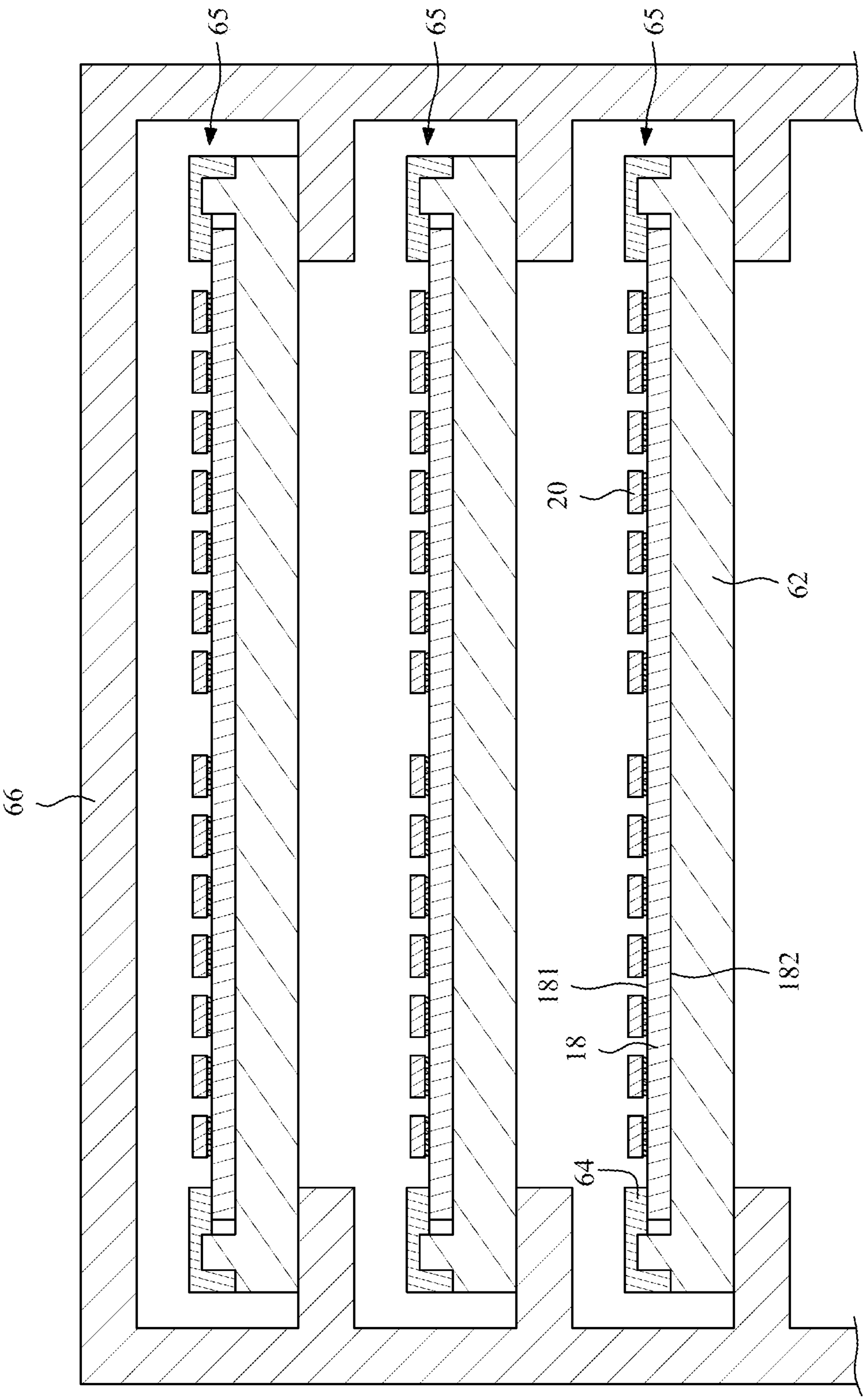
FIG. 36 illustrates one or more stages of an example of a method for manufacturing a package structure according to some embodiments of the present disclosure.

Referring to FIG. 36, a plurality of units 65 (including the combination structure 2, the boat 62 and the cover 64) are placed in a magazine 66. Then, the magazine 66 may be immerged in a solution in a tank so as to wash the combination structure 2.

Figure 37:
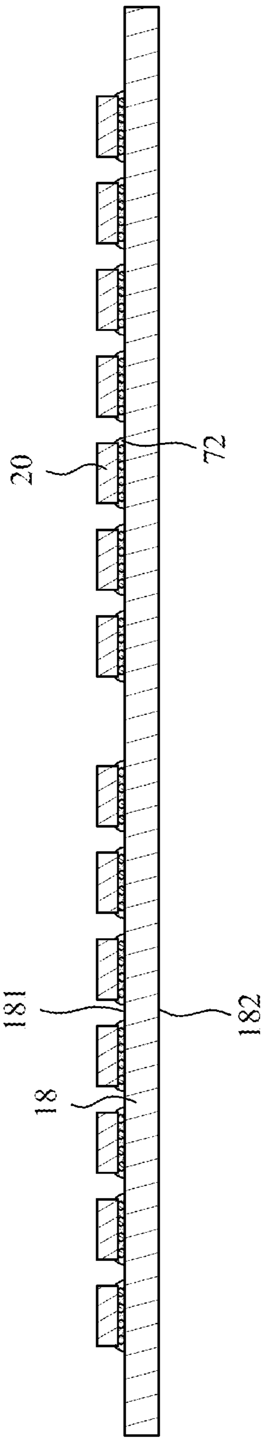
FIG. 37 illustrates one or more stages of an example of a method for manufacturing a package structure according to some embodiments of the present disclosure.

Referring to FIG. 37, the combination structure 2 (including the semiconductor dice 20 and the substrate structure 18) may be taken out from the magazine 66. Then, an underfill 72 may be formed between the second surface 202 of the semiconductor die 20 and the first surface (e.g., the top surface) 181 of the substrate structure 18 so as to cover the bump 21.

Figure 38:
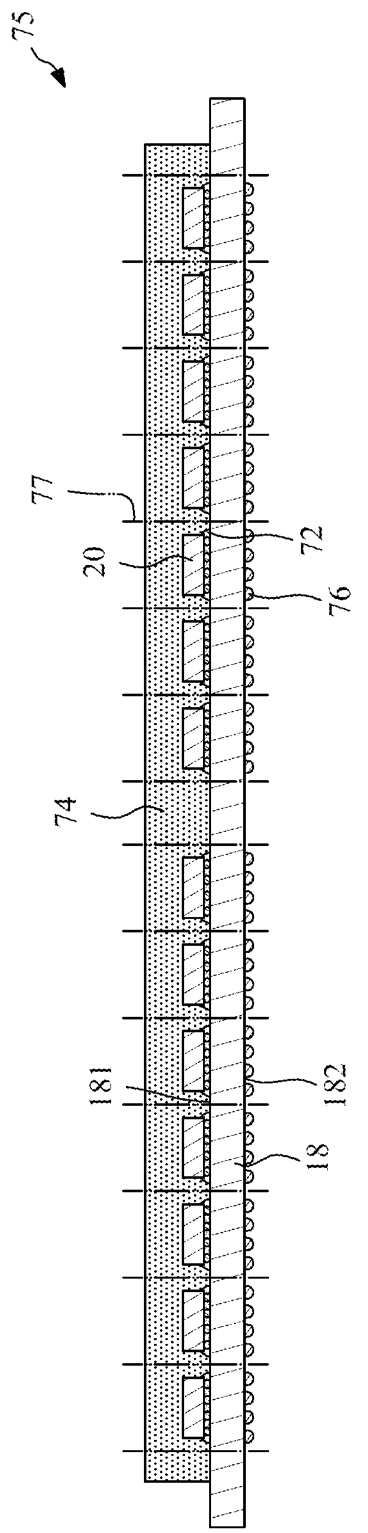
FIG. 38 illustrates one or more stages of an example of a method for manufacturing a package structure according to some embodiments of the present disclosure.

Referring to FIG. 38, a molding compound 74 may be formed on the first surface (e.g., the top surface) 181 of the substrate structure 18 to cover the semiconductor dice 20 and the underfill 72 so as to form a molded structure 75. Then, a plurality of external connectors (e.g., solder balls) 76 may be formed on the second surface (e.g., the bottom surface) 182 of the substrate structure 18. The molded structure 75 may have a plurality of cutting lines 77 between the semiconductor dice 20.

Referring to FIG. 39, a singulation process may be conducted along the cutting lines 77 so as to obtain a plurality of package structures 7.

Figure 40:
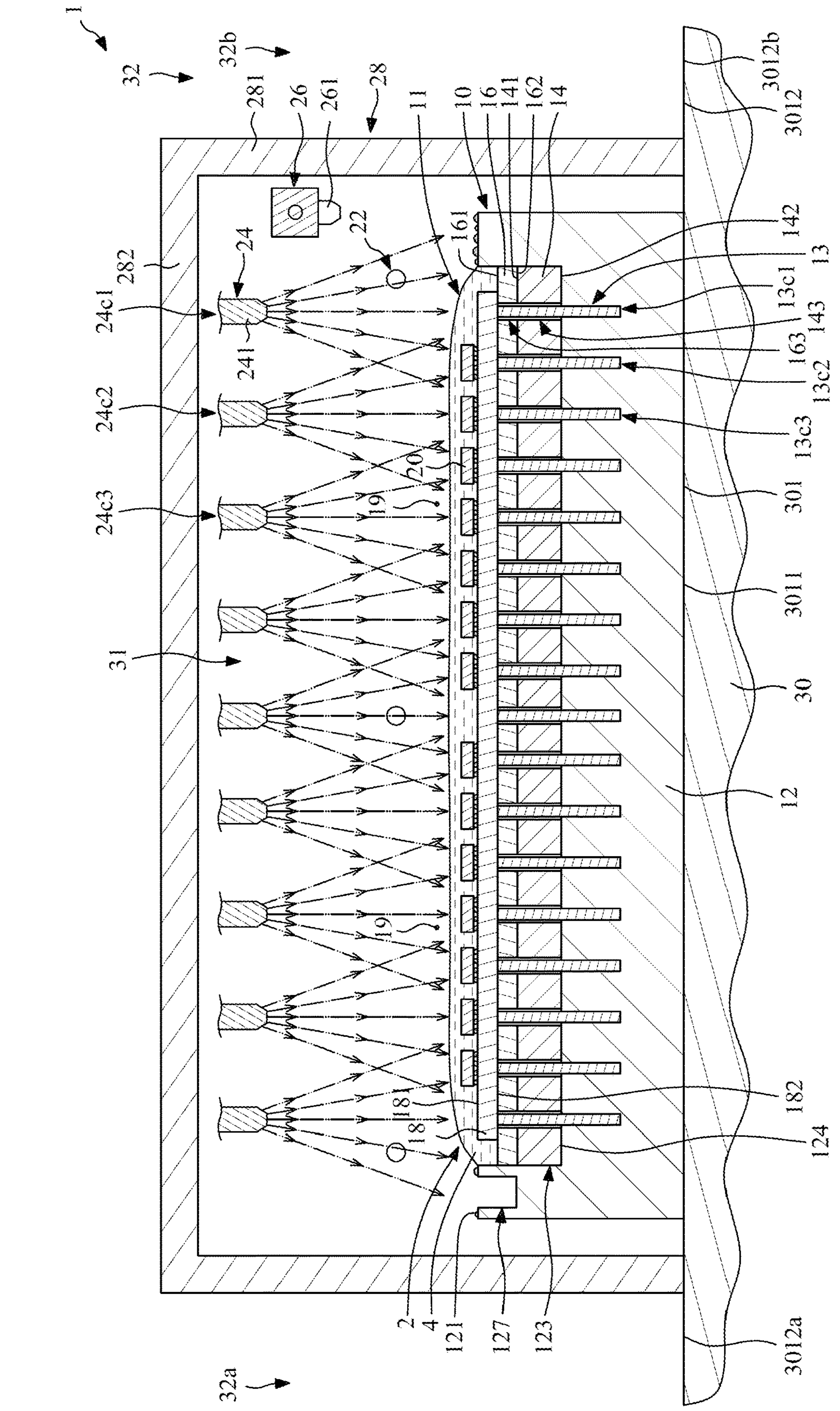
FIG. 40 illustrates one or more stages of an example of a method for manufacturing a package structure according to some embodiments of the present disclosure.

FIG. 40 illustrates a method for manufacturing a package structure according to some embodiments of the present disclosure. The initial several stages of the method corresponding to FIG. 40 are the same as, or at least similar to, the stages illustrated in FIG. 18 through FIG. 20. FIG. 40 depicts a stage subsequent to that depicted in FIG. 20.

Referring to FIG. 40, all of the nozzles 241 of the fluid supply device 24 may be opened concurrently. Thus, the fluid 4 (e.g., water) may be applied to cover and contact all the semiconductor dice 20 and the entire first surface (e.g., the top surface) 181 of the substrate structure 18. The fluid 4 (e.g., water) on the semiconductor dice 20 and the first surface (e.g., the top surface) 181 of the substrate structure 18 may be in a liquid state rather than in a droplet state. The combination structure 2 (including the semiconductor dice 20 and the substrate structure 18) may be immerged in the fluid 4 (e.g., water).

The following stages of the method corresponding to FIG. 40 are the same as, or at least similar to, the stages illustrated in FIG. 23 to FIG. 39 so as to obtain the package structures 7 of FIG. 39.

Figure 41:
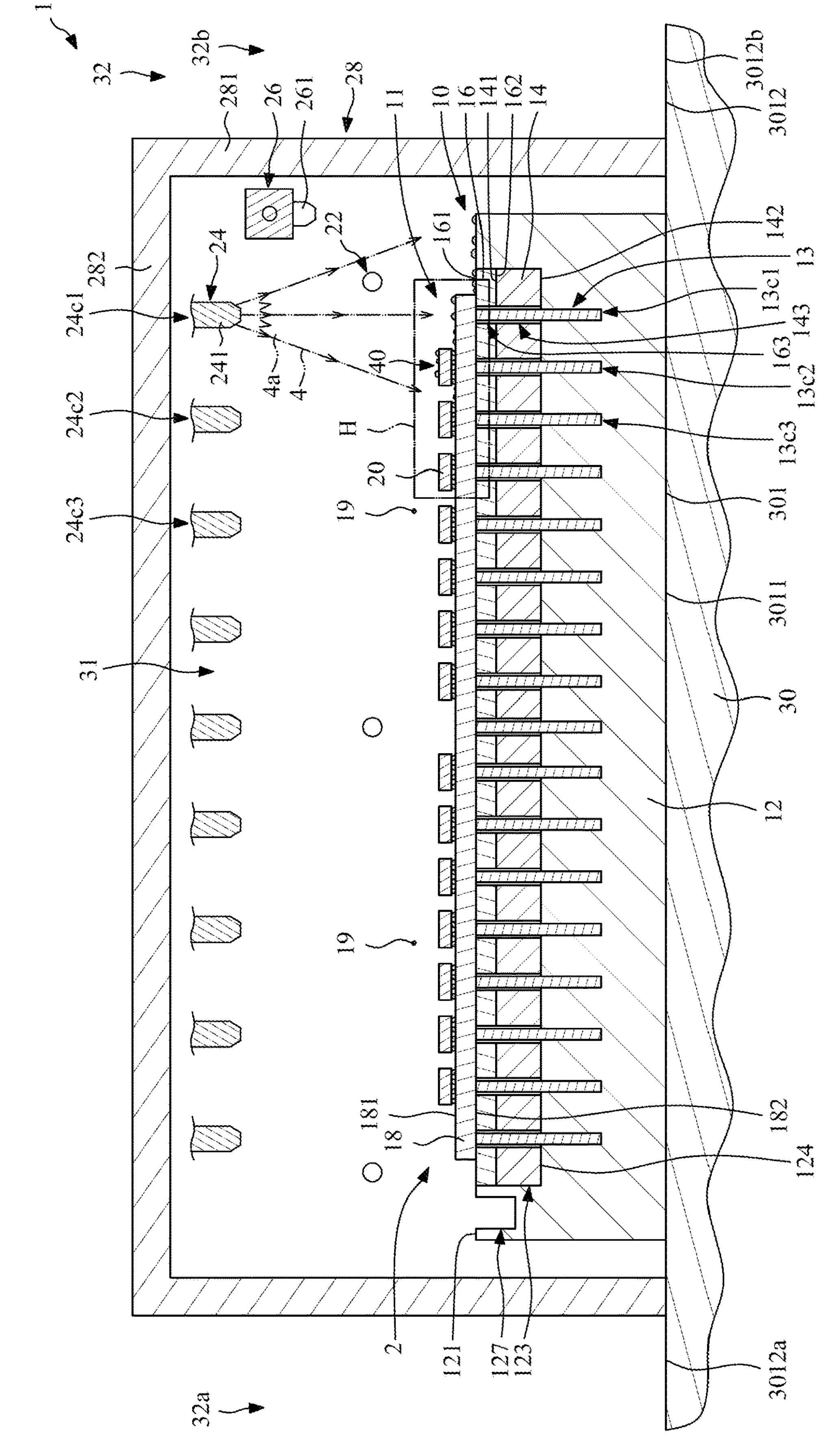
FIG. 41 illustrates one or more stages of an example of a method for manufacturing a package structure according to some embodiments of the present disclosure.
Figure 42:
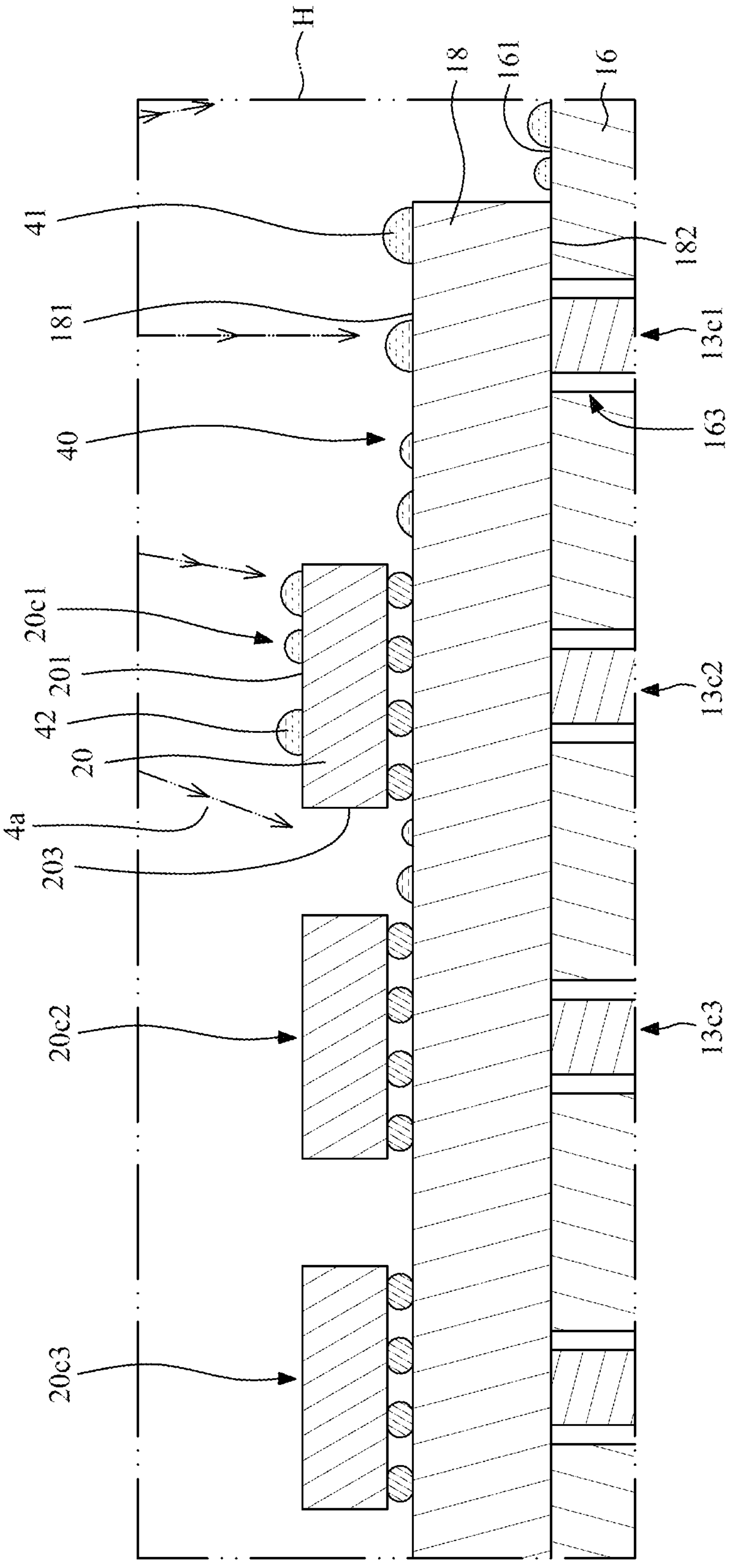
FIG. 42 illustrates one or more stages of an example of a method for manufacturing a package structure according to some embodiments of the present disclosure.

FIG. 41 and FIG. 42 illustrate a method for manufacturing a package structure according to some embodiments of the present disclosure. The initial several stages of the method corresponding to FIG. 41 and FIG. 42 are the same as, or at least similar to, the stages illustrated in FIG. 18 through FIG. 20. FIG. 41 depicts a stage subsequent to that depicted in FIG. 20.

Referring to FIG. 41 and FIG. 42, wherein FIG. 42 illustrates a partially enlarged view of a region "H" in FIG. 41, an equipment 1 may be provided. The equipment 1 of FIG. 41 may be same as or similar to the equipment 1 of FIG. 1. Then, the assembly structure 11 may be placed or disposed in the accommodating cavity 123 of the chuck 12 of the de-bonding apparatus 10. Then, a fluid 4 (e.g., a first fluid **4*a*) may be applied on a receiving side (e.g., a top side) of the combination structure 2 through the nozzles 241 of the fluid supply device 24. In some embodiments, the first fluid 4*a* may be applied on the receiving side (e.g., the top side) of the combination structure 2 through the first column 24*c*1** of nozzles 241, and the other nozzles 241 of the fluid supply device 24 may be still closed. The amount of the first fluid 4*a* in FIG. 41 may be less than the amount of the first fluid 4*a* in FIG. 21. Thus, as shown in FIG. 42, there may be no third droplets disposed on the lateral surfaces 203 of the semiconductor dice 20. There may be only first droplets 41 disposed on the first surface 181 of the substrate structure 18, and the second droplets 42 disposed on the first surfaces 201 of the semiconductor dice 20.

The following stages of the method corresponding to FIG. 41 and FIG. 42 are the same as, or at least similar to, the stages illustrated in FIG. 23 to FIG. 39 so as to obtain the package structures 7 of FIG. 39.

Figure 43:
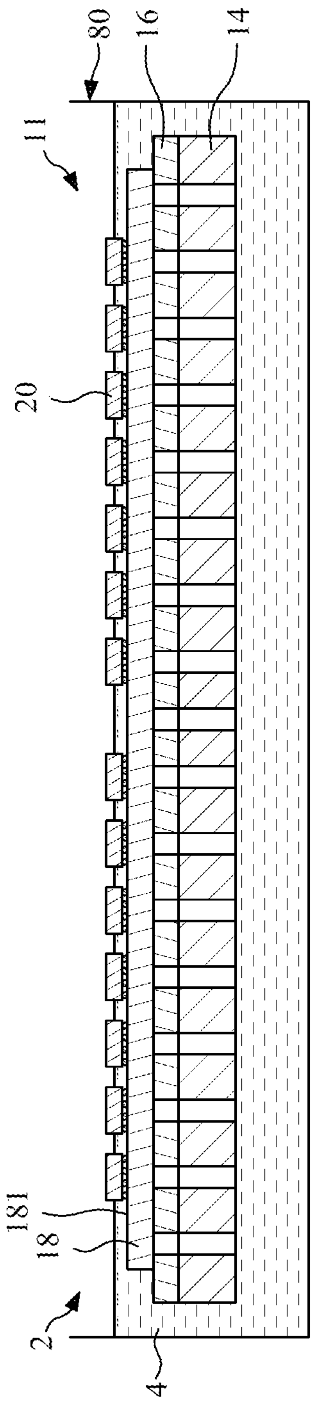
FIG. 43 illustrates one or more stages of an example of a method for manufacturing a package structure according to some embodiments of the present disclosure.
Figure 44:
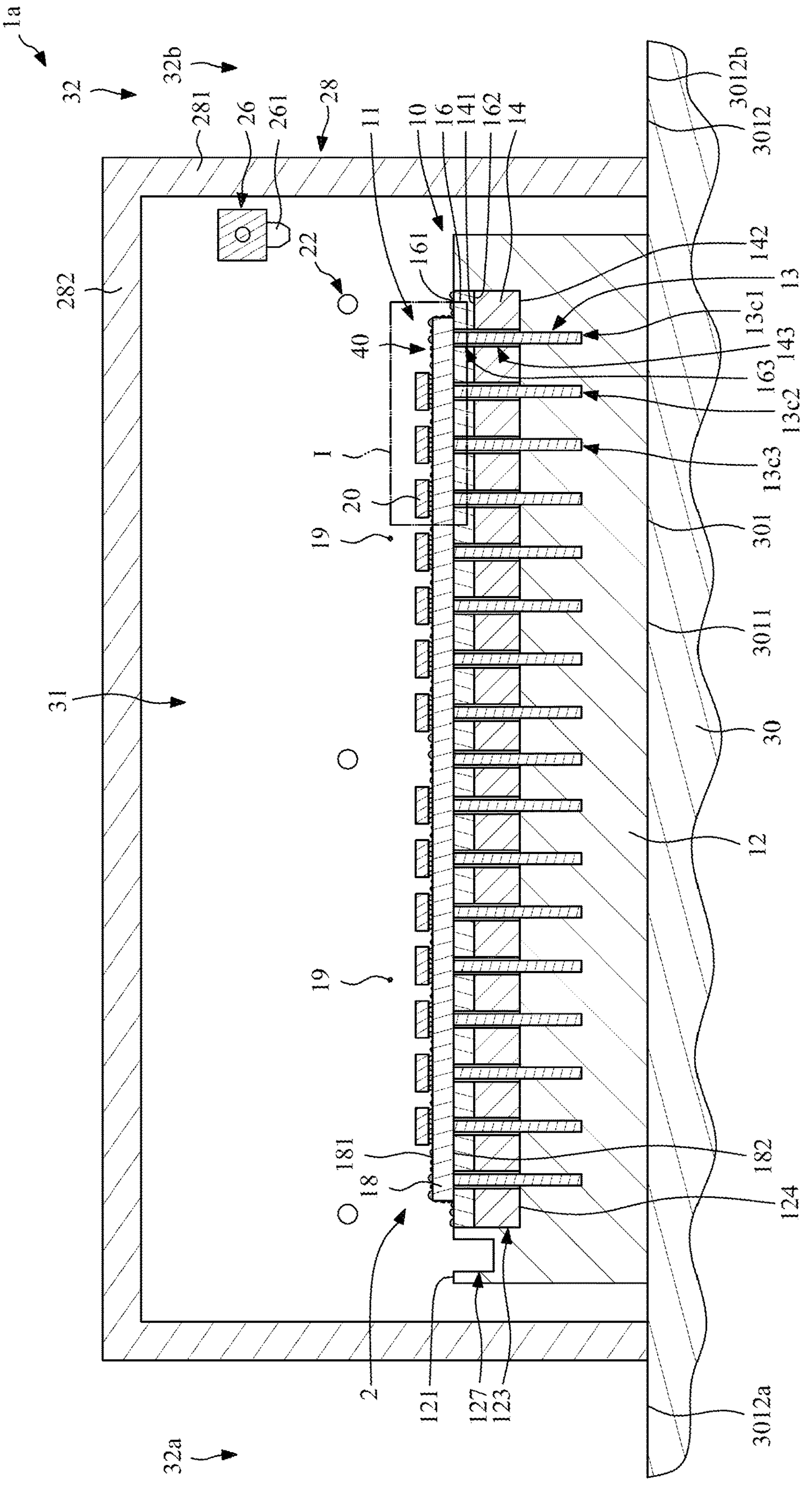
FIG. 44 illustrates one or more stages of an example of a method for manufacturing a package structure according to some embodiments of the present disclosure.
Figure 45:
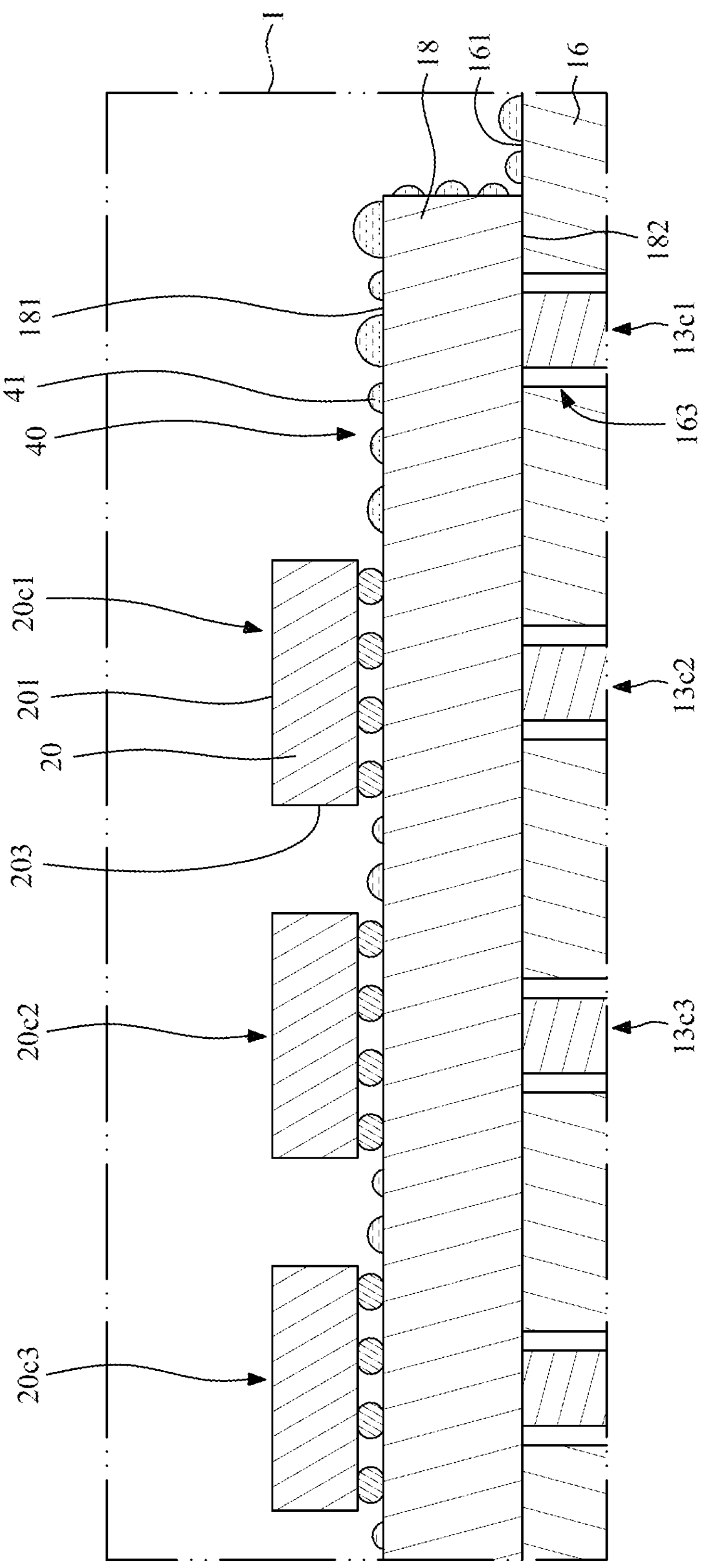
FIG. 45 illustrates one or more stages of an example of a method for manufacturing a package structure according to some embodiments of the present disclosure.

FIG. 43 through FIG. 45 illustrate a method for manufacturing a package structure according to some embodiments of the present disclosure. The initial several stages of the method corresponding to FIG. 43 through FIG. 45 are the same as, or at least similar to, the stages illustrated in FIG. 18 through FIG. 20. FIG. 43 depicts a stage subsequent to that depicted in FIG. 20.

Referring to FIG. 43, the assembly structure 11 may be immerged in a fluid 4 (e.g., water) in a tank 80 so as to remove the flux.

Referring to FIG. 44 and FIG. 45, wherein FIG. 45 illustrates a partially enlarged view of a region "I" in FIG. 44, an equipment 1*a* may be provided. The equipment 1*a* of FIG. 44 may be same as or similar to the equipment 1 of FIG. 1 except that the fluid supply device 24 may be omitted. Then, the assembly structure 11 may be taken out from the tank 80, and may be placed or disposed in the accommodating cavity 123 of the chuck 12 of the de-bonding apparatus 10. As shown in FIG. 45, there may be no third droplets disposed on the lateral surfaces 203 of the semiconductor dice 20 and no second droplets disposed on the first surfaces 201 of the semiconductor dice 20. There may be only first droplets 41 disposed on the first surface 181 of the substrate structure 18.

The following stages of the method corresponding to FIG. 43 through FIG. 45 are the same as, or at least similar to, the stages illustrated in FIG. 23 to FIG. 39 so as to obtain the package structures 7 of FIG. 39.

Figure 46:
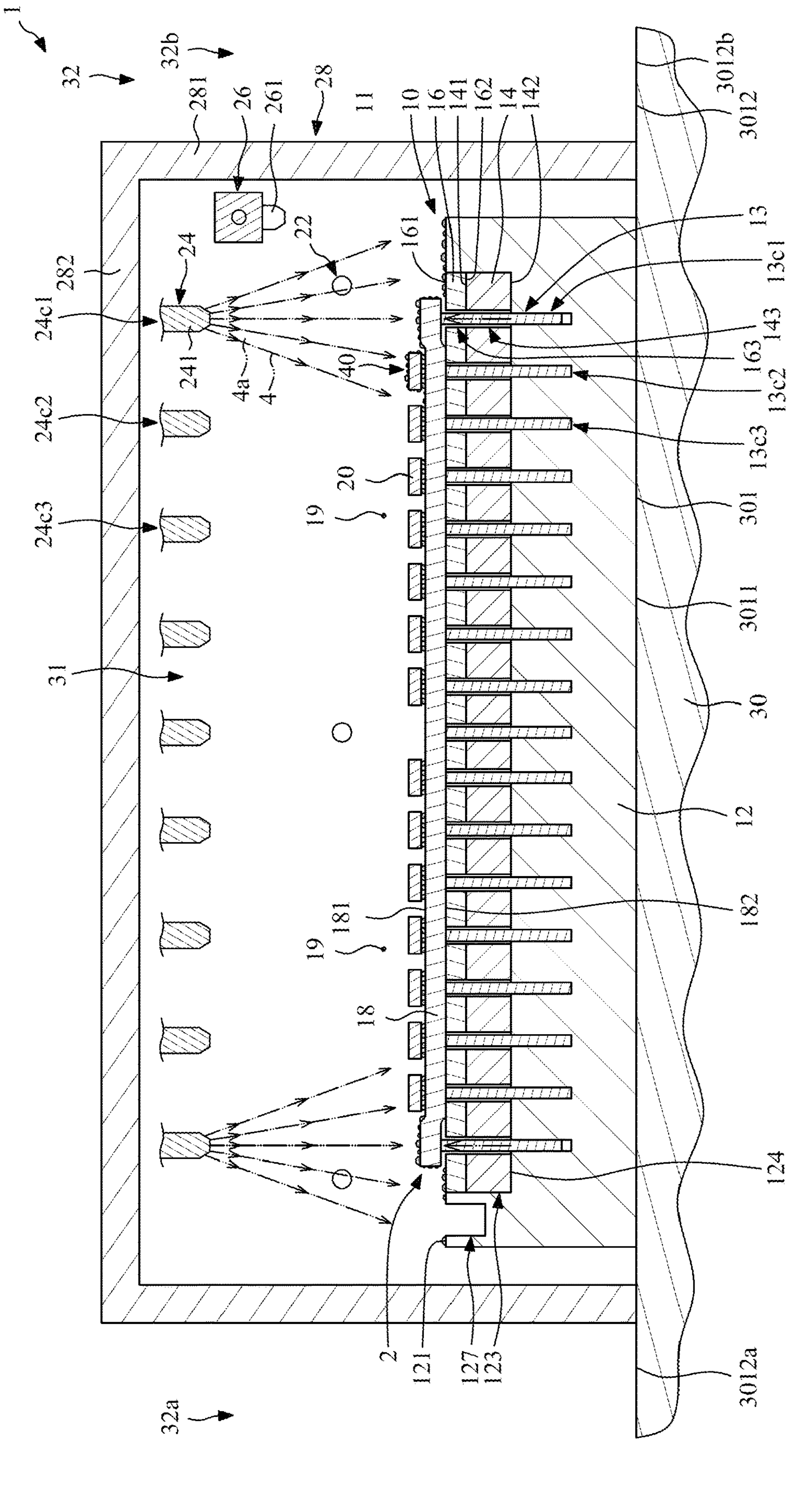
FIG. 46 illustrates one or more stages of an example of a method for manufacturing a package structure according to some embodiments of the present disclosure.

FIG. 46 illustrates a method for manufacturing a package structure according to some embodiments of the present disclosure. The initial several stages of the method corresponding to FIG. 46 are the same as, or at least similar to, the stages illustrated in FIG. 18 through FIG. 22. FIG. 46 depicts a stage subsequent to that depicted in FIG. 21 and FIG. 22.

Figure 47:
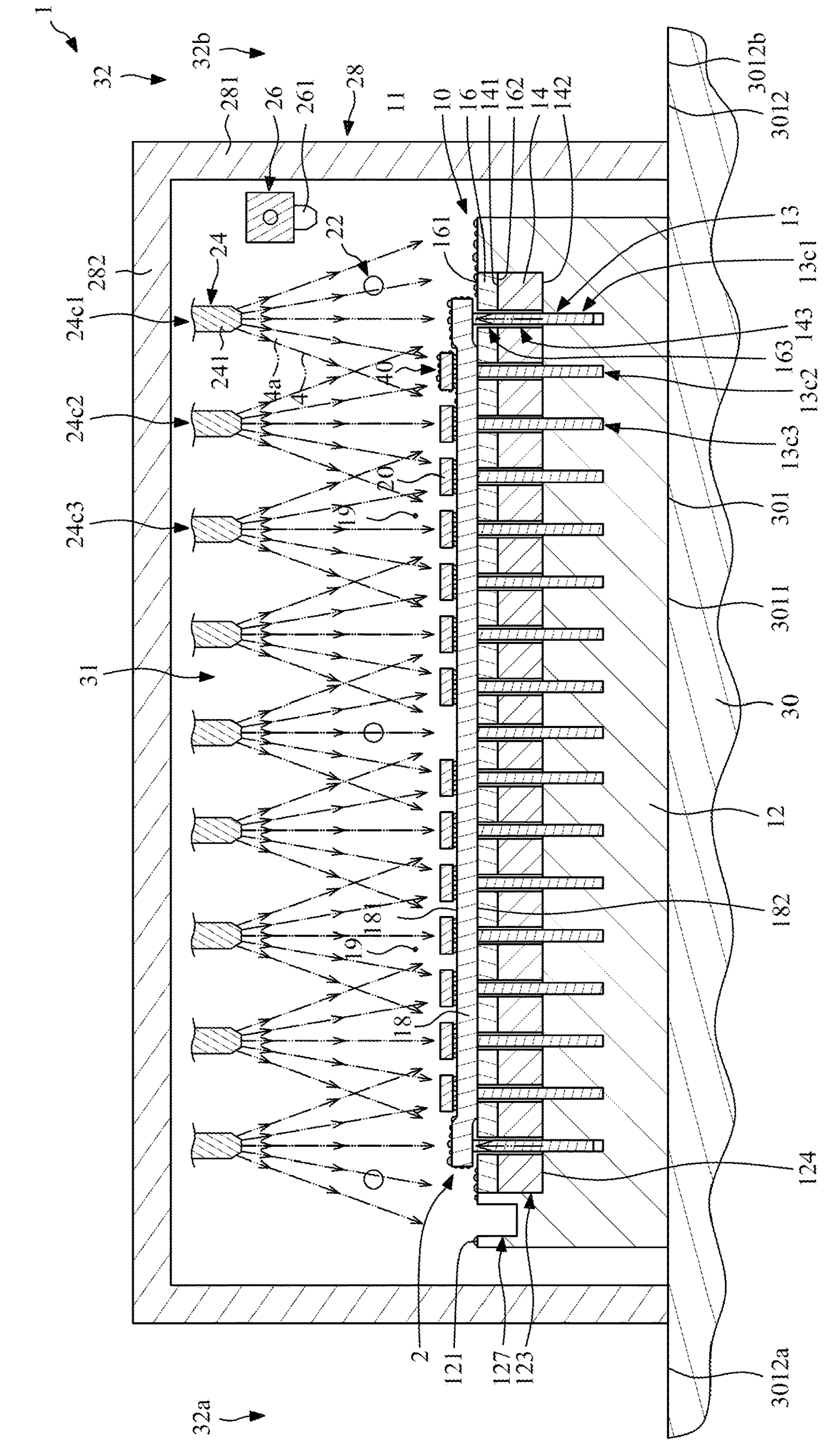
FIG. 47 illustrates one or more stages of an example of a method for manufacturing a package structure according to some embodiments of the present disclosure.

Referring to FIG. 46, two ends of the substrate structure 18 may be de-bonded from the tape 16 before the center of the center of the substrate structure 18 is de-bonded from the tape 16. In some embodiments, the two ends of the substrate structure 18 may be de-bonded from the tape 16 simultaneously or not. In some embodiments, all of the nozzles 241 of the fluid supply device 24 may be opened concurrently, as shown in FIG. 47.

The following stages of the method corresponding to FIG. 46 are the same as, or at least similar to, the stages illustrated in FIG. 24 to FIG. 39 so as to obtain the package structures 7 of FIG. 39.

Figure 48:
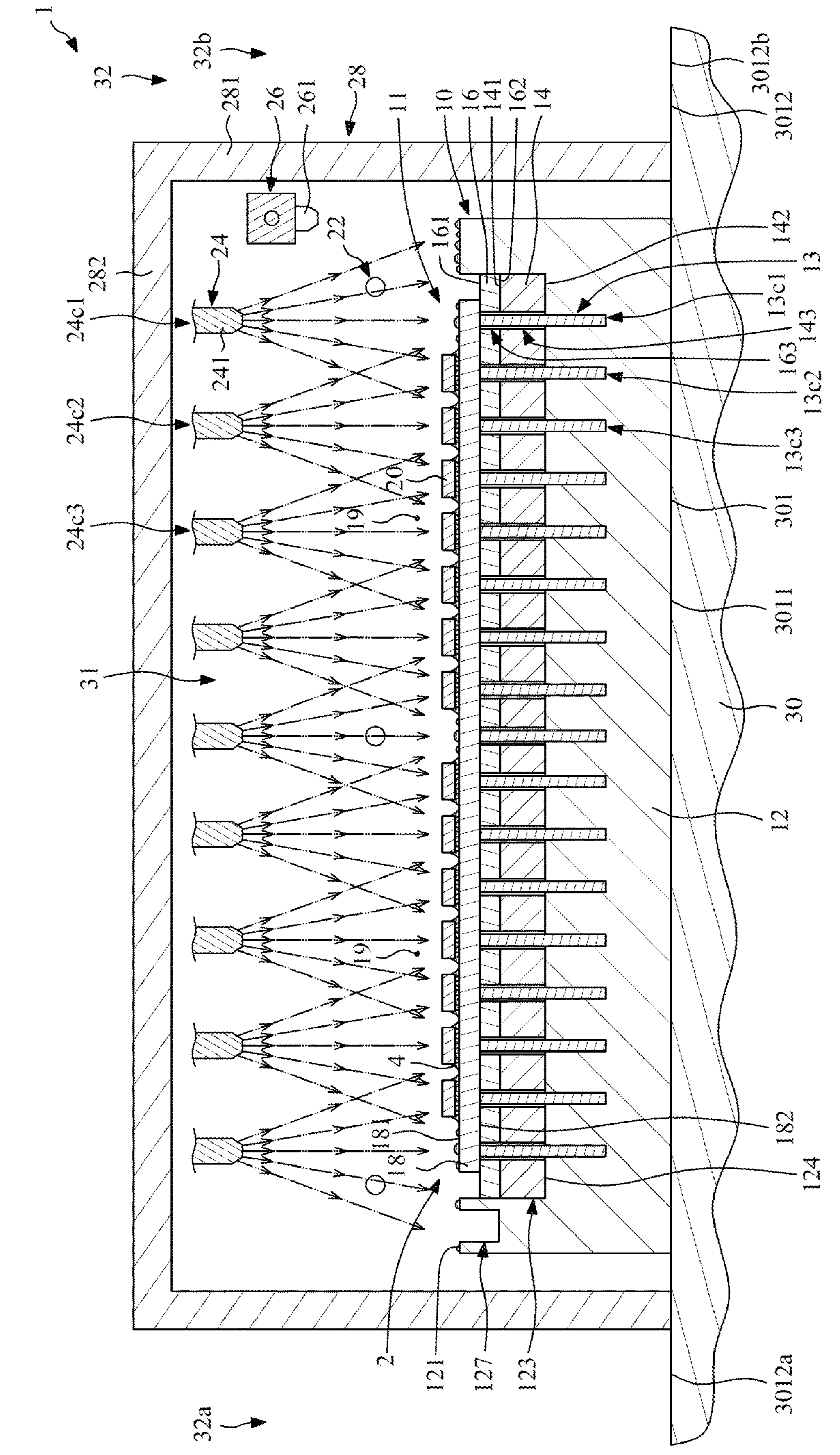
FIG. 48 illustrates one or more stages of an example of a method for manufacturing a package structure according to some embodiments of the present disclosure.

FIG. 48 illustrates a method for manufacturing a package structure according to some embodiments of the present disclosure. The initial several stages of the method corresponding to FIG. 48 are the same as, or at least similar to, the stages illustrated in FIG. 18 through FIG. 20. FIG. 48 depicts a stage subsequent to that depicted in FIG. 20.

Referring to FIG. 48, all of the nozzles 241 of the fluid supply device 24 may be opened concurrently. Thus, the fluid 4 (e.g., water) may be applied to the substrate structure 18. The fluid 4 (e.g., water) may be continuously provided onto the substrate structure 18 until an elevation of a top portion 4*t* of an aggregate of the fluid 4 (e.g., water) is lower than an elevation of a top surface 201 of the die 20. The fluid 4 (e.g., water) may contact the lateral surface 203 of the semiconductor die 20 but not cover all the semiconductor dice 20 and the entire first surface 181 of the substrate structure 18. There may be some voids between some of the semiconductor dice 20 and the substrate structure 18. Some of the fluid 4 (e.g., water) on the first surface 181 of the substrate structure 18 may be in a droplet state.

In some embodiments, if the fluid 4 (e.g., water) is further sprayed, the amount of the fluid 4 (e.g., water) may increase. Thus, the fluid 4 (e.g., water) may cover the entire first surface 181 of the substrate structure 18. The fluid 4 (e.g., water) on the first surface 181 of the substrate structure 18 may be in a liquid state rather than in a droplet state, as shown in FIG. 49.

Figure 49:
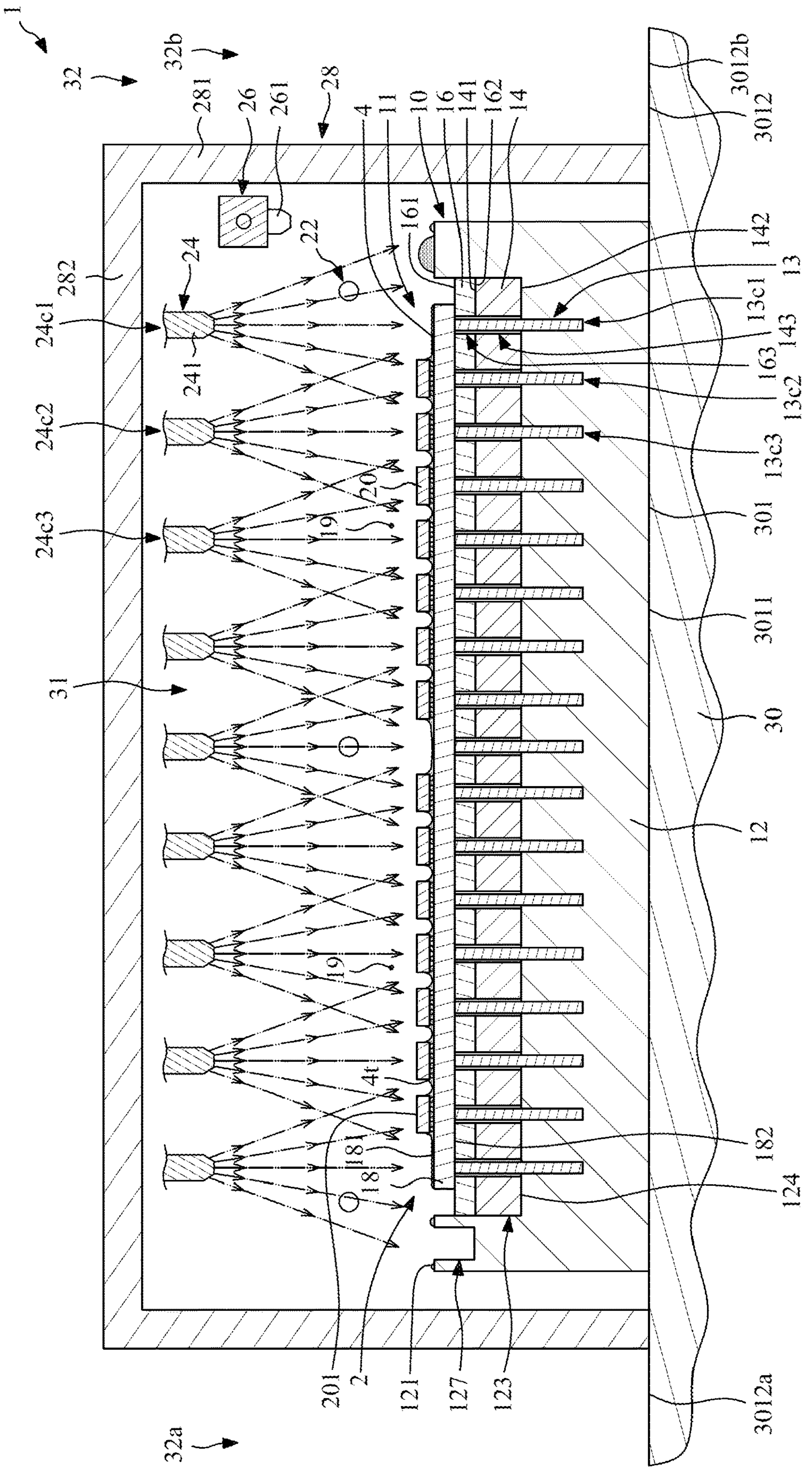
FIG. 49 illustrates one or more stages of an example of a method for manufacturing a package structure according to some embodiments of the present disclosure.

As shown in FIG. 49, the step of providing the polar materials 4 (e.g., the ion carriers 4 and the fluid 4) onto the substrate structure 18 may include continuously providing the polar materials 4 (e.g., the ion carriers 4 and the fluid 4) onto the substrate structure 18 to form at least an aggregate of the polar materials 4 (e.g., the ion carriers 4 and the fluid 4) with a top elevation of a top portion 4*t* lower than an elevation of a top surface 201 of the die 20.

The following stages of the method corresponding to FIG. 48 are the same as, or at least similar to, the stages illustrated in FIG. 23 to FIG. 39 so as to obtain the package structures 7 of FIG. 39.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to 35 0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a package structure, comprising:

providing an assembly structure including a substrate structure and a tape, wherein the substrate structure has a first surface and a second surface opposite to the first surface, and the second surface is bonded to the tape;

de-bonding the second surface of the substrate structure from the tape;

neutralizing a plurality of electricity charges adjacent to the first surface of the substrate structure earlier than de-bonding the second surface of the substrate structure from the tape; and dispensing a plurality of polar materials toward the first surface of the substrate structure to neutralize the plurality of electricity charges, wherein the assembly structure includes a die disposed adjacent to the first surface of the substrate structure, the die has a bottom surface facing the first surface of the substrate structure, a top surface and a lateral surface, wherein the plurality of polar materials partially covers the first surface of the substrate structure, the top surface of the die and the lateral surface of the die after dispensing.

2. The method of claim 1, further comprising removing the plurality of polar materials from the first surface of the substrate structure.

3. A method for manufacturing a package structure, comprising:

providing an assembly structure including a substrate structure bonded to a tape and a die disposed on the substrate structure;

providing a plurality of ion carriers onto the substrate structure; and de-bonding the substrate structure from the tape later than providing the plurality of ion carriers onto the substrate structure, wherein a plurality of ions in the ion carriers is configured to reduce static electricity generated during the de-bonding process, wherein the plurality of ion carriers is a fluid.

4. The method of claim 3, wherein the step of providing the plurality of ion carriers onto the substrate structure includes continuously providing the plurality of ion carriers onto the substrate structure to form at least one aggregate of the plurality of ion carriers with a top elevation lower than an elevation of a top surface of the die.

5. The method of claim 3, wherein the step of providing the plurality of ion carriers onto the substrate structure includes:

providing a portion of the plurality of ion carriers onto the die.

6. A method for manufacturing a package structure, comprising:

providing an assembly structure including a substrate structure bonded to a tape and a die disposed on the substrate structure;

providing a plurality of ion carriers onto the substrate structure;

de-bonding the substrate structure from the tape later than providing the plurality of ion carriers onto the substrate structure; and aggregating the plurality of ion carriers to form a plurality of droplets on a surface of the substrate structure.

7. The method of claim 6, wherein the plurality of droplets are formed in time sequence or in spatial sequence.

8. The method of claim 6, further comprising:
removing the plurality of droplets from the surface of the substrate structure.

* * * * *